US007763926B2

(12) United States Patent
Takeuchi

(10) Patent No.: US 7,763,926 B2
(45) Date of Patent: Jul. 27, 2010

(54) SEMICONDUCTOR DEVICE MANUFACTURING METHOD AND SEMICONDUCTOR DEVICE

(75) Inventor: Masahiko Takeuchi, Tokyo (JP)

(73) Assignee: Renesas Technology Corp., Tokyo (JP)

(*) Notice: Subject to any disclaimer, the term of this patent is extended or adjusted under 35 U.S.C. 154(b) by 94 days.

(21) Appl. No.: 12/246,533

(22) Filed: Oct. 7, 2008

(65) Prior Publication Data

US 2009/0032857 A1 Feb. 5, 2009

Related U.S. Application Data

(60) Continuation of application No. 11/455,666, filed on Jun. 20, 2006, now Pat. No. 7,439,569, which is a continuation of application No. 11/165,506, filed on Jun. 24, 2005, now Pat. No. 7,078,759, which is a division of application No. 10/697,316, filed on Oct. 31, 2003, now Pat. No. 6,924,192.

(30) Foreign Application Priority Data

May 22, 2003 (JP) ............................ 2003-144670

(51) Int. Cl.
*H01L 27/108* (2006.01)

(52) U.S. Cl. .............................. 257/308; 257/E27.088

(58) Field of Classification Search ................. 257/308, 257/E27.088

See application file for complete search history.

(56) References Cited

U.S. PATENT DOCUMENTS

| | | | | |
|---|---|---|---|---|
| 6,143,601 | A | 11/2000 | Sun | |
| 6,281,540 | B1 * | 8/2001 | Aoki | 257/306 |
| 6,455,370 | B1 | 9/2002 | Lane | |
| 6,518,130 | B1 | 2/2003 | Ohno | |
| 6,528,366 | B1 | 3/2003 | Tu et al. | |
| 6,656,786 | B2 | 12/2003 | Chiang et al. | |
| 6,690,053 | B2 * | 2/2004 | Amo et al. | 257/306 |
| 6,696,720 | B2 | 2/2004 | Sakao | |
| 6,797,557 | B2 | 9/2004 | Chiang | |

FOREIGN PATENT DOCUMENTS

| | | |
|---|---|---|
| JP | 07-240465 | 9/1995 |
| JP | 08-204141 | 8/1996 |
| JP | 10-150161 | 6/1998 |
| JP | 2000-294636 | 10/2000 |
| JP | 2001-217400 | 8/2001 |

(Continued)

*Primary Examiner*—Chandra Chaudhari
(74) *Attorney, Agent, or Firm*—Oblon, Spivak, McClelland, Maier & Neustadt, L.L.P.

(57) ABSTRACT

A technique is provided which makes it possible to achieve both of a reduction in contact resistance in a memory device and a reduction in contact resistance in a logic device even when oxidation is performed during formation of dielectric films of capacitors. Conductive barrier layers (82) are provided in the top ends of contact plugs (83*b*) electrically connected to ones of source/drain regions (59). Lower electrodes (70) of capacitors (73) are formed in contact with the conductive barrier layers (82) of the contact plugs (83*b*) and then dielectric films (71) and upper electrodes (72) of the capacitors (73) are sequentially formed. In the logic region, contact plugs (25) are formed in an upper layer so that they are in contact respectively with contact plugs (33) electrically connected to source/drain regions (9).

3 Claims, 75 Drawing Sheets

FOREIGN PATENT DOCUMENTS

| | | |
|---|---|---|
| JP | 2001-267516 | 9/2001 |
| JP | 2001-284541 | 10/2001 |
| JP | 2002-217387 | 8/2002 |
| JP | 2003-7850 | 1/2003 |
| JP | 2003-023111 | 1/2003 |
| JP | 2003-060080 | 2/2003 |

* cited by examiner

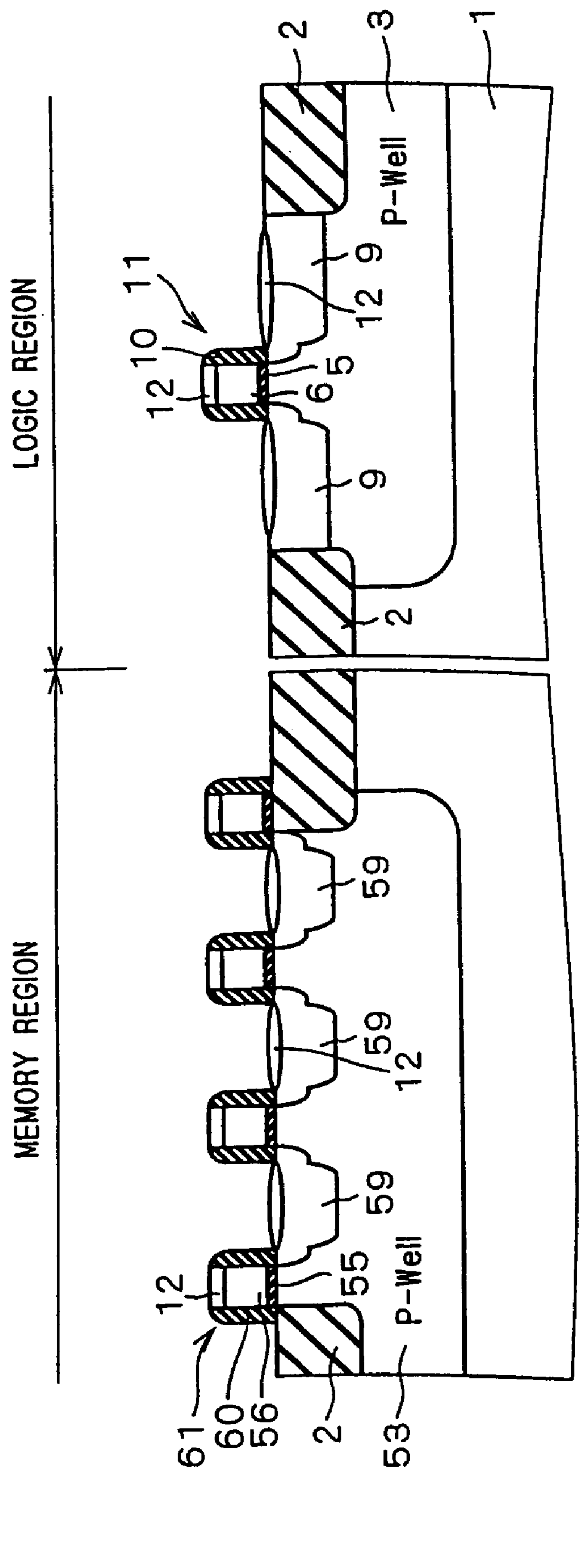
F I G . 1

F I G . 8
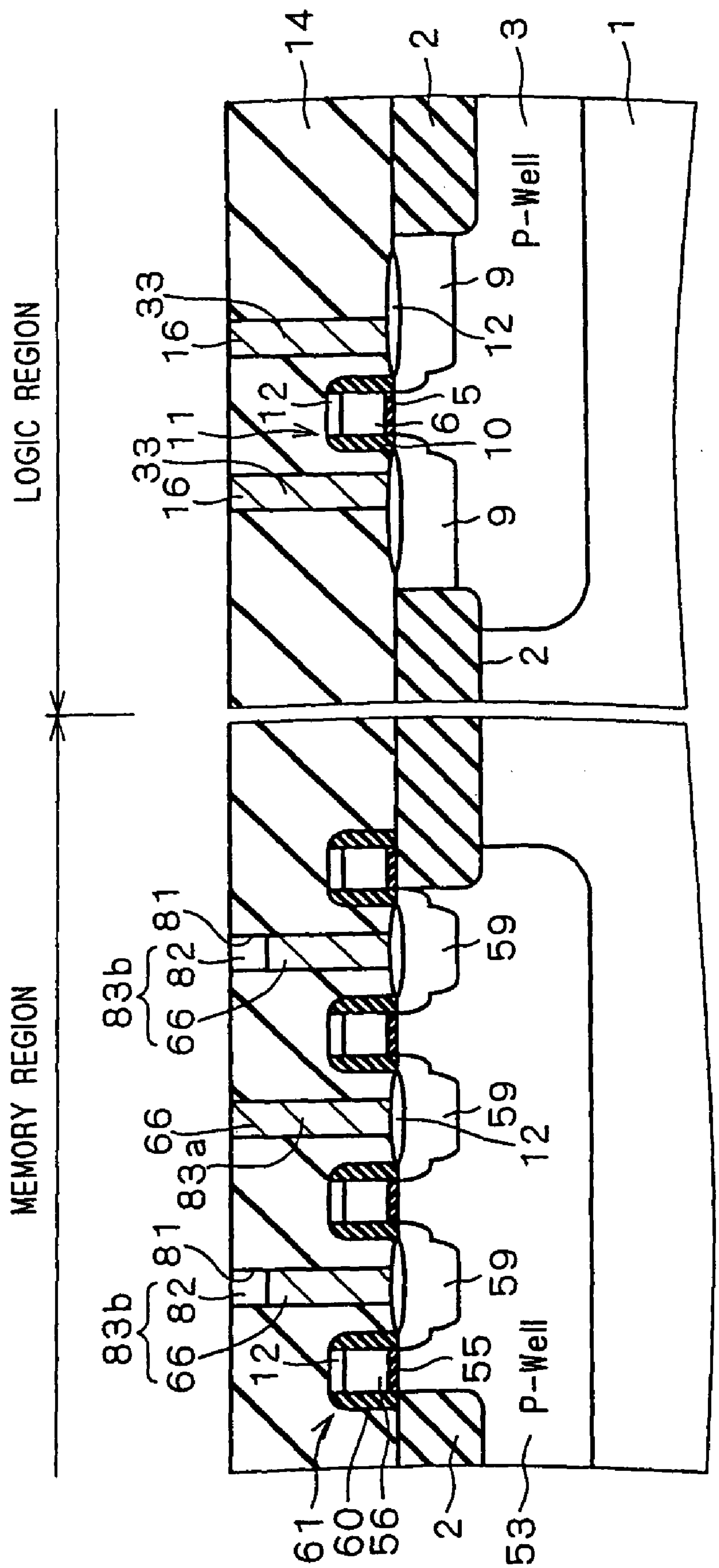

F I G . 1 1
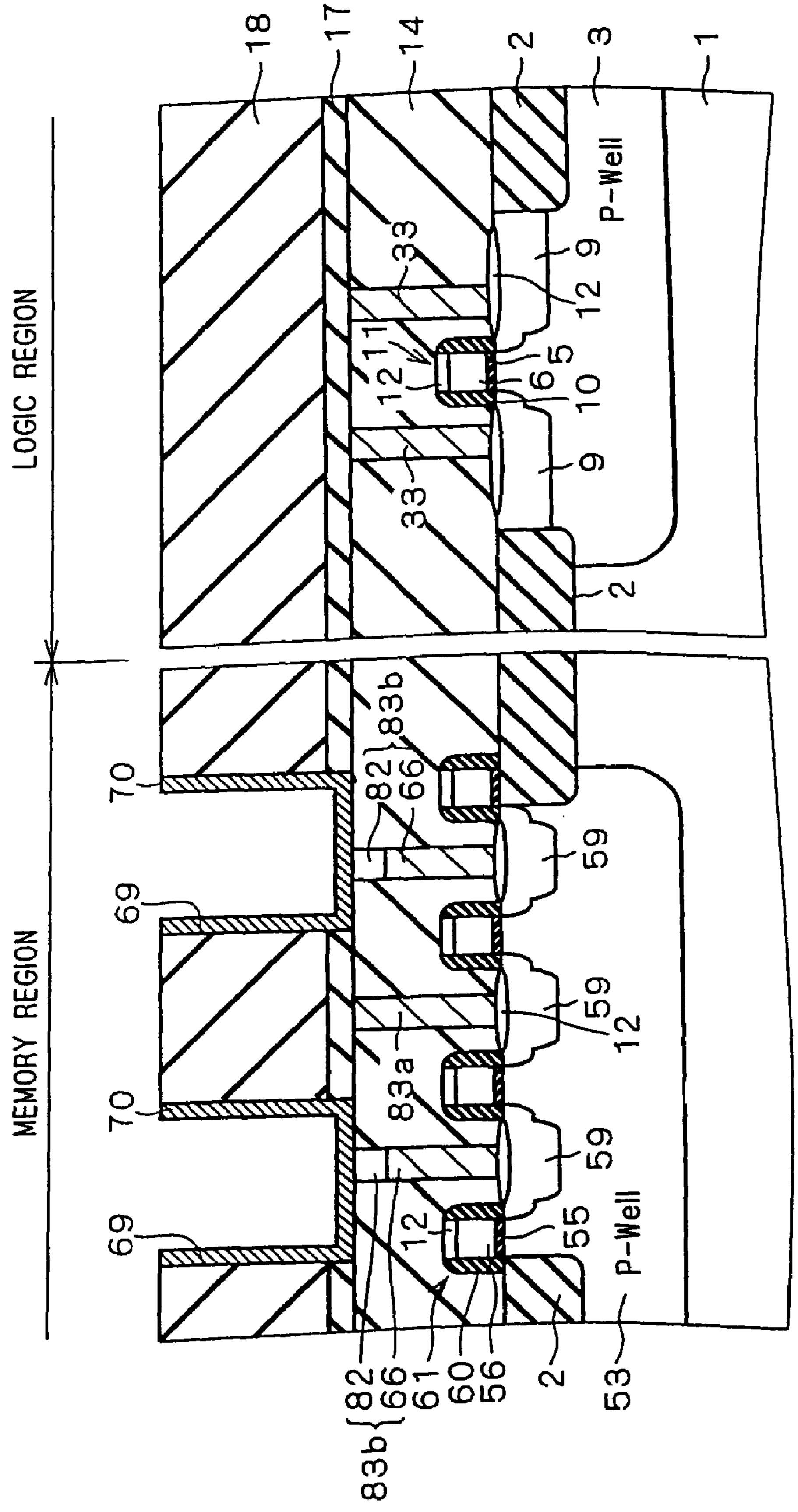

F I G . 2 5
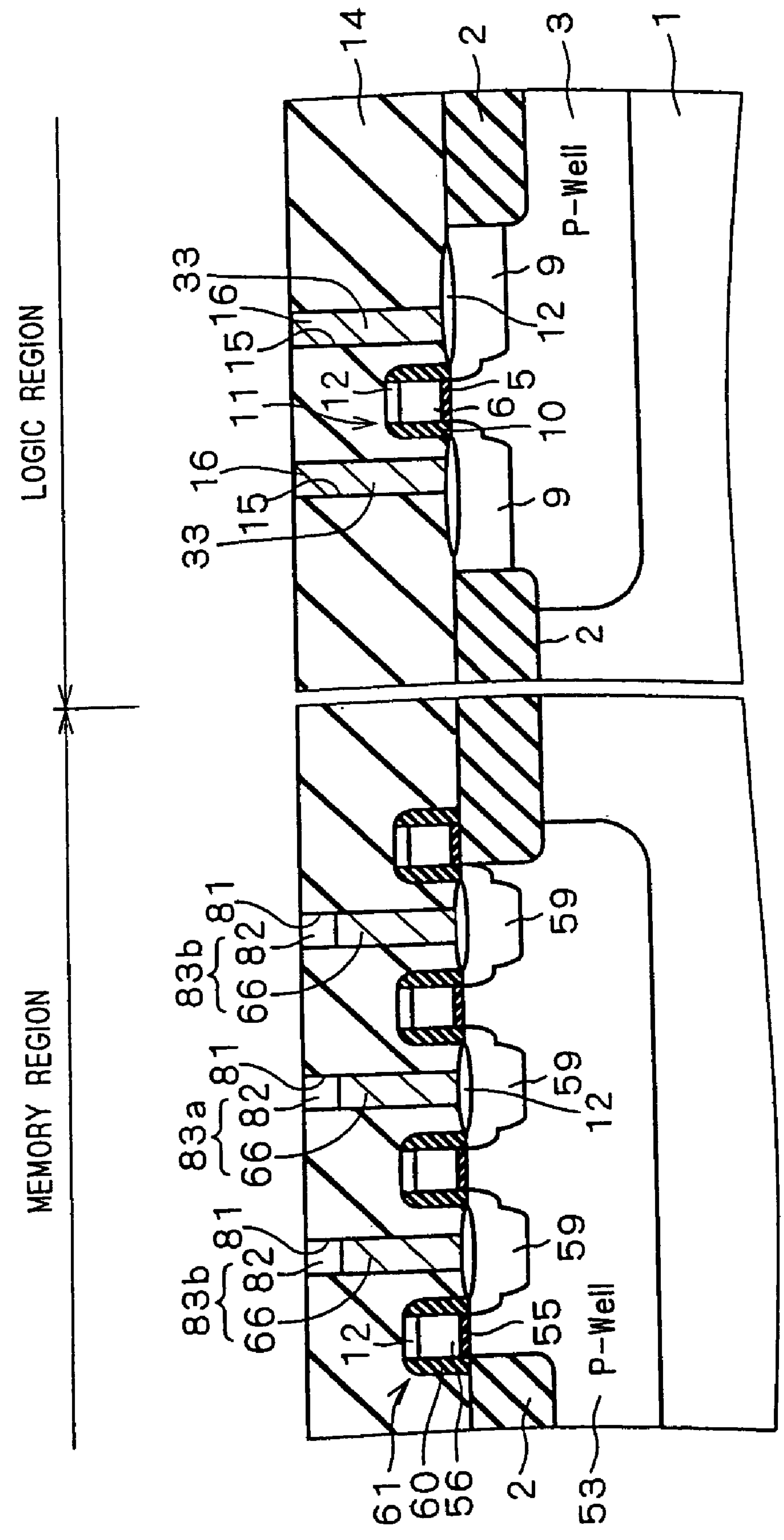

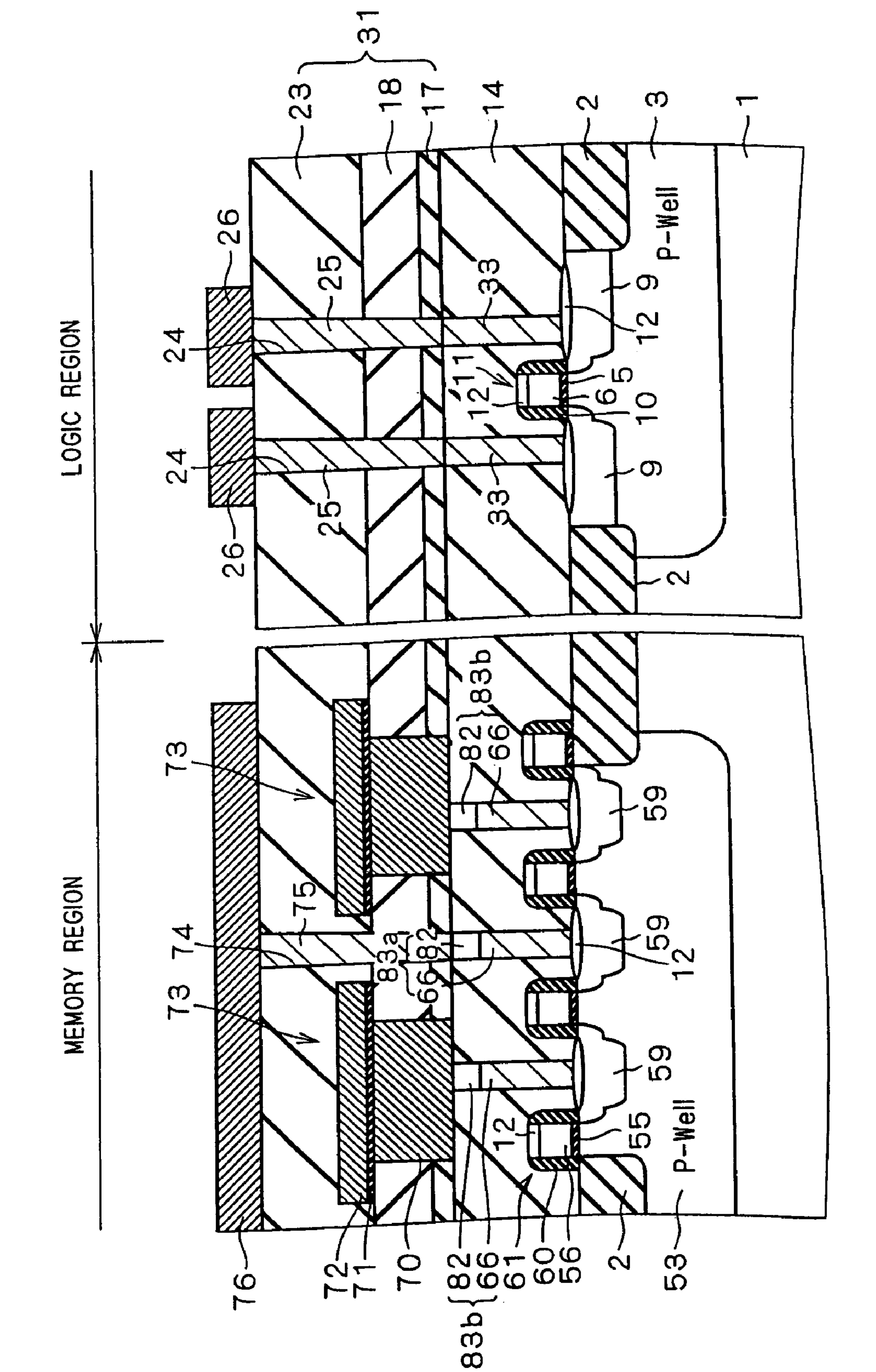
F I G . 3 2

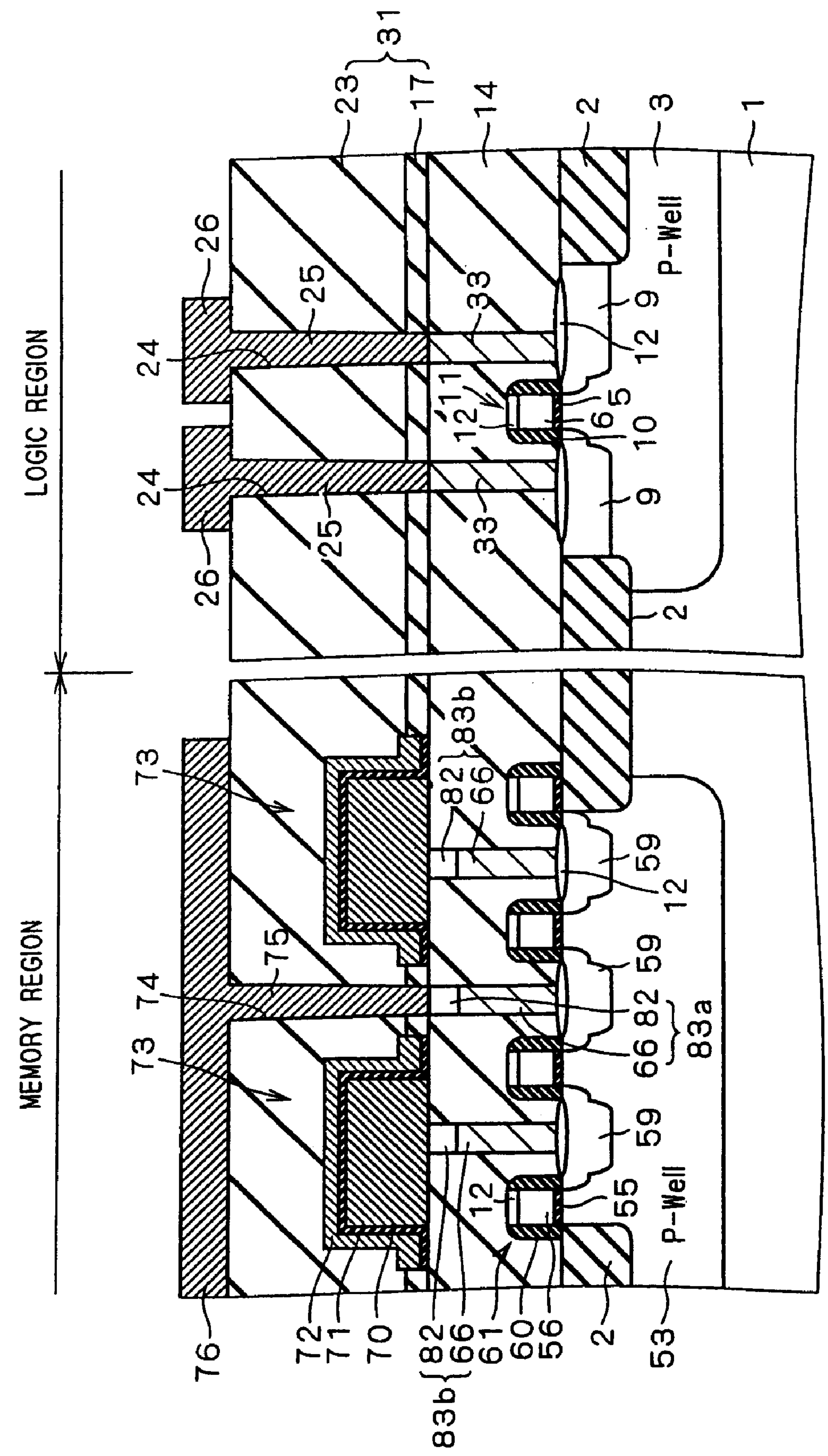
F I G . 3 5

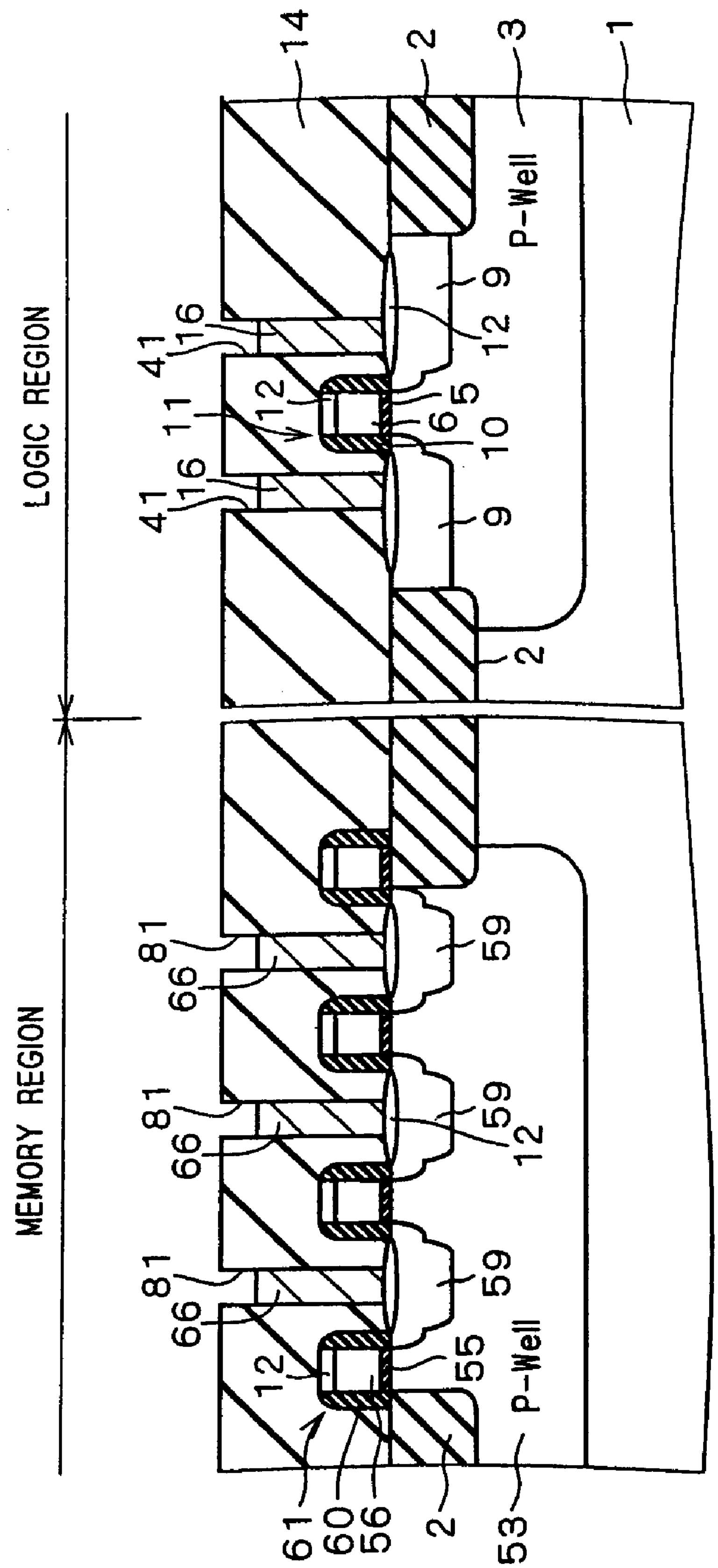
F I G . 3 6

F I G . 3 7
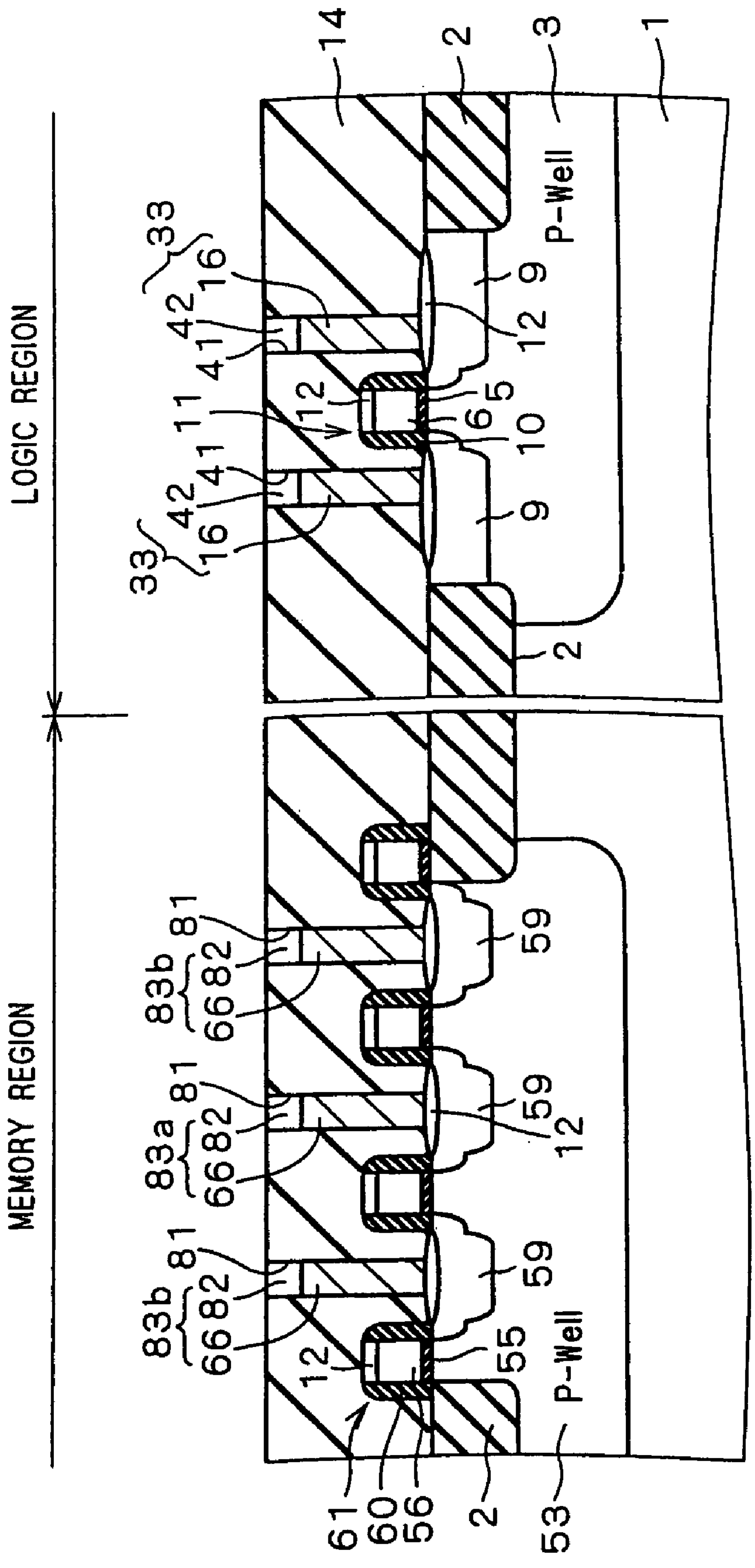

F I G . 4 1
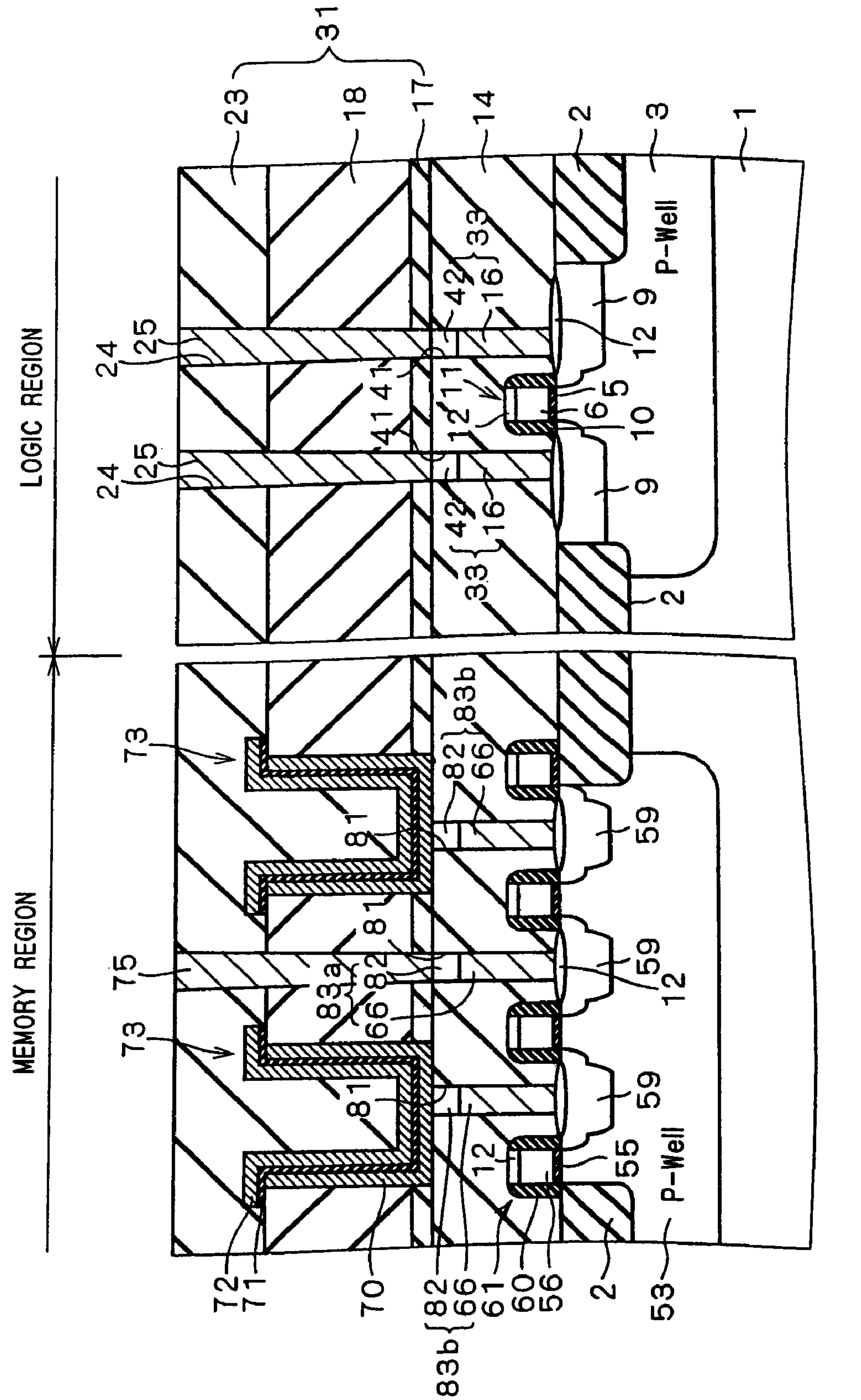

F I G . 4 2
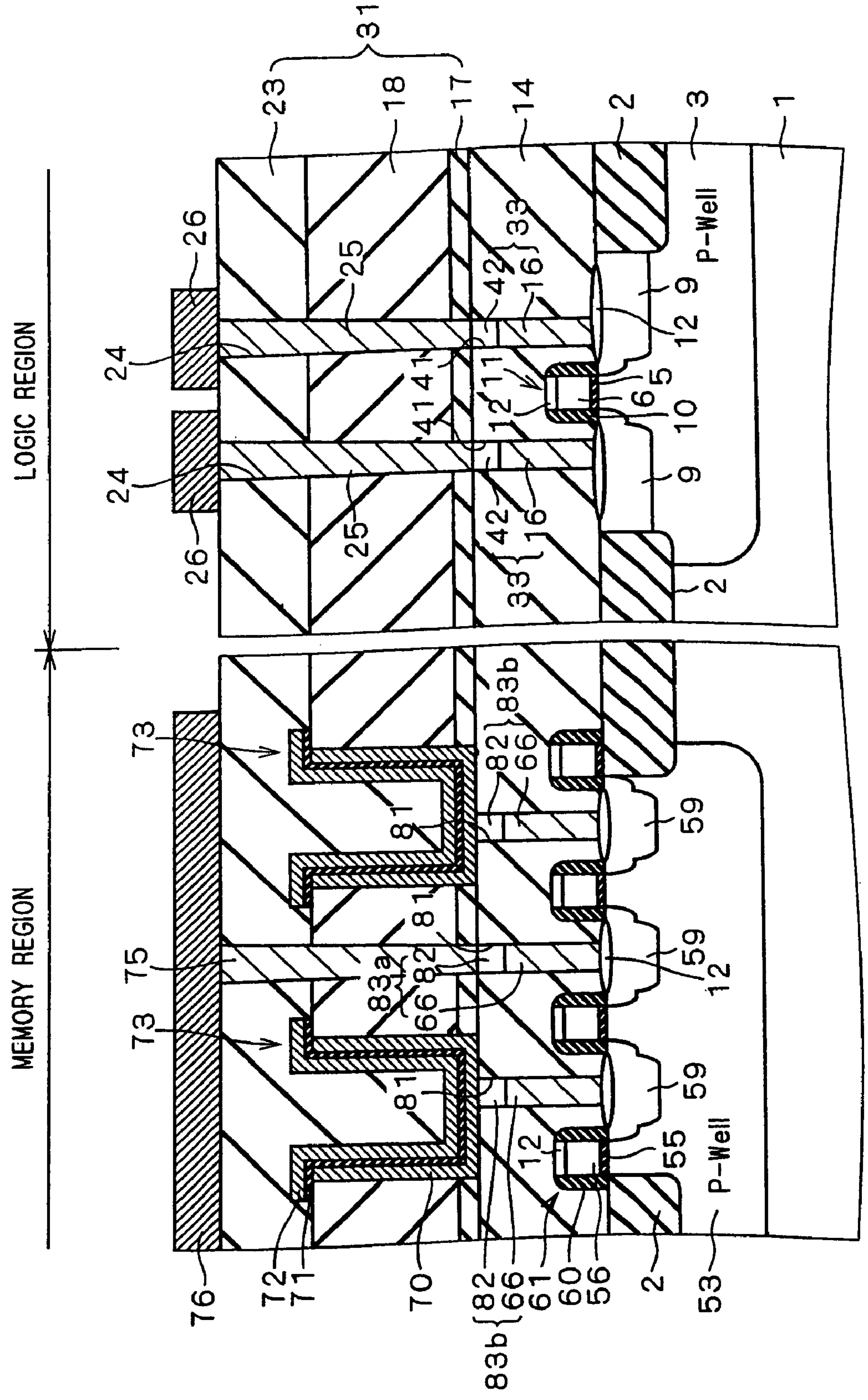

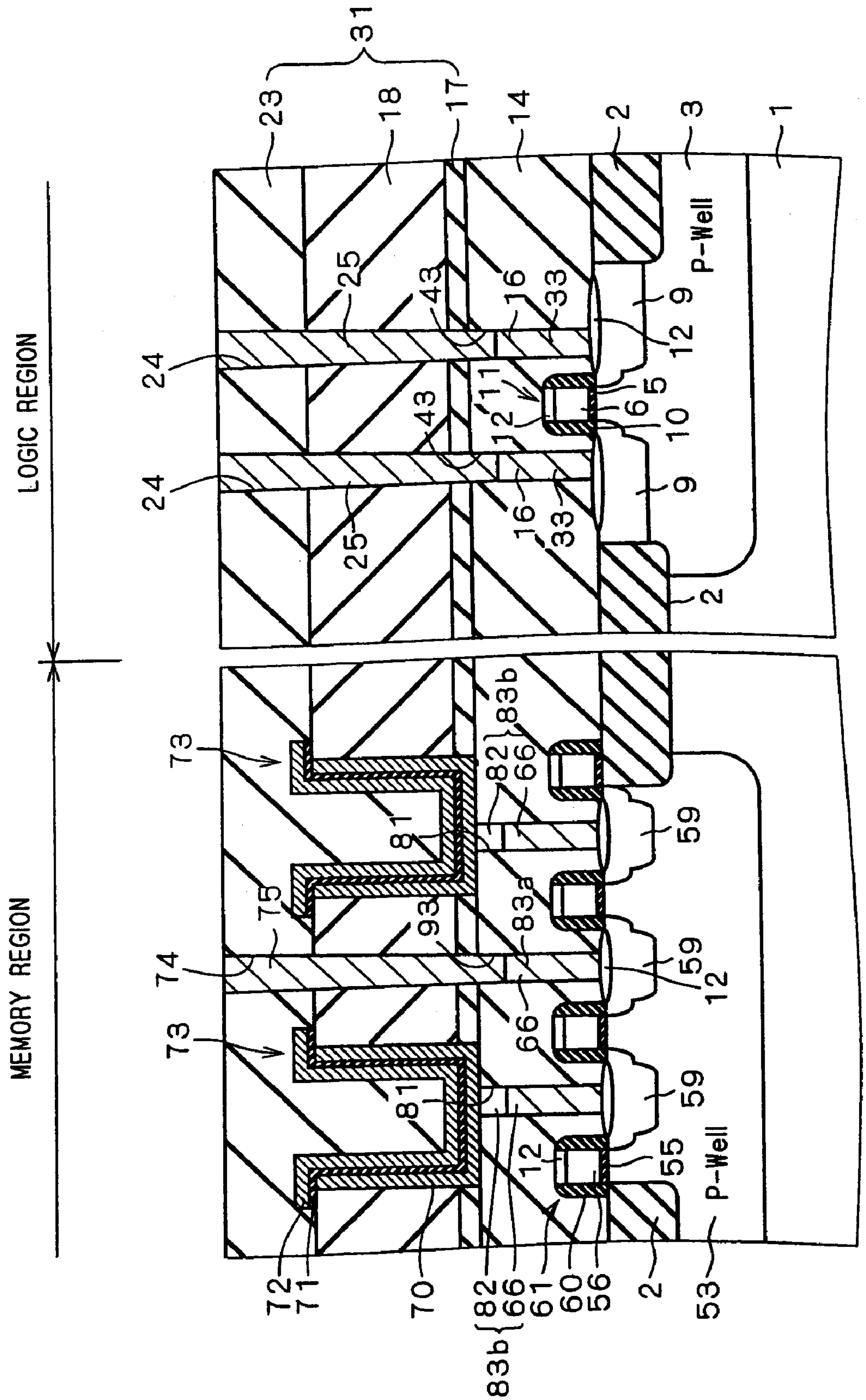
F I G . 4 9

F I G . 5 4
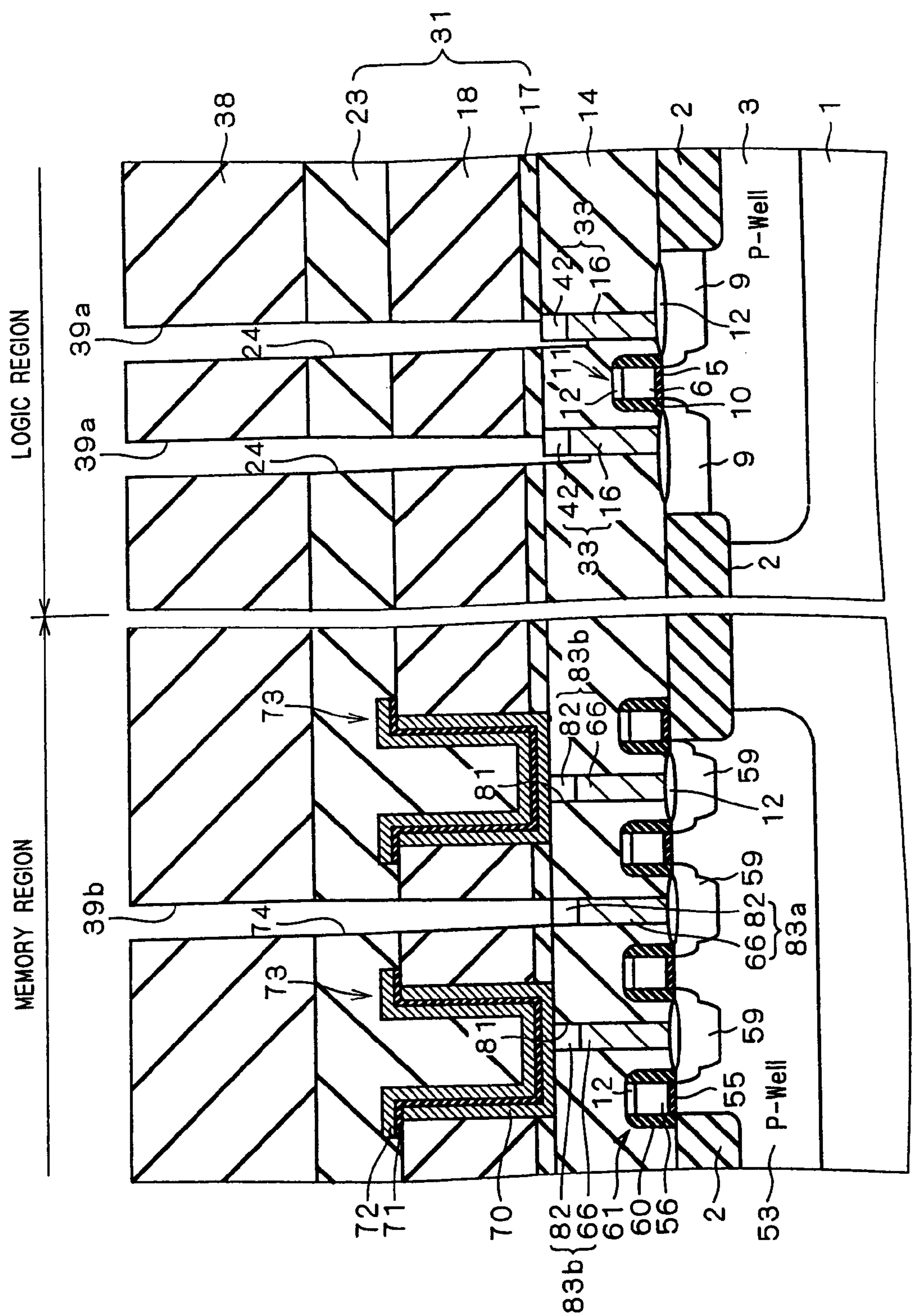

F I G . 5 6
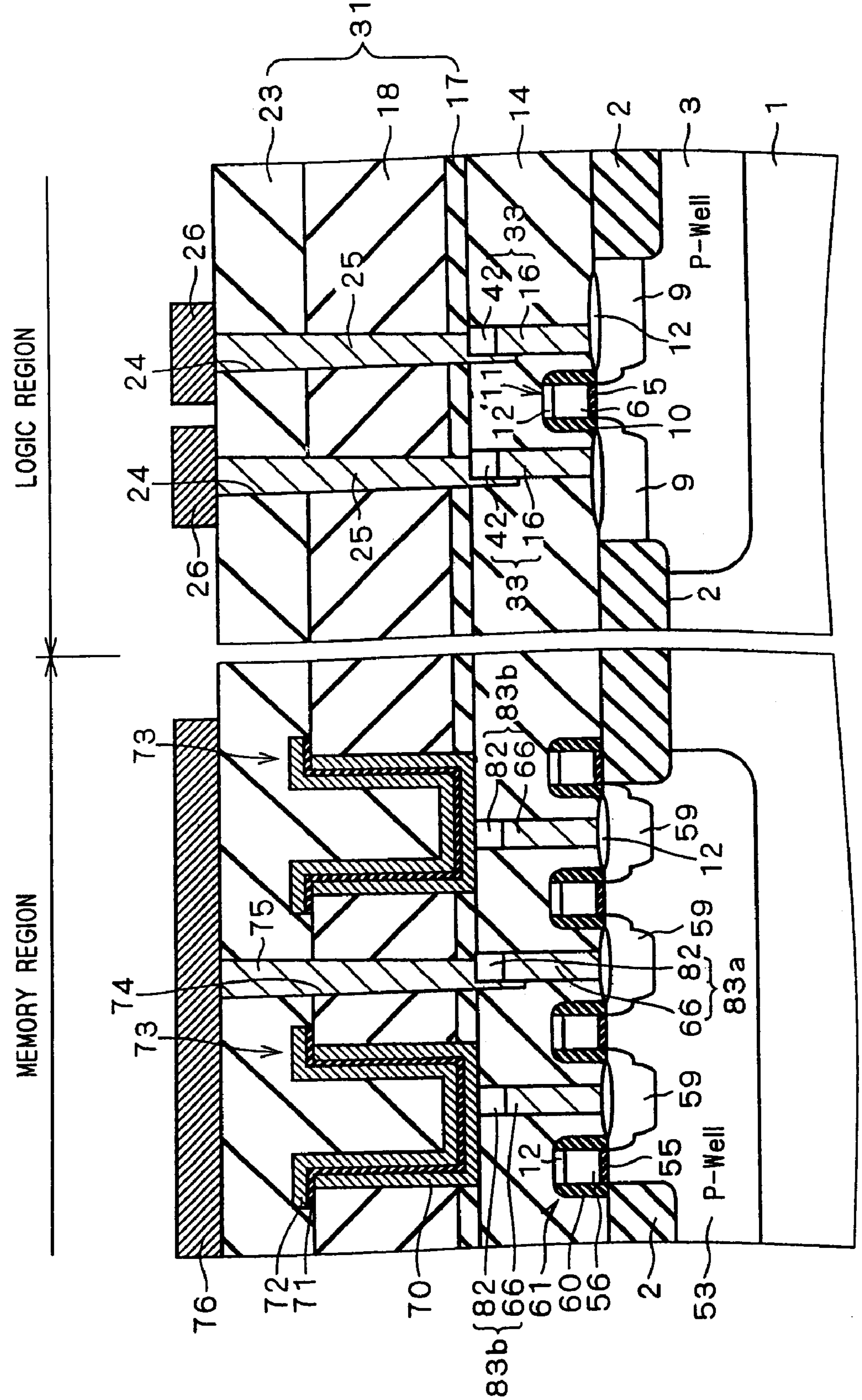

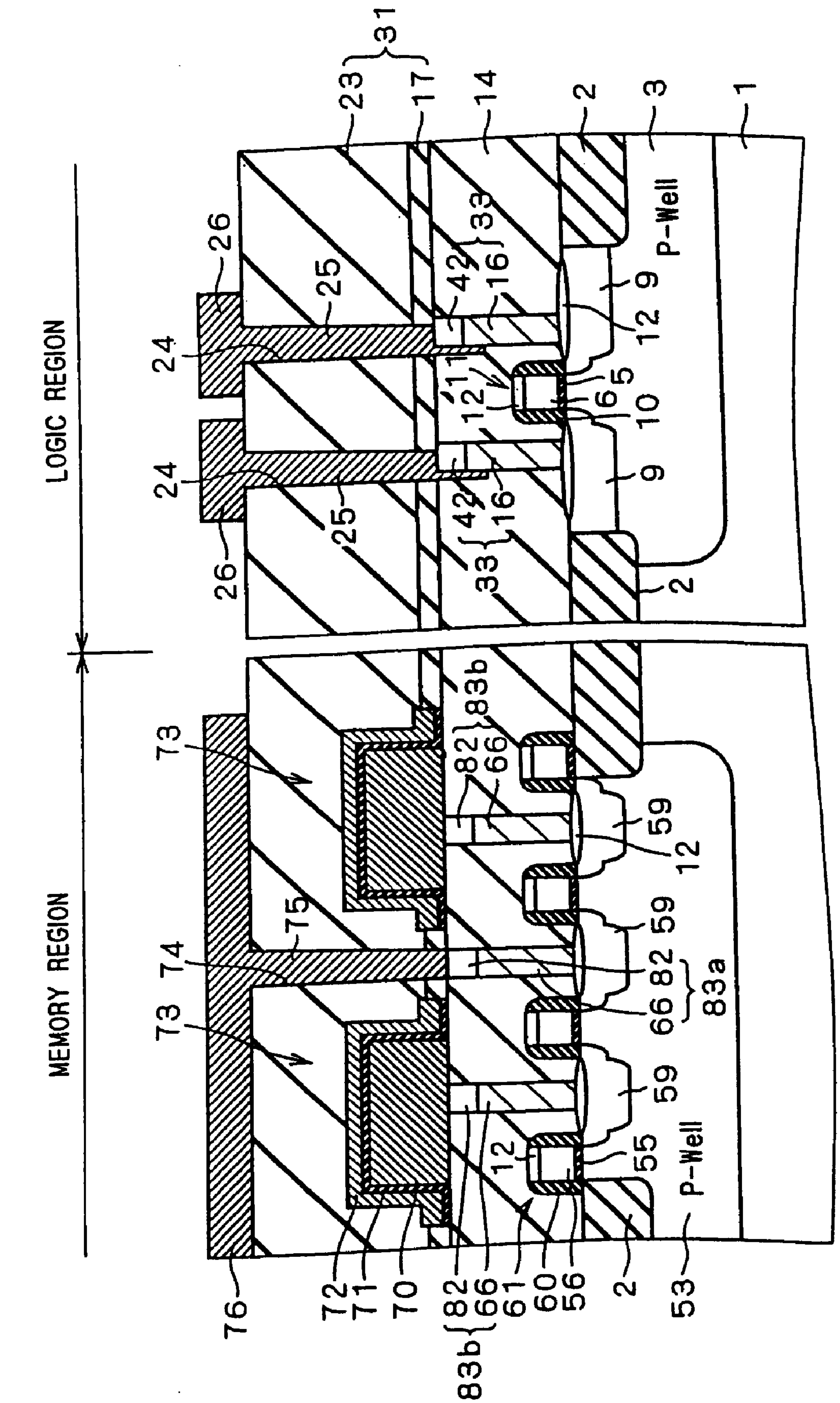
F I G . 6 3

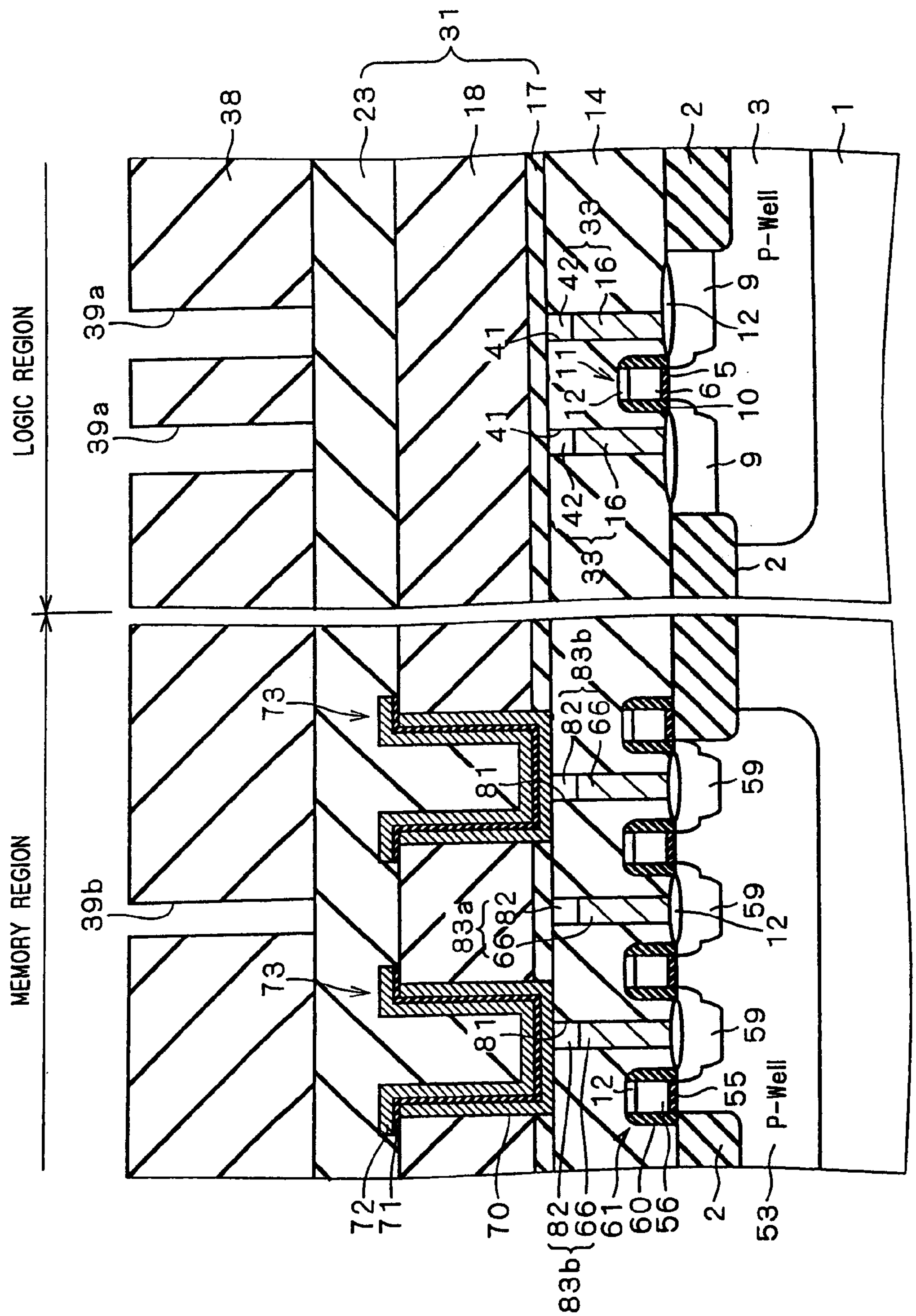
F I G . 6 5

F I G . 7 2
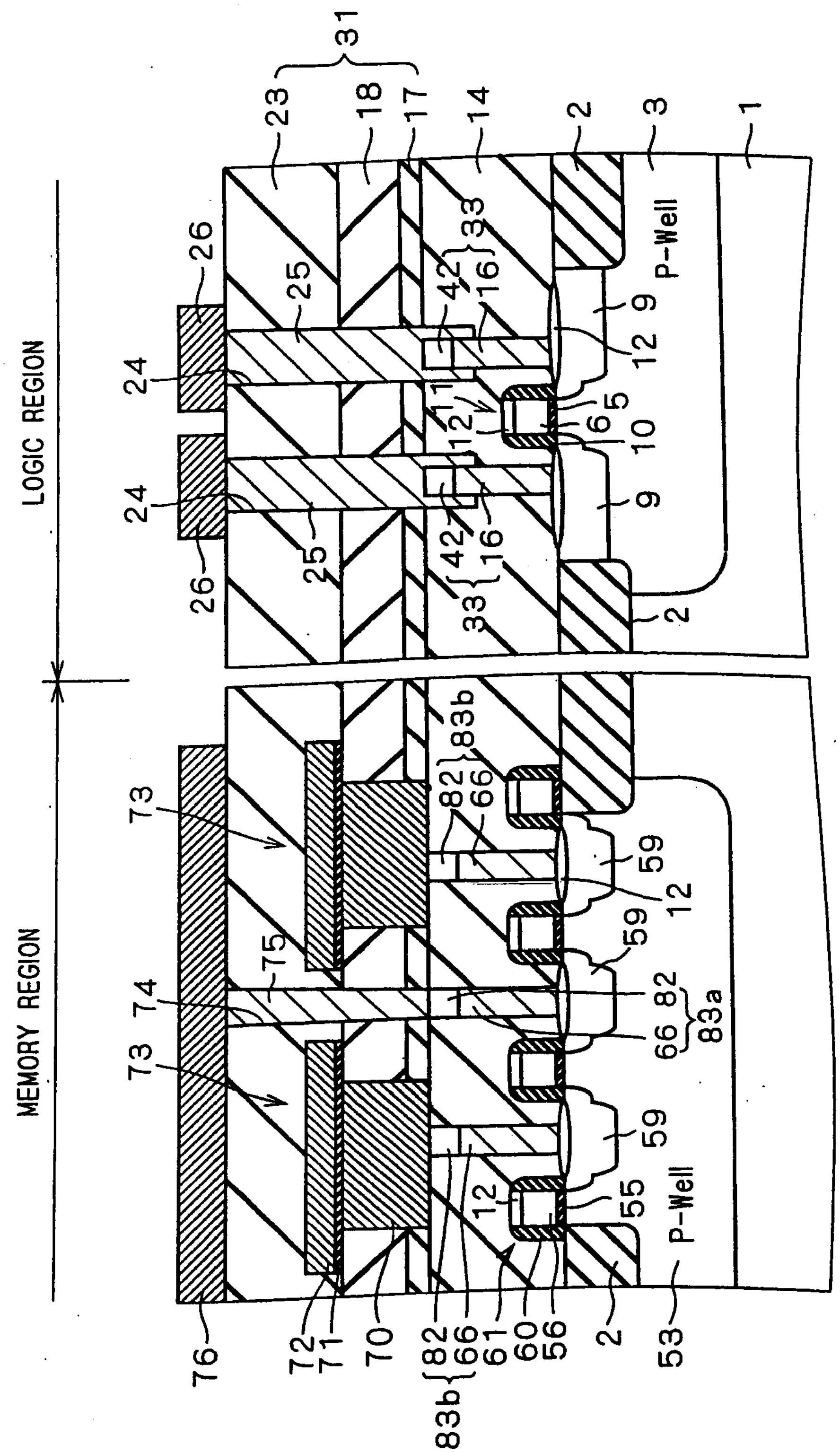

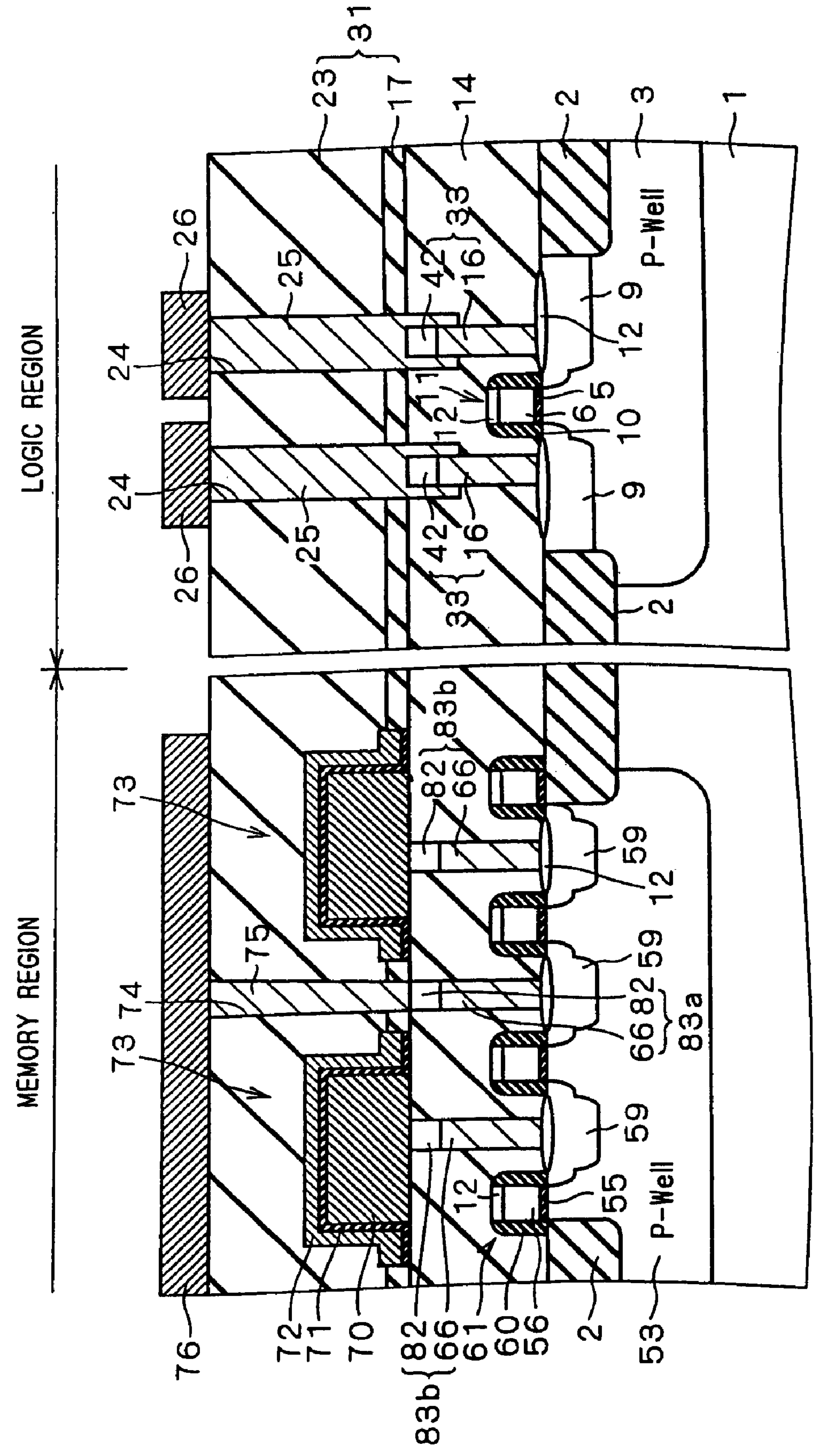
F I G . 7 3

F I G . 7 4
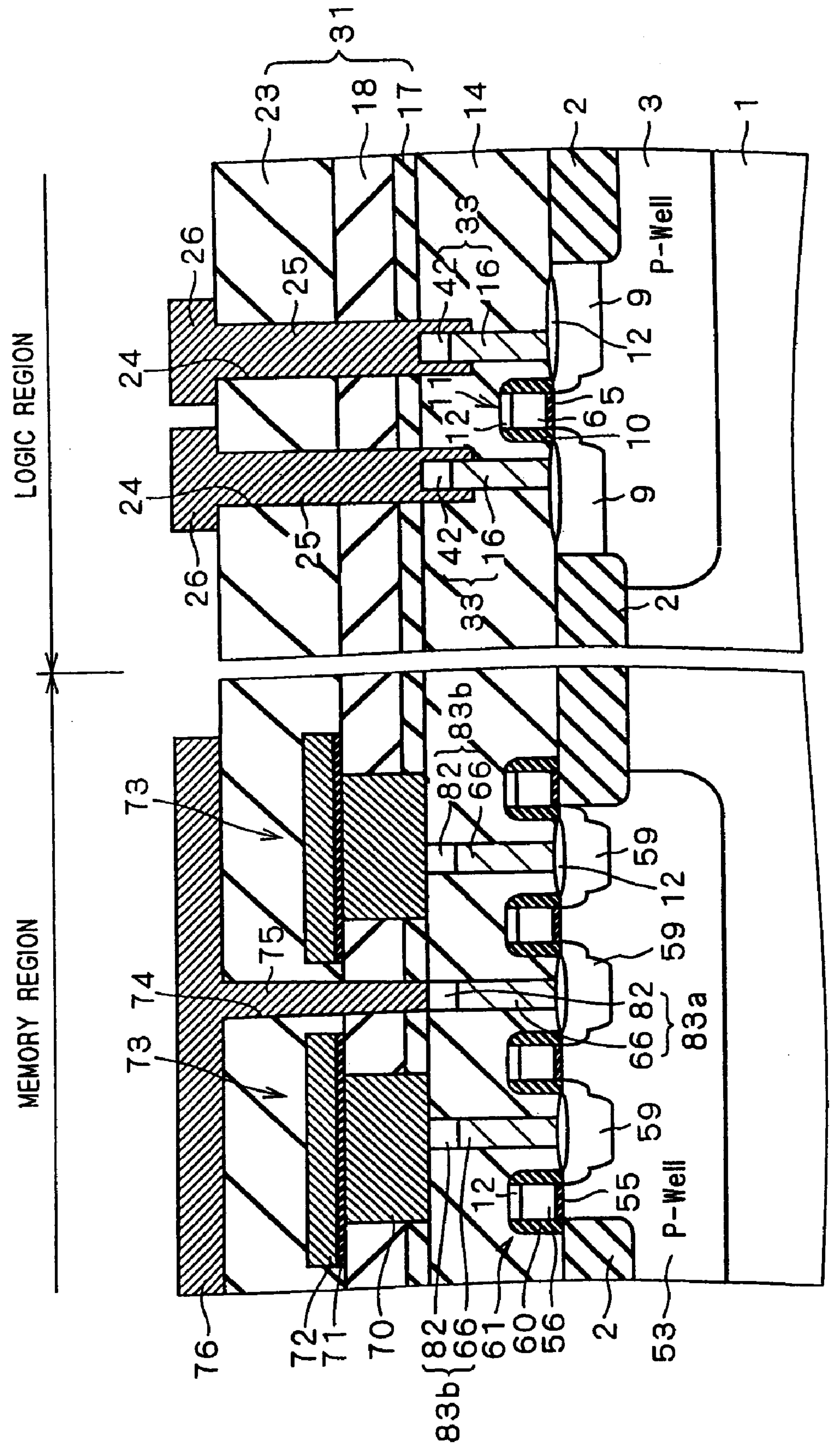

SEMICONDUCTOR DEVICE MANUFACTURING METHOD AND SEMICONDUCTOR DEVICE

CROSS-REFERENCE TO RELATED APPLICATION

This application is a Continuation application of Ser. No. 11/455,666 filed Jun. 20, 2006, which is a Continuation application of Ser. No. 11/165,506 filed Jun. 24, 2005, now U.S. Pat. No. 7,078,759 which is a Division of Ser. No. 10/697,316 filed Oct. 31, 2003, now U.S. Pat. No. 6,924,192 and claims the benefit of priority from the prior Japanese Patent No. 2003-144670 filed May 22, 2003.

BACKGROUND OF THE INVENTION

1. Field of the Invention

The present invention relates to a merged memory-logic semiconductor device having a memory device and a logic device formed on a semiconductor substrate, and to a method for manufacturing the semiconductor device.

2. Description of the Background Art

The recent miniaturization of merged memory-logic semiconductor devices is leading to reduction of memory cell areas. Accordingly, in order to ensure certain capacitor capacitance even with reduced memory cell areas, MIM (Metal-Insulator-Metal) capacitors are now often adopted as memory cell capacitors.

When MIM capacitors are adopted as memory cell capacitors, the process of forming the dielectric film may oxidize contact plugs connected to the lower electrodes and neighboring contact plugs to increase the contact resistance. In order to solve this problem, Japanese Patent Application Laid-Open No. 2001-267516 discloses a technique for preventing the increase in contact resistance by providing an oxidation-preventing barrier layer on top ends of contact plugs. Also, Japanese Patent Application Laid-Open Nos. 2001-284541 and 10-150161 (1998) disclose techniques about semiconductor devices with capacitors.

However, with merged memory-logic semiconductor devices, it is difficult to achieve both of a reduction in contact resistance in the memory device and a reduction in contact resistance in the logic device.

SUMMARY OF THE INVENTION

An object of the invention is to provide a technique which makes it possible to achieve both of a reduction in contact resistance in a memory device and a reduction in contact resistance in a logic device even when oxidation is performed during formation of dielectric films of MIM capacitors.

A semiconductor device manufacturing method of the invention includes steps (a) to (d). The step (a) is to form a first insulating film on a semiconductor substrate having a memory region where a memory device is to be formed and a logic region where a logic device is to be formed. The step (b) is to form, in the first insulating film, a first contact plug electrically connected to the semiconductor substrate in the memory region and having its top surface exposed from the first insulating film, and a second contact plug electrically connected to the semiconductor substrate in the logic region and having its top surface exposed from the first insulating film. The first contact plug formed in the step (b) has a first conductive film and a first conductive barrier layer formed on a top end of the first contact plug. The step (c) is to form an MIM capacitor in contact with the first conductive barrier layer and forms a second insulating film, covering the MIM capacitor, on a top surface of the structure obtained by the step (b). After the step (c), the step (d) is to form, in the second insulating film, a third contact plug in contact with the second contact plug. The MIM capacitor formed in the step (c) has a lower electrode in contact with the first conductive barrier layer, an upper electrode, and a dielectric film interposed therebetween.

The first contact plug connected to the MIM capacitor has the first conductive barrier layer in its top end, so that the first conductive film of the first contact plug is not oxidized during formation of the dielectric film of the MIM capacitor. This lowers the contact resistance between the MIM capacitor and the semiconductor substrate in the memory region. Furthermore, adopting the stacked structure in the logic region reduces inferior contacts due to increased aspect ratios of contact plugs. It is thus possible to achieve both of a reduction in contact resistance in the memory device and a reduction in contact resistance in the logic device even when formation of the dielectric film of the MIM capacitor involves oxidation process.

A first semiconductor device of the invention includes a semiconductor substrate, first and second insulating films, first to third contact plugs, and an MIM capacitor. The semiconductor substrate has a memory region where a memory device is formed and a logic region where a logic device is formed. The first insulating film is provided on the semiconductor substrate. The first contact plug is provided in the first insulating film with its top surface exposed from the first insulating film, and is electrically connected to the semiconductor substrate in the memory region. The second contact plug is provided in the first insulating film with its top surface exposed from the first insulating film, and is electrically connected to the semiconductor substrate in the logic region. The MIM capacitor has a lower electrode, an upper electrode, and a dielectric film interposed therebetween and the lower electrode is in contact with the top surface of the first contact plug. The second insulating film is provided on the first insulating film and covers the MIM capacitor. The third contact plug is provided in the second insulating film and is in contact with the second contact plug. The first contact plug has a first conductive barrier layer in its top portion and a first conductive film in the remaining portion. The second contact plug has a second conductive barrier layer in its top portion and has, in the remaining portion, a second conductive film having a higher conductivity than the second conductive barrier layer. The third contact plug extends into the first insulating film and is in contact with the second conductive barrier layer and a side surface of the second conductive film.

Even though the second contact plug in the logic region has the second conductive barrier layer, the third contact plug in the upper layer is in contact not only with the second conductive barrier layer of the lower-layer second contact plug but also with the second conductive film having a higher conductivity. This lowers the contact resistance between the third contact plug and the semiconductor substrate in the logic region. Furthermore, the first contact plug in contact with the MIM capacitor has the first conductive barrier layer in its top, which prevents oxidation of the first conductive film of the first contact plug during formation of the dielectric film of the MIM capacitor. It is thus possible to achieve both of a reduction in contact resistance in the memory device and a reduction in contact resistance in the logic device even when the formation of the dielectric film of the MIM capacitor involves oxidation process.

A second semiconductor device of the invention includes a semiconductor substrate, first and second insulating films, first to fifth contact plugs, and an MIM capacitor. The semiconductor substrate has a memory region where a memory device is formed and a logic region where a logic device is formed. The first insulating film is provided on the semiconductor substrate. The first and second contact plugs are provided in the first insulating film with their respective top surfaces exposed from the first insulating film, and are electrically connected to the semiconductor substrate in the memory region. The third contact plug is provided in the first insulating film with its top surface exposed from the first insulating film, and is electrically connected to the semiconductor substrate in the logic region. The MIM capacitor has a lower electrode, an upper electrode, and a dielectric film interposed therebetween, and the lower electrode is in contact with the top surface of the first contact plug. The second insulating film is provided on the first insulating film and covers the MIM capacitor. The fourth contact plug is provided in the second insulating film and is in contact with the second contact plug. The fifth contact plug is provided in the second insulating film and is in contact with the third contact plug. The first contact plug has a first conductive barrier layer in its top portion and a first conductive film in the remaining portion. The second contact plug has a second conductive barrier layer in its top portion and has, in the remaining portion, a second conductive film having a higher conductivity than the second conductive barrier layer. The fourth contact plug extends into the first insulating film and is in contact with the second conductive barrier layer and a side surface of the second conductive film.

Even though the second contact plug in the memory region has the second conductive barrier layer, the fourth contact plug in the upper layer is in contact not only with the second conductive barrier layer of the lower-layer second contact plug but also with the second conductive film having a higher conductivity. This lowers the contact resistance between the fourth contact plug and the semiconductor substrate in the memory region. Furthermore, the first contact plug in contact with the MIM capacitor has a first conductive barrier layer in its top, which prevents oxidation of the first conductive film of the first contact plug during formation of the dielectric film of the MIM capacitor. It is thus possible to achieve both of a reduction in contact resistance in the memory device and a reduction in contact resistance in the logic device even when the formation of the dielectric film of the MIM capacitor involves oxidation process.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 16 are cross-sectional views showing a sequence of process steps for manufacturing a semiconductor device according to a first preferred embodiment of the invention;

FIGS. 22 to 30 are cross-sectional views showing a sequence of process steps for manufacturing a semiconductor device according to a second preferred embodiment of the invention;

FIGS. 31 to 35 are cross-sectional views showing the structures of semiconductor devices that can be manufactured according to the second preferred embodiment of the invention;

FIGS. 36 to 42 are cross-sectional views showing a sequence of process steps for manufacturing a semiconductor device according to a third preferred embodiment of the invention;

FIGS. 48 to 50 are cross-sectional views showing a sequence of process steps for manufacturing a semiconductor device according to a fourth preferred embodiment of the invention;

FIGS. 52 to 55 are cross-sectional views showing a sequence of process steps for manufacturing the semiconductor device of the fifth preferred embodiment of the invention;

FIG. 56 is a cross-sectional view showing the structure of a modification of the semiconductor device of the fifth preferred embodiment of the invention;

FIGS. 59 to 63 are cross-sectional views showing the structures of modifications of the semiconductor device of the fifth preferred embodiment of the invention;

FIGS. 65 to 67 are cross-sectional views showing a sequence of process steps for manufacturing the semiconductor device of the sixth preferred embodiment of the invention;

FIGS. 71 to 75 are cross-sectional views showing the structures of modifications of the semiconductor device of the sixth preferred embodiment of the invention.

DESCRIPTION OF THE PREFERRED EMBODIMENTS

First Preferred Embodiment

Figure 2:
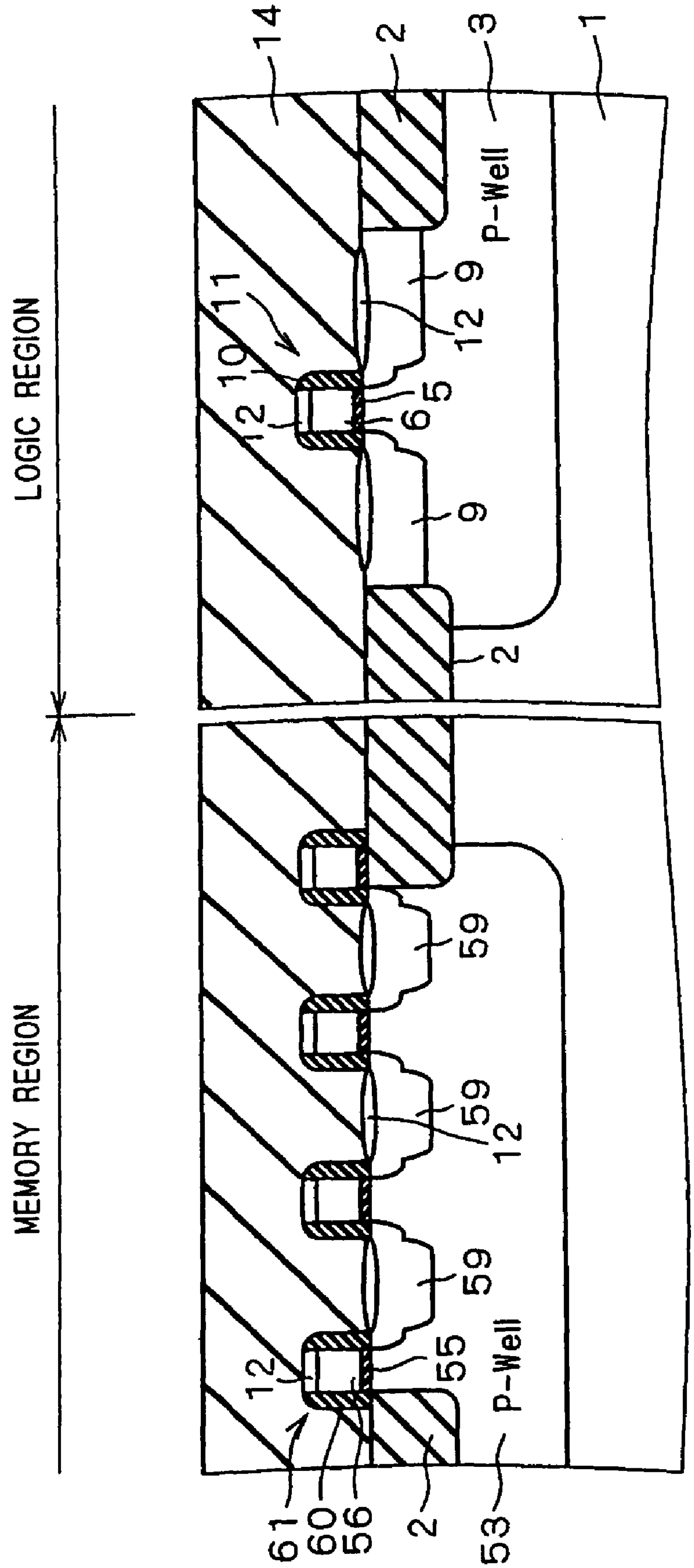

FIGS. 1 to 16 are cross-sectional views showing a sequence of process steps for manufacturing a semiconductor device according to a first preferred embodiment of the present invention. The semiconductor device of the first preferred embodiment is a merged memory-logic semiconductor device; for example, it has, as a memory device, a DRAM with CUB (Capacitor Under Bit Line) structured memory cells, and also has salicide CMOS transistors as a logic device. The capacitors of the DRAM memory cells are concave-type MIM capacitors, for example. The semiconductor device manufacturing method of the first preferred embodiment will now be described referring to FIGS. 1 to 16.

First, as shown in FIG. 1, element isolation insulating films 2 are formed in the upper surface of a semiconductor substrate 1, e.g. an n-type silicon substrate, by a known LOCOS isolation technique or trench isolation technique. Then a p-type well region 53 is formed in the upper surface of the semiconductor substrate 1 in the region for formation of the memory device (hereinafter referred to as “a memory region”) and a p-type well region 3 is formed in the upper surface of the semiconductor substrate 1 in the region for formation of the logic device (hereinafter referred to as “a logic region).

Next, in the memory region, a plurality of n-type source/drain regions 59 are formed at given distances from each other in the upper surface of the well region 53, and gate structures 61 are formed on the upper surface of the well region 53 between the source/drain regions 59. In the logic region, a plurality of n-type source/drain regions 9 are formed at a given distance in the upper surface of the well region 3 and a gate structure 11 is formed on the upper surface of the well region 3 between the source/drain regions 9.

Each gate structure 61 in the memory region has: a gate insulating film 55, e.g. a silicon oxide film; a gate electrode 56, e.g. a polycrystalline silicon film; and sidewalls 60, e.g. silicon nitride films. After the formation of the gate structures 61, the gate insulating films 55 lie on the top surface of the well region 53 between the source/drain regions 59, with the gate electrodes 56 lying on the gate insulating films 55. The sidewalls 60 reside on the sides of the gate insulating films 55 and gate electrodes 56.

The gate structure 11 in the logic region has: a gate insulating film 5, e.g. a silicon oxide film; a gate electrode 6, e.g. a polycrystalline silicon film; and sidewalls 10, e.g. silicon nitride films. After the formation of the gate structure 11, the gate insulating film 5 lies on the top surface of the well region 3 between the source/drain regions 9, with the gate electrode 6 lying on the gate insulating film 5. The sidewalls 10 reside on the sides of the gate insulating film 5 and gate electrode 6.

Next, the top surfaces of the gate electrodes 6 and 56 and the top surfaces of the source/drain regions 9 and 59 are silicidized to form silicide films 12 on the top surfaces of the gate electrodes 6 and 56 and silicide films 12 on the top surfaces of the source/drain regions 9 and 59. The silicide films 12 may be cobalt silicide films, for example.

Next, as shown in FIG. 2, an insulating film 14 is formed on the semiconductor substrate 1 to cover the gate structures 11 and 61. The insulating film 14, e.g. a BPTEOS film, functions as an interlayer insulating film.

Next, resist (not shown) having a given opening pattern is formed on the insulating film 14 by photolithography and then the insulating film 14 is partially etched and removed away using the resist. This etching adopts an anisotropic dry-etching using a mixed gas of $C_4F_6$, $O_2$, and Ar. Then the resist used as a mask is removed.

Figure 3:
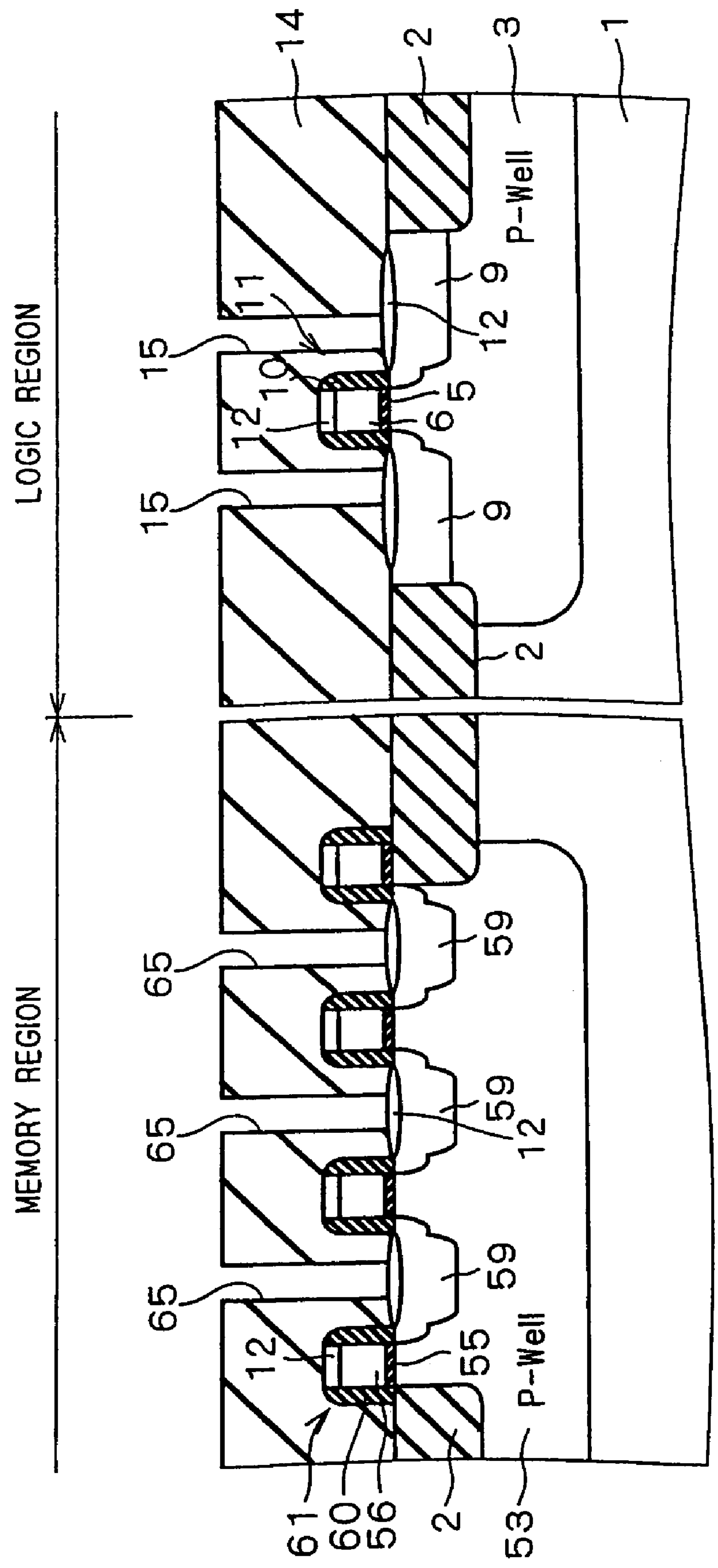

Thus, as shown in FIG. 3, in the memory region, contact holes 65 are formed in the insulating film 14 to reach the silicide films 12 on the semiconductor substrate 1; in the logic region, contact holes 15 are formed in the insulating film 14 to reach the silicide films 12 on the semiconductor substrate 1.

Figure 4:
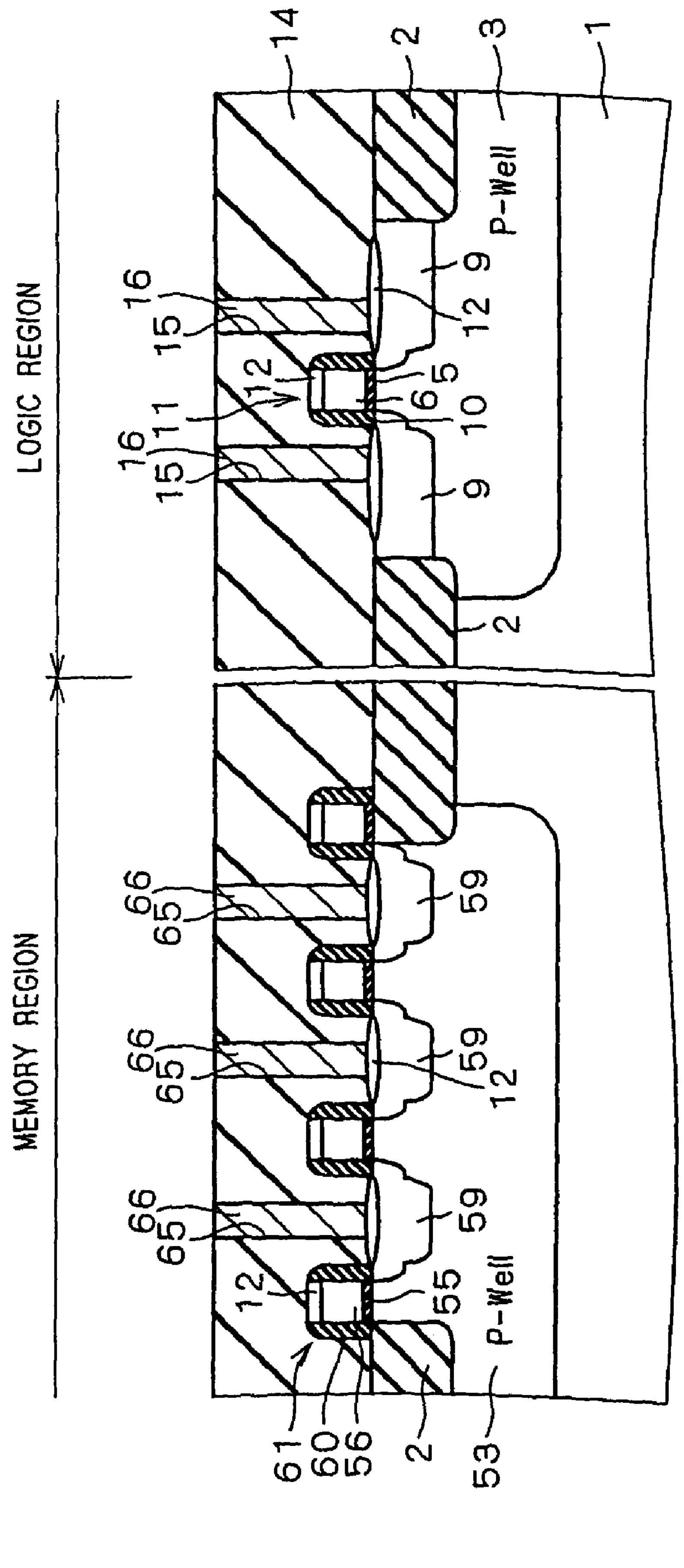

Next, a refractory metal film of, e.g. tungsten, is formed all over the surface to fill the contact holes 15 and 65. Then, the refractory metal film on the top surface of the insulating film 14 is removed, e.g. by CMP. Thus, as shown in FIG. 4, in the insulating film 14, conductive films 16 of refractory metal fill the contact holes 15 and conductive films 66 of refractory metal fill the contact holes 65.

Figure 5:
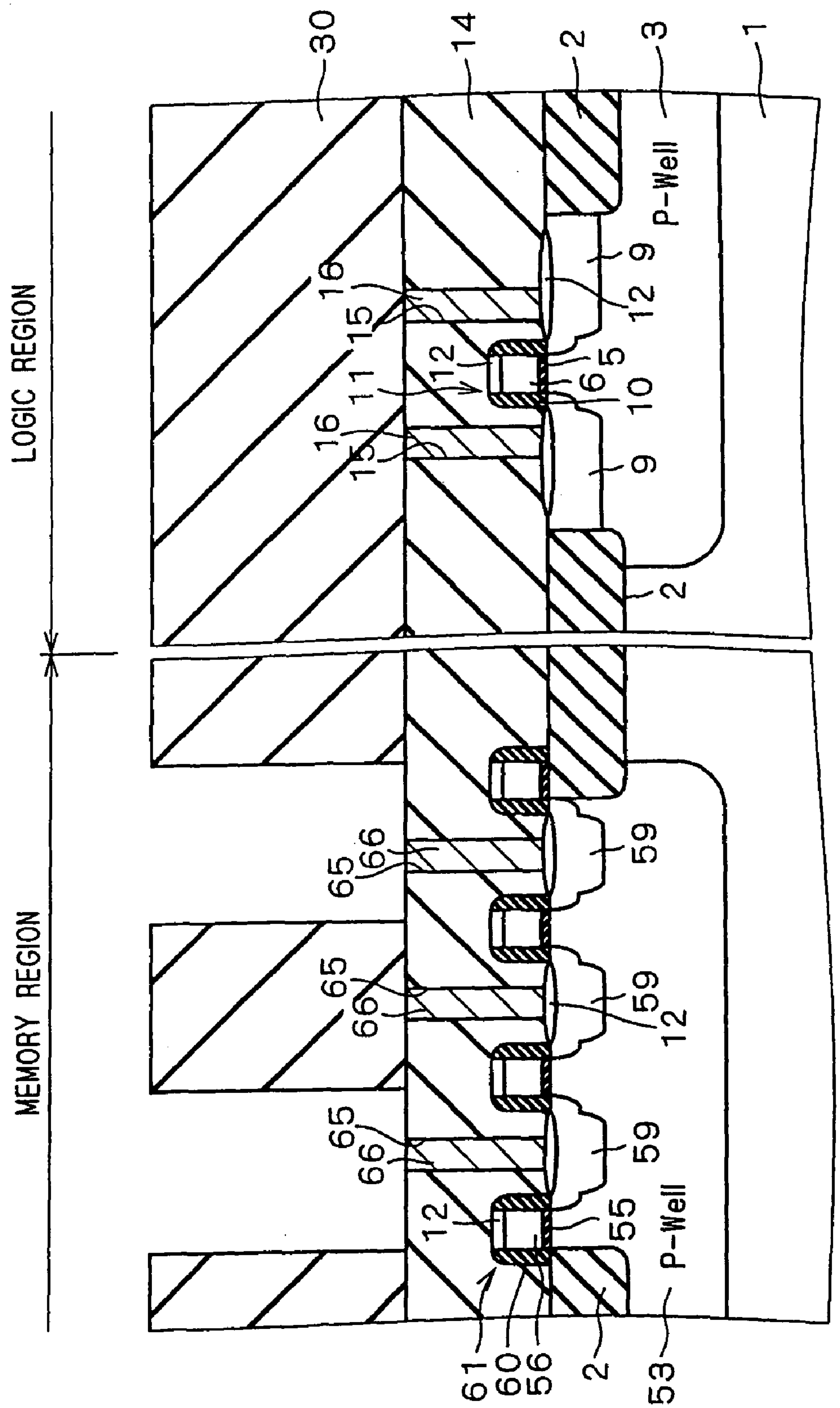
Figure 6:
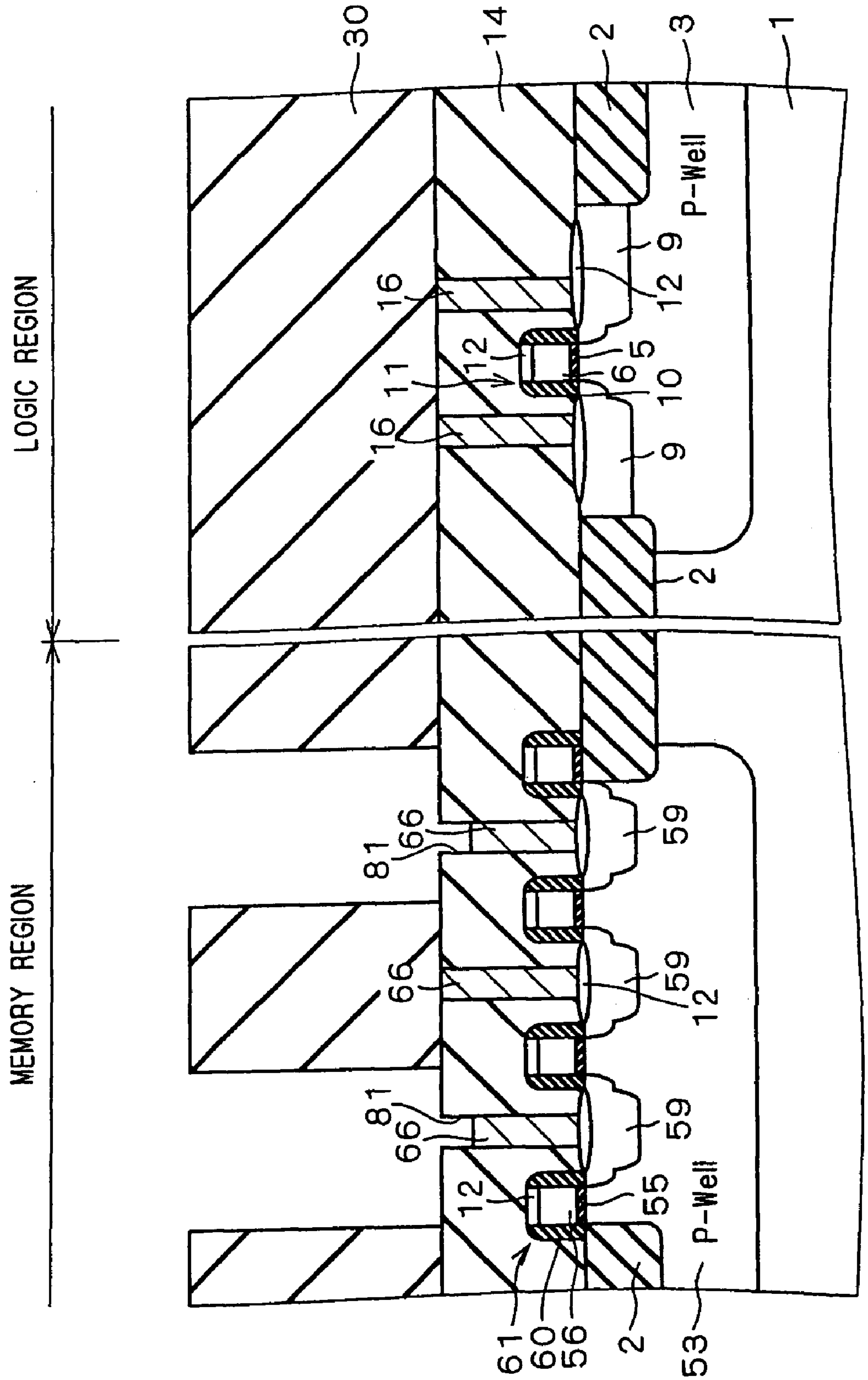

Next, as shown in FIG. 5, a resist 30, adapted for excimer exposure, is formed all over the surface, and a photolithography process using an excimer laser as the light source is applied to the resist 30 to form an opening pattern that exposes the top surfaces of conductive films 66 that will be electrically connected to capacitors formed later. Then, as shown in FIG. 6, using the resist 30 as a mask, the exposed portions are etched to selectively remove upper parts of the conductive films 66 that are to be connected with capacitors. This process forms recesses 81 in the insulating film 14 in the memory region. This etching process adopts an anisotropic dry-etching using $SF_6$ as the etching gas.

Figure 7:
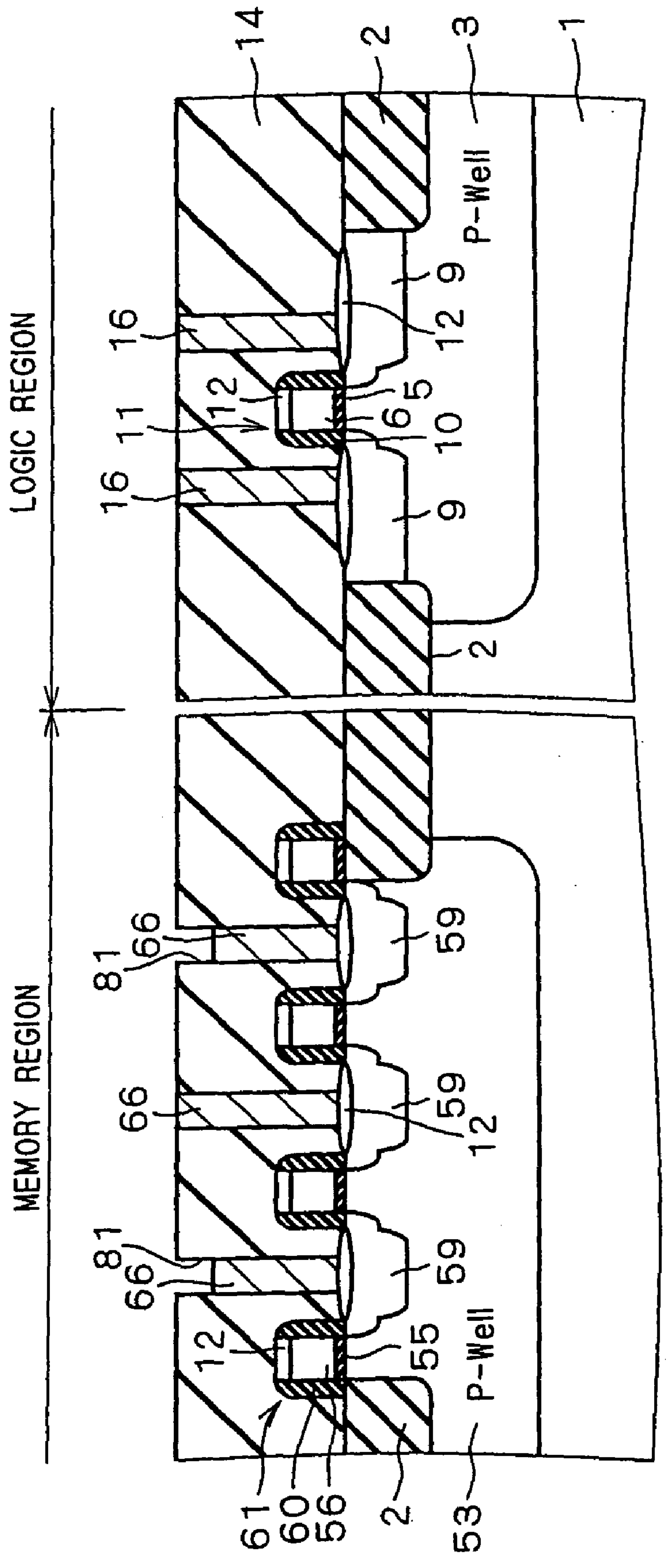

Next, as shown in FIG. 7, the resist 30 used as a mask is removed. Then, a barrier layer material, formed of, e.g. titanium nitride (TiN), tantalum nitride (TaN), or titanium silicide nitride (TiSiN), is formed all over the surface to fill the recesses 81, and the barrier layer material is removed above the recesses 81, e.g. by CMP. Thus, as shown in FIG. 8, conductive barrier layers 82 of, e.g. titanium nitride, tantalum nitride, or titanium silicide nitride, fill the recesses 81 in the insulating film 14.

The process steps above thus form a contact plug **83*a* and contact plugs 83*b* in the insulating film 14 in the memory region; the contact plug 83*a* is formed of the conductive film 66, and the contact plugs 83*b* are each formed of the conductive barrier layer 82 in the upper part and the conductive film 66 in the remaining part. In the logic region, contact plugs 33 made of the conductive film 16 are thus formed in the insulating film 14. As can be clearly seen from the materials used, the conductive barrier layers 82 exhibit lower conductivity than the conductive films 16 and 66**.

The contact plugs 33 have their top surfaces exposed from the insulating film 14 and are electrically connected through the silicide films 12 to the source/drain regions 9 in the upper surface of the semiconductor substrate 1.

The contact plug **83*a* has its top surface exposed from the insulating film 14 and is electrically connected through the silicide film 12 to one of the adjacent source/drain regions 59** that is to be electrically connected to a bit line formed later.

The contact plugs **83*b* have their top surfaces, i.e. the top surfaces of conductive barrier layers 82, exposed from the insulating film 14, and are electrically connected through silicide films 12 to ones of the adjacent source/drain regions 59** that are to be electrically connected to capacitors formed later.

Figure 9:
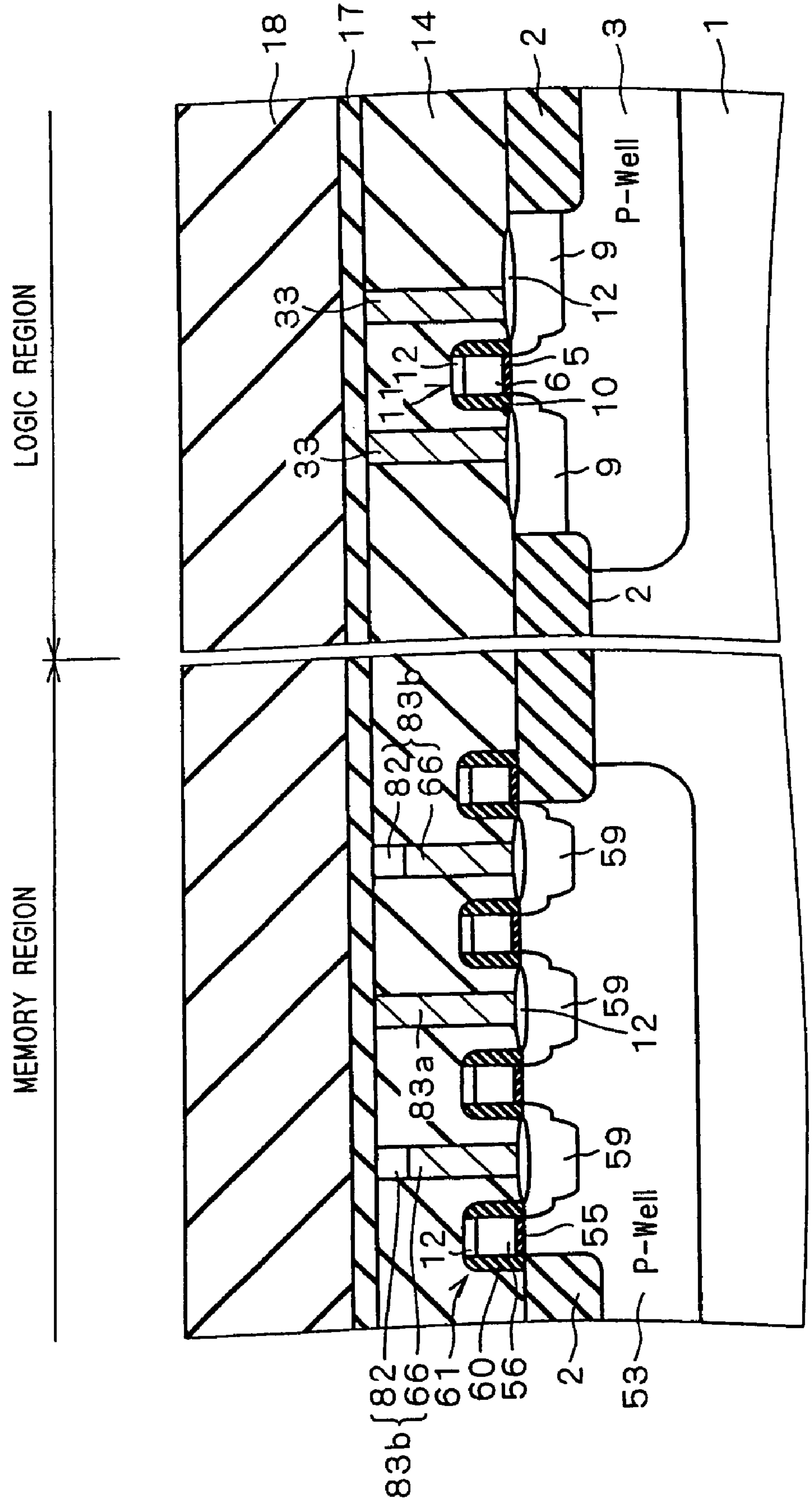

Next, as shown in FIG. 9, a stopper film 17, e.g. a silicon nitride film, is formed on the insulating film 14 and contact plugs 33, **83*a*, and 83*b*. Then an interlayer insulating film 18 is formed on the stopper film 17. BPTEOS film is adopted as the interlayer insulating film 18**, for example.

Next, a resist (not shown) having a given opening pattern is formed on the interlayer insulating film 18. Then, using the resist as a mask, the interlayer insulating film 18 is etched away using the stopper film 17 as an etching stopper. This etching adopts an anisotropic dry-etching process using a mixed gas of $C_4F_6$, $O_2$, and Ar.

Figure 10:
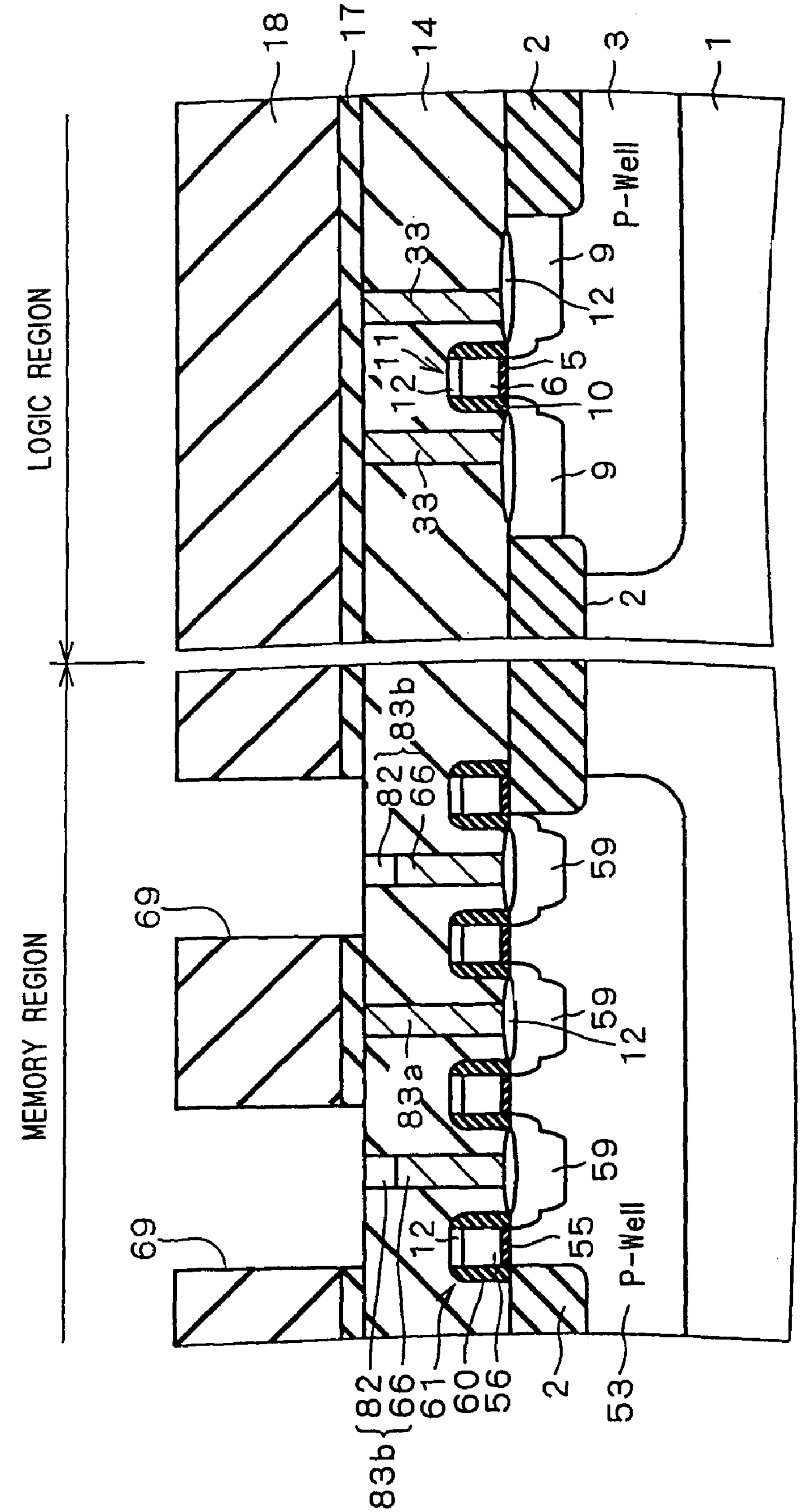

Then, using again as a mask the resist used to etch the interlayer insulating film 18, the exposed parts of the stopper film 17 are etched and removed away and then the resist is removed. This etching adopts an anisotropic dry-etching process using $CHF_3$ as the etching gas. Thus, as shown in FIG. 10, openings 69 are formed through the interlayer insulating film 18 and stopper film 17, exposing the contact plugs **83*b*** that are to be connected with capacitors.

Next, DRAM memory cell capacitors are formed in the openings 69; the capacitors are formed in contact with the conductive barrier layers 82 of the contact plugs **83*b*. More specifically, a lower electrode material, e.g. ruthenium (Ru), titanium nitride (TiN), or platinum (Pt), is formed all over the surface. Then, with resist (not shown) filling the openings 69, the lower electrode material on the top surface of the interlayer insulating film 18 is removed by anisotropic dry-etching, and then the resist is removed. Thus, as shown in FIG. 11, capacitor lower electrodes 70, of ruthenium, titanium nitride, or platinum, are formed in the openings 69. While the description said that the lower electrode material on top of the interlayer insulating film 18** is removed by anisotropic dry-etching, the electrode material may be removed by CMP.

Figure 12:
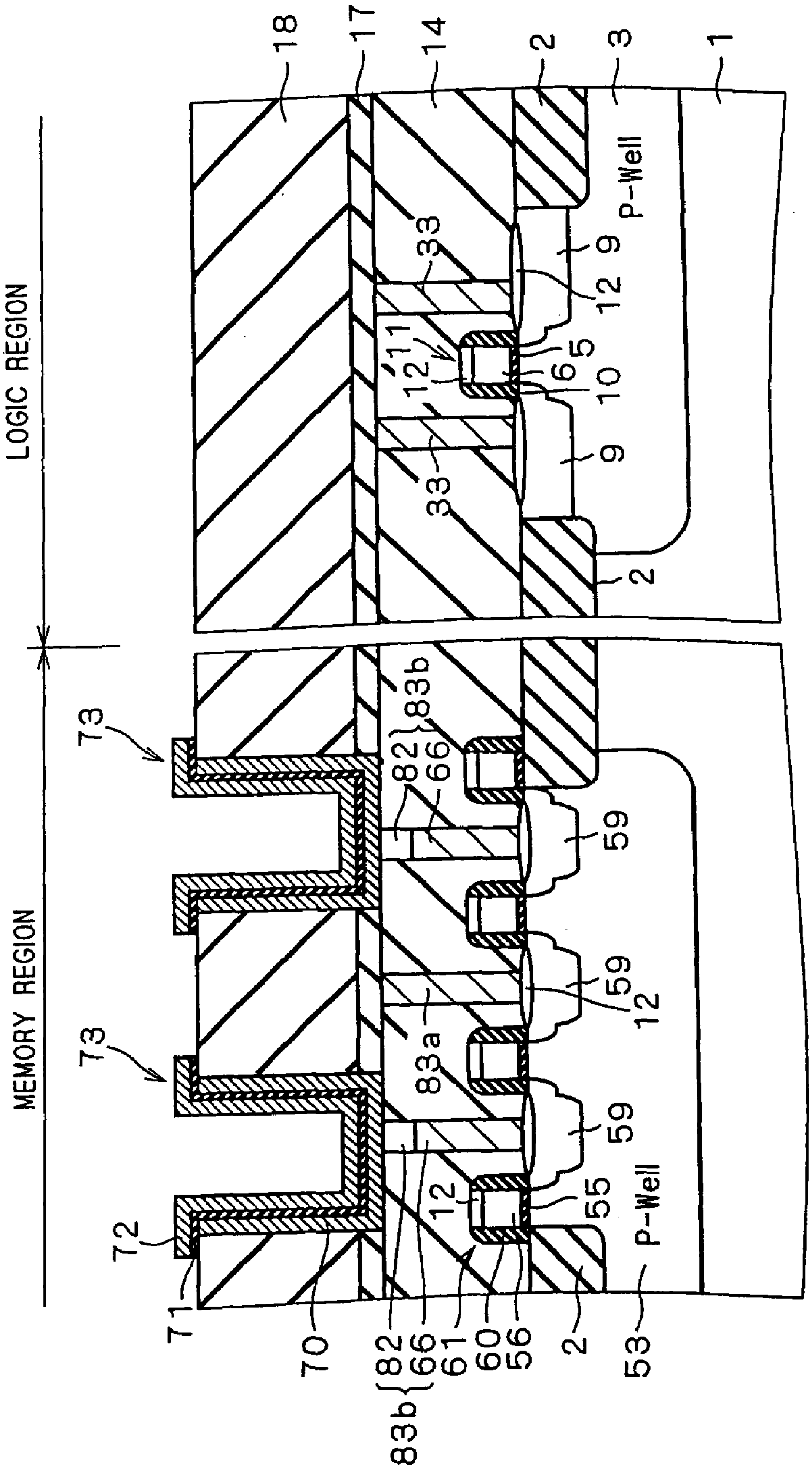

Next, a dielectric film material formed of, e.g. tantalum oxide ($Ta_2O_5$), aluminum oxide ($Al_2O_3$), or barium strontium titanate (BST), and an upper electrode material of, e.g. ruthenium, titanium nitride, or platinum, are stacked in this order all over the surface, which are patterned using resist. This forms, as shown in FIG. 12, capacitor upper electrodes 72 of, e.g. ruthenium, titanium nitride, or platinum, and capacitor dielectric films 71 of tantalum oxide, aluminum oxide, or barium strontium titanate between the lower electrodes 71 and upper electrodes 72; capacitors 73 are thus completed in the openings 69.

Now, the formation of dielectric films 71 of MIM capacitors 73 uses an MOCVD (Metal Organic CVD) process that uses organic metal material gas. This MOCVD process includes an oxygen adding process involving UV-$O_3$ oxidation or plasma oxidation during the deposition of the dielectric film material, and also includes a lamp anneal process for crystallization in an oxygen atmosphere after the deposition. During the process, produced oxidation species pass through the lower electrodes 70 to reach the contact plugs 83*b*; therefore, in the absence of the conductive barrier layers 82, the conductive films 66 of contact plugs 83*b* will be oxidized. However, in the first preferred embodiment, the conductive barrier layers 82 in the top ends of the contact plugs 83*b* serve as oxidation preventing films, preventing oxidation of the conductive films 66 of contact plugs 83*b* during the formation of the dielectric films 71 of capacitors 73.

Figure 13:
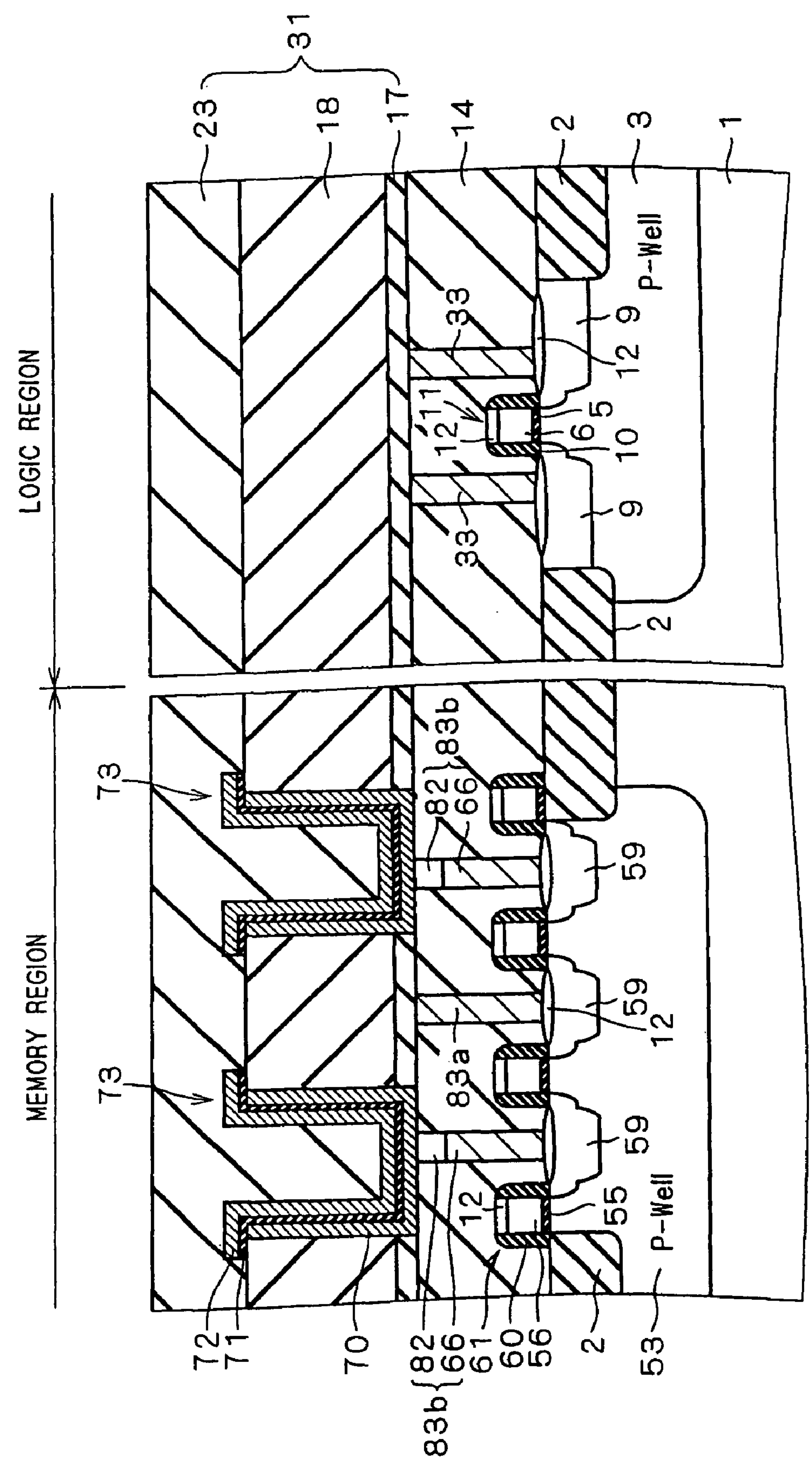

Next, as shown in FIG. 13, an interlayer insulating film 23, e.g. a TEOS film, is formed on the upper electrodes 72 of capacitors 73 and the interlayer insulating film 18 and is then planarized by CMP. Thus, an insulating film 31, which includes the stopper film 17 and interlayer insulating films 18 and 23, is formed on the insulating film 14 and contact plugs 33 and 83*a* and covers the capacitors 73.

Figure 14:
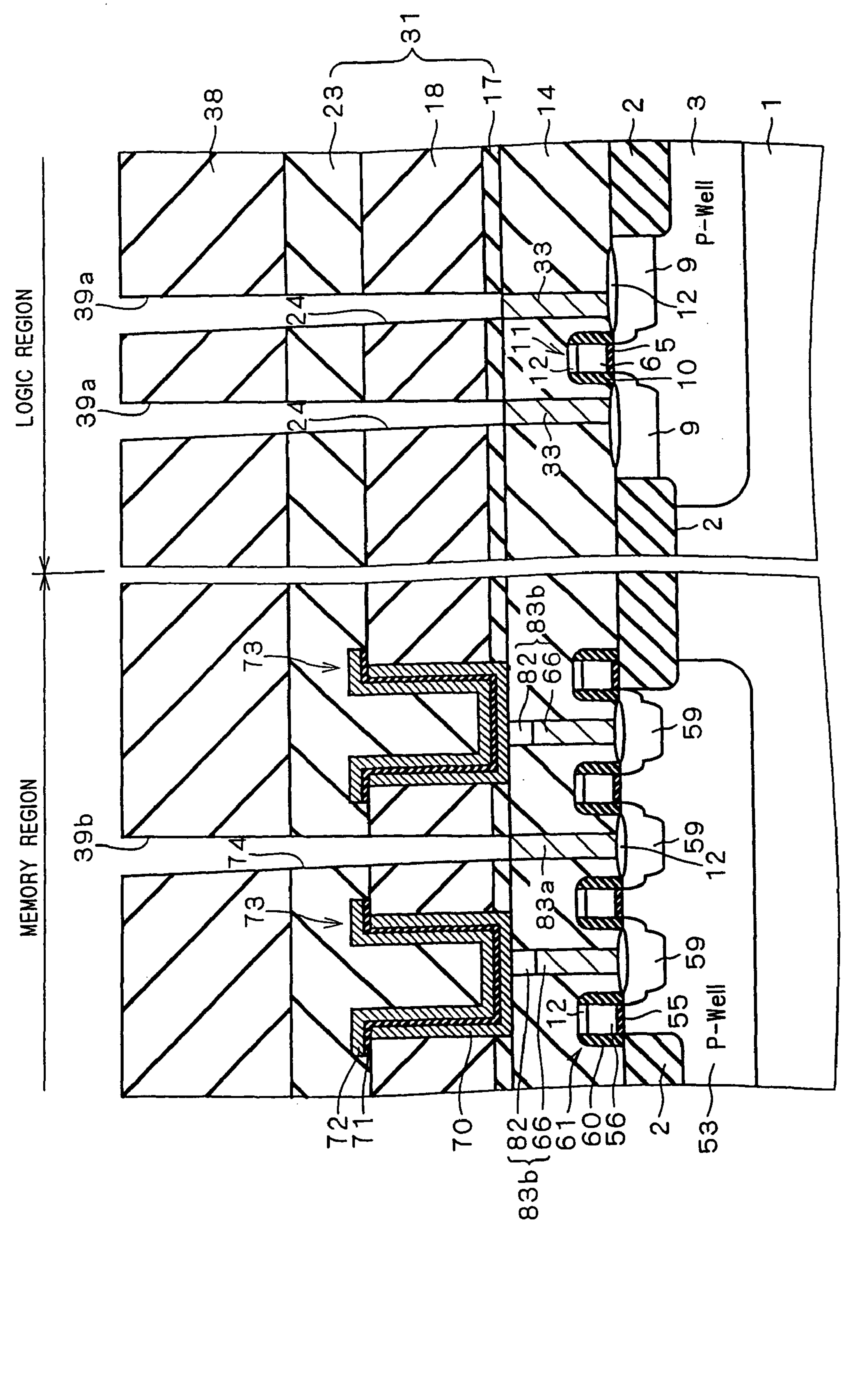

Next, as shown in FIG. 14, a resist 38 is formed on the insulating film 31, with opening patterns 39*a* positioned in correspondence with the contact plugs 33 and an opening pattern 39*b* positioned in correspondence with the contact plug 83*a*. Then, using the resist 38 as a mask, the interlayer insulating films 18 and 23 are partially etched and removed away using the stopper film 17 as an etching stopper. This etching adopts an anisotropic dry-etching process using a mixed gas of $C_4F_6$, $O_2$, and Ar. Then, using the resist 38 as a mask again, the exposed parts of the stopper film 17 are etched away. This etching adopts an anisotropic dry-etching process using $CHF_3$ as the etching gas.

Contact holes 24 are thus formed in the insulating film 31 to respectively reach the contact plugs 33 and a contact hole 74 is formed to reach the contact plug 83*a*.

Figure 15:
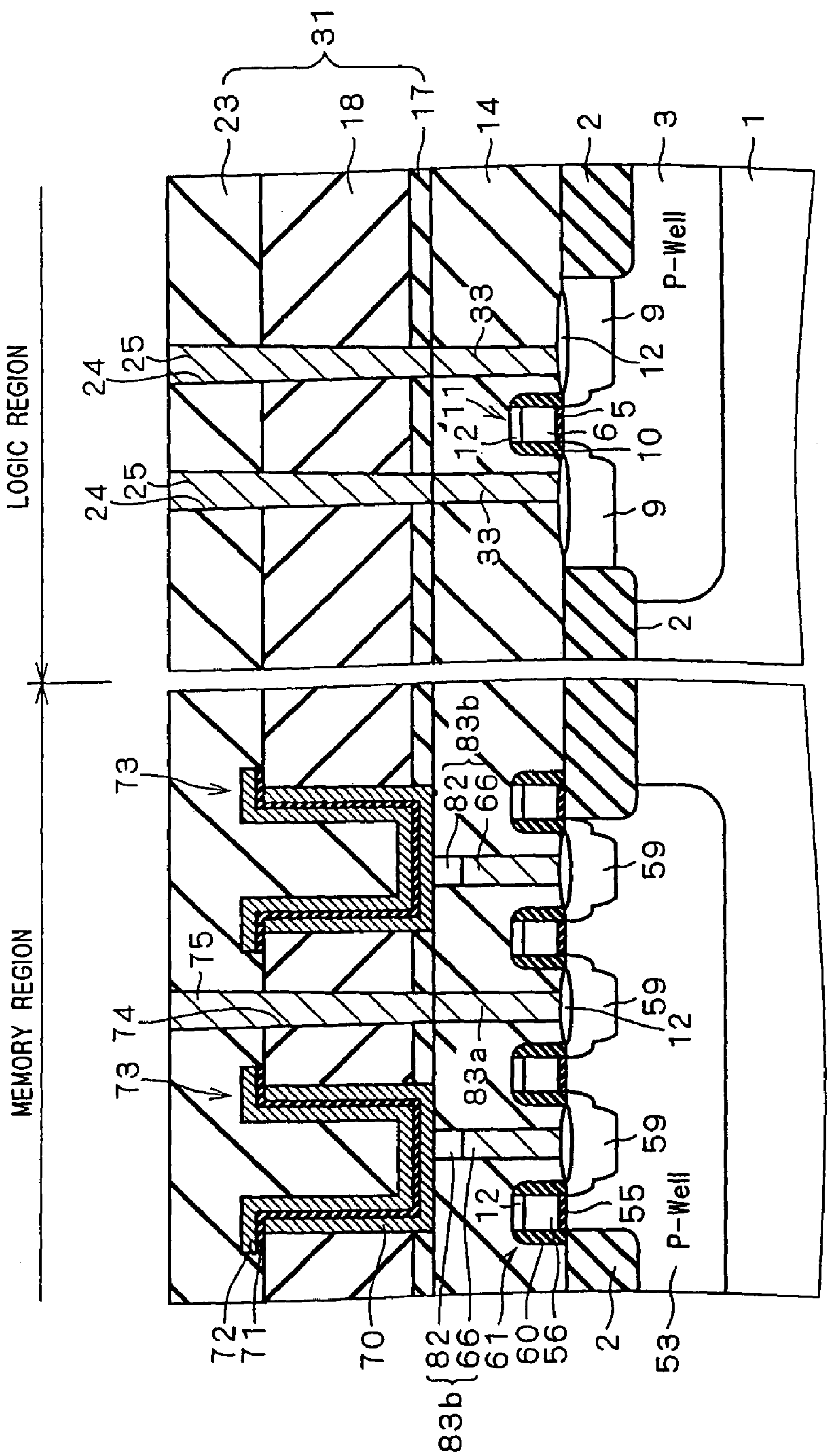

Next, the resist 38 is removed, and a refractory metal film of, e.g. tungsten, is formed all over the surface to fill the contact holes 24 and 74. Then, the refractory metal film on the top surface of the insulating film 31 is removed, e.g. by CMP. Thus, as shown in FIG. 15, contact plugs 25 of refractory metal which fill contact holes 24 are formed in the insulating film 31 in the logic region, with the contact plugs 33 and contact plugs 25 respectively in contact with each other. Also, a contact plug 75 of refractory metal which fills the contact hole 74 is formed in the insulating film 31 in the memory region, with the contact plug 83*a* and contact plug 75 in contact with each other.

Figure 16:
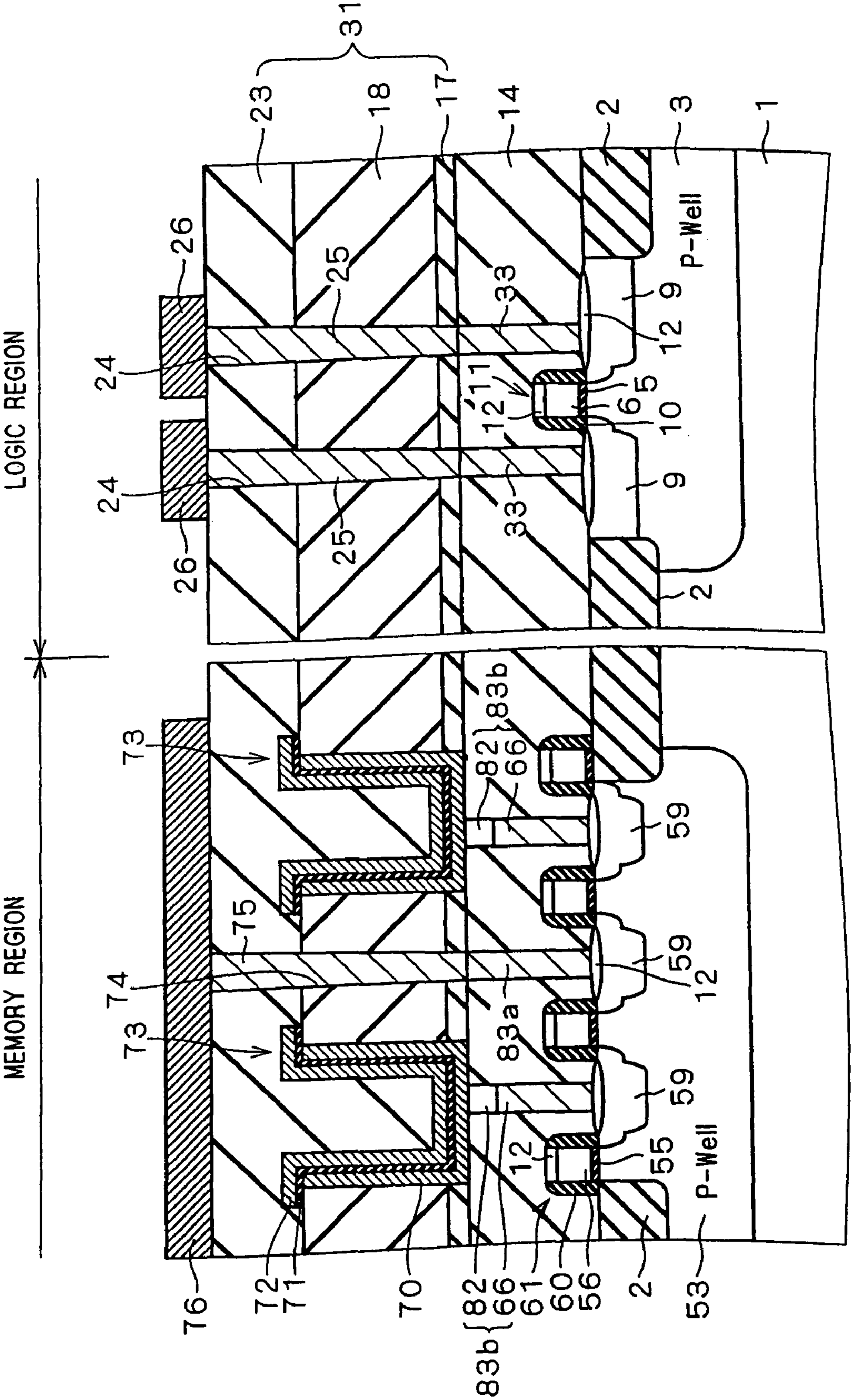

Next, as shown in FIG. 16, interconnections 26, in contact with the contact plugs 25, are formed on the insulating film 31, and a DRAM memory cell bit line 76 in contact with the contact plug 75 is formed on the insulating film 31. The interconnections 26 and bit line 76 may be formed of aluminum interconnections, for example.

Through the process steps shown above, a memory device having concave-type MIM capacitors is formed in the memory region and a logic device with stacked structure is formed in the logic region.

As described so far, according to the semiconductor device manufacturing method of the first preferred embodiment, the oxidation-preventing conductive barrier layers 82 reside in the top ends of the contact plugs 83*b* that are connected with the capacitors 73, which prevent oxidation of the conductive films 66 of the contact plugs 83*b* during formation of the dielectric films 71 of capacitors 73. This reduces the contact resistance between the capacitors 73 and source/drain regions 59. Furthermore, adopting the stacked structure in the logic region avoids inferior contacts due to increased aspect ratios of contact plugs. It is thus possible to achieve both of a reduction in contact resistance in the memory device and a reduction in contact resistance in the logic device, even when oxidation process is performed during formation of the dielectric films 71 of capacitors 73 as described in the first preferred embodiment.

Figure 17:
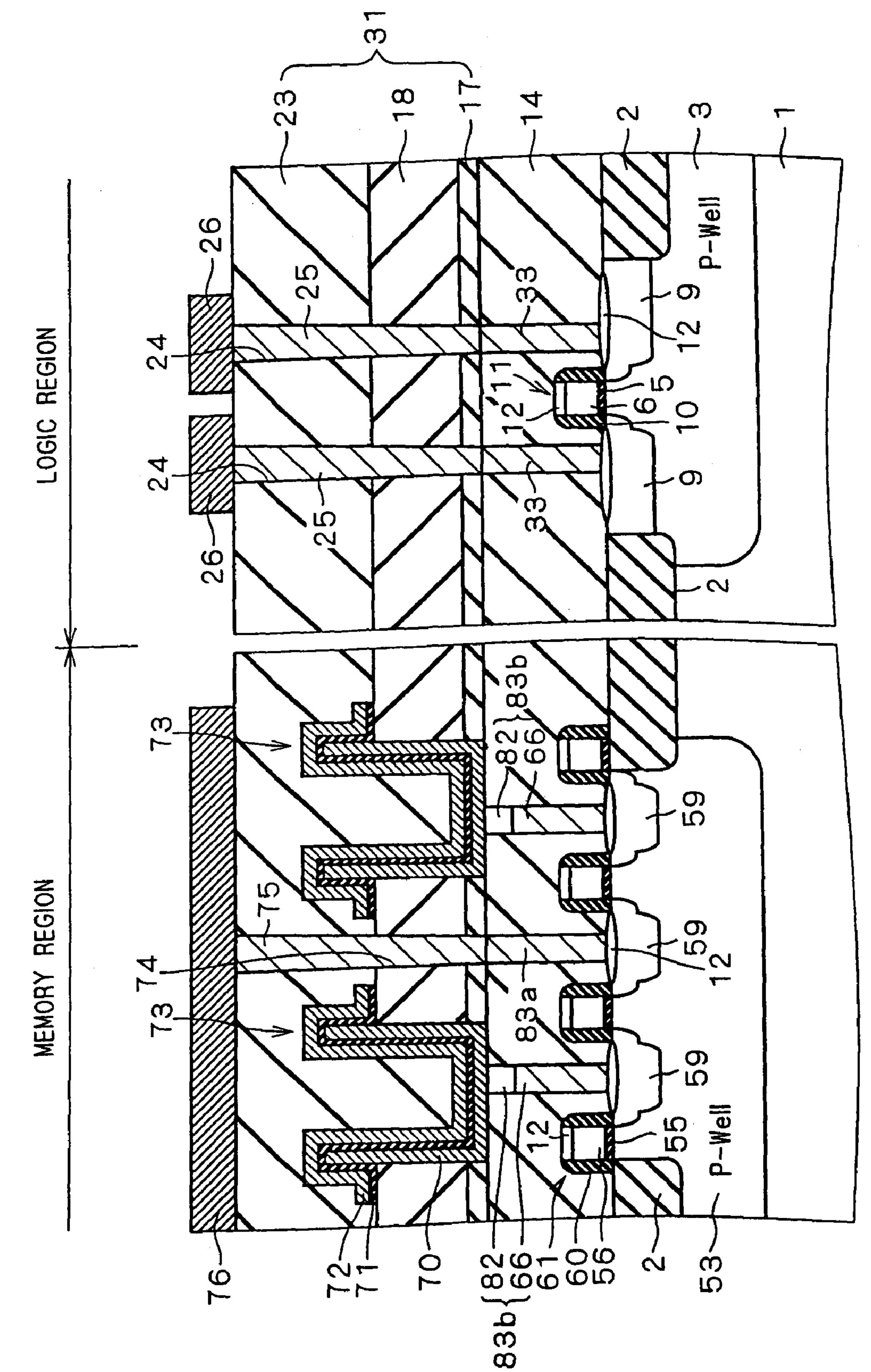
FIGS. 17 to 21 are cross-sectional views showing the structures of semiconductor devices that can be manufactured according to the first preferred embodiment of the invention.
Figure 18:
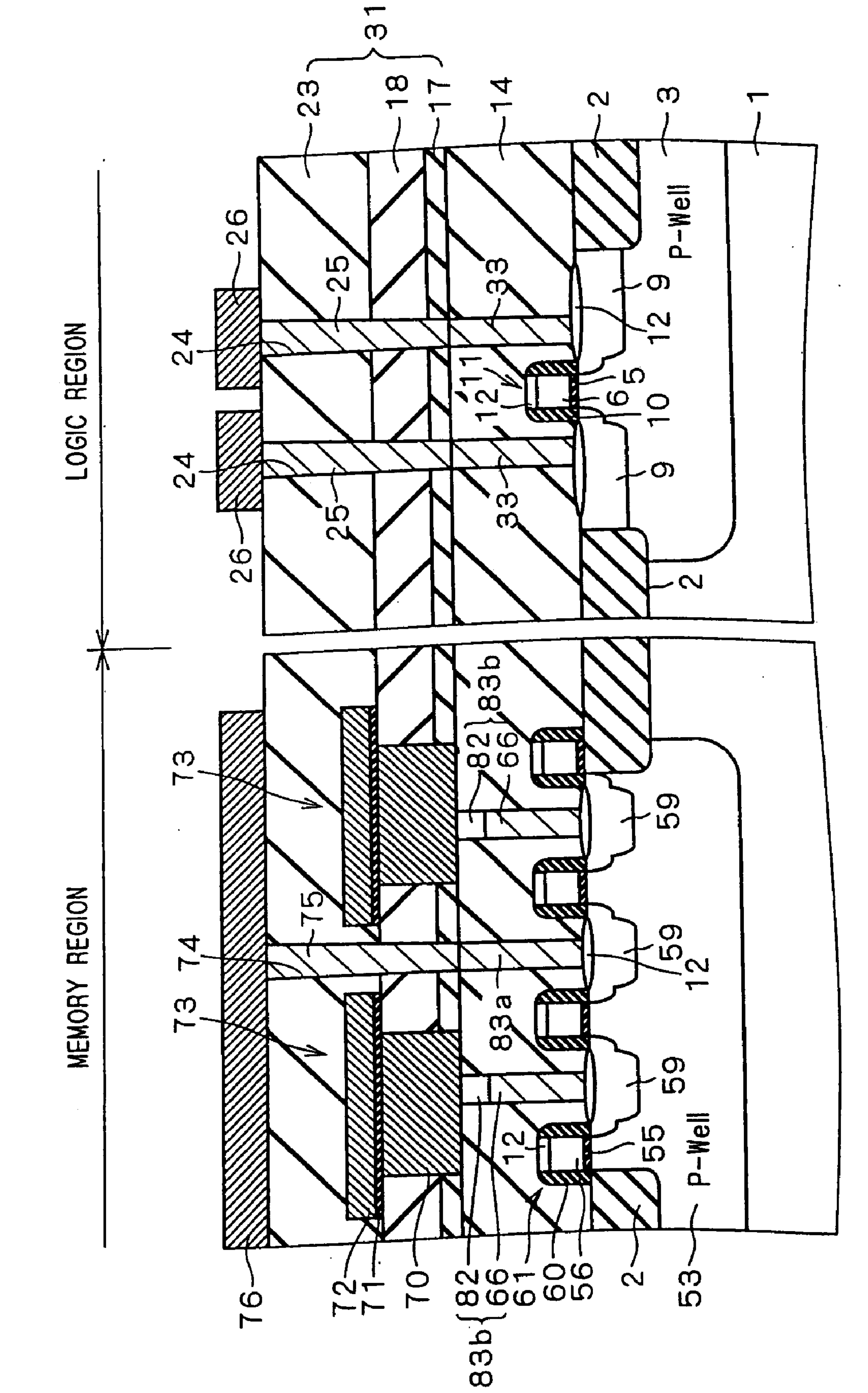
Figure 19:
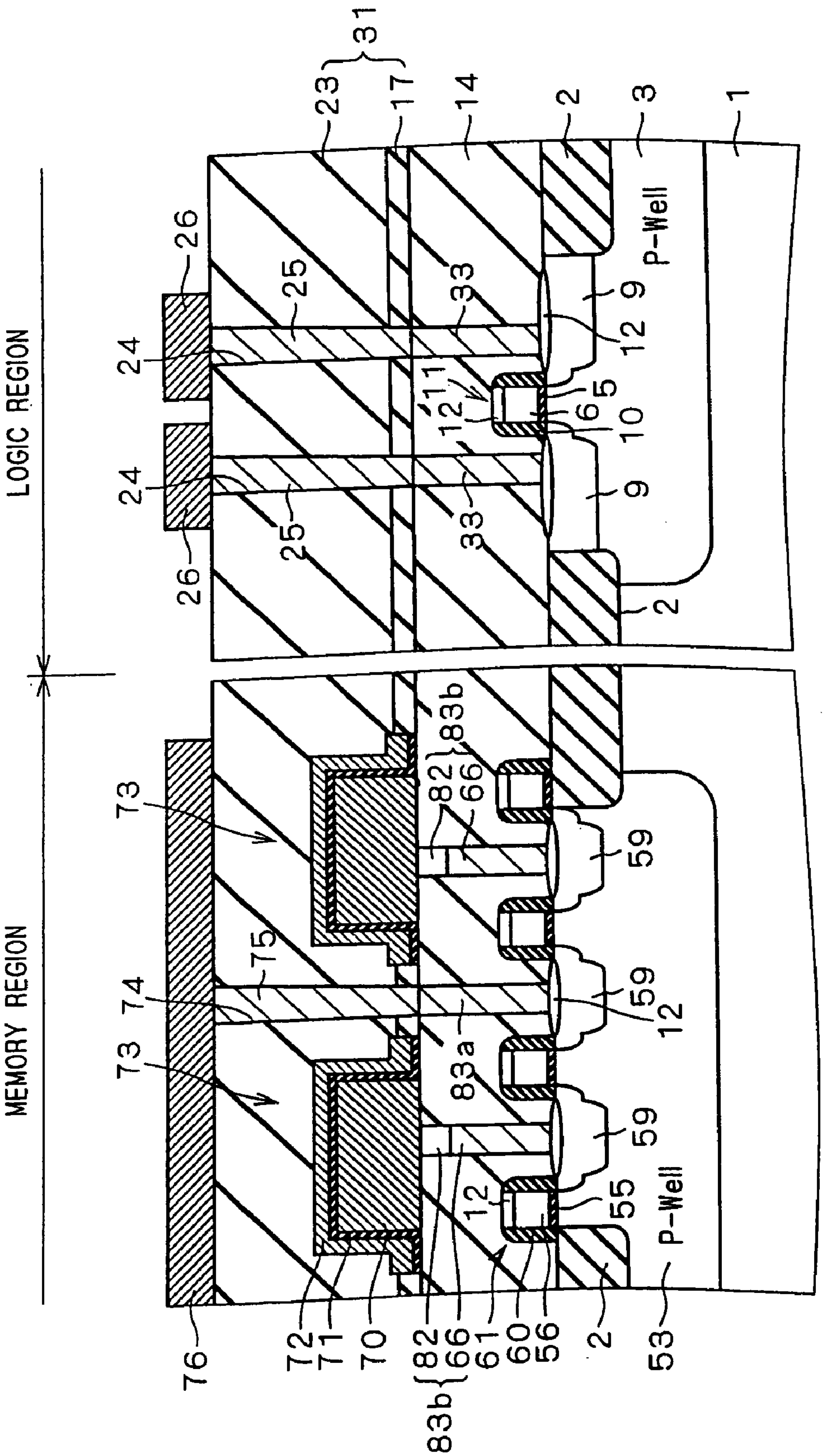

While the first preferred embodiment has shown a method for manufacturing a semiconductor device that has concave-type MIM capacitors as DRAM memory cell capacitors 73, the present invention can be applied also to methods for manufacturing semiconductor devices in which capacitors 73 are MIM capacitors of other structures. For example, the present invention can be applied also to methods for manufacturing semiconductor devices having supported cylinder-type MIM capacitors as shown in FIG. 17, pillar-type MIM capacitors as shown in FIG. 18, and thick-film stacked-type MIM capacitors as shown in FIG. 19.

When supported cylinder-type MIM capacitors are adopted as capacitors 73, the accumulated capacitance can be increased as compared with that of the semiconductor device of the first preferred embodiment. When pillar-type MIM capacitors are adopted or thick-film stacked-type MIM capacitors are adopted, good film formation coverage is obtained during formation of the upper electrodes 72, which lowers the leakage current of capacitors 73 as compared with the semiconductor device of the first preferred embodiment.

Figure 20:
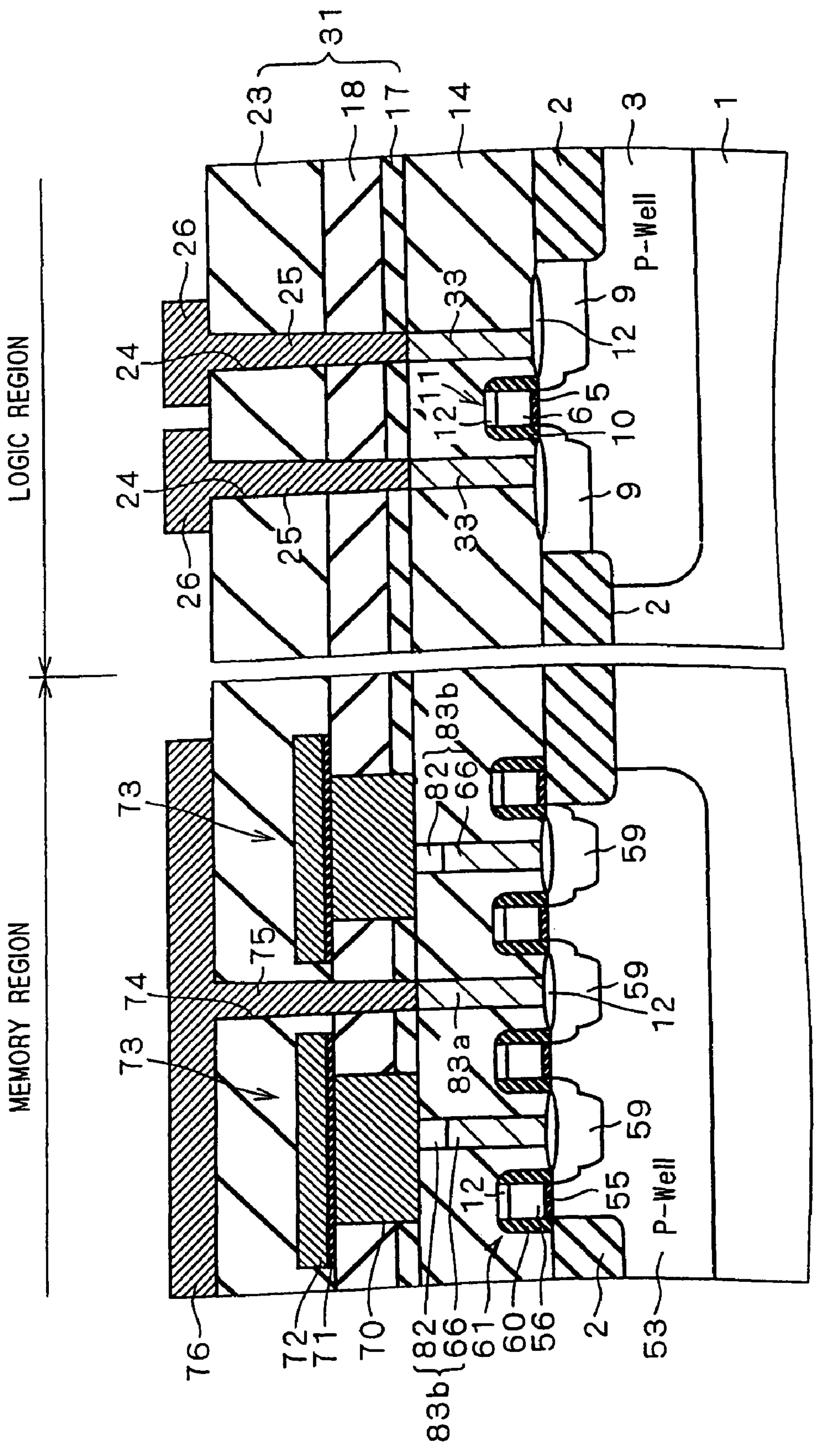
Figure 21:
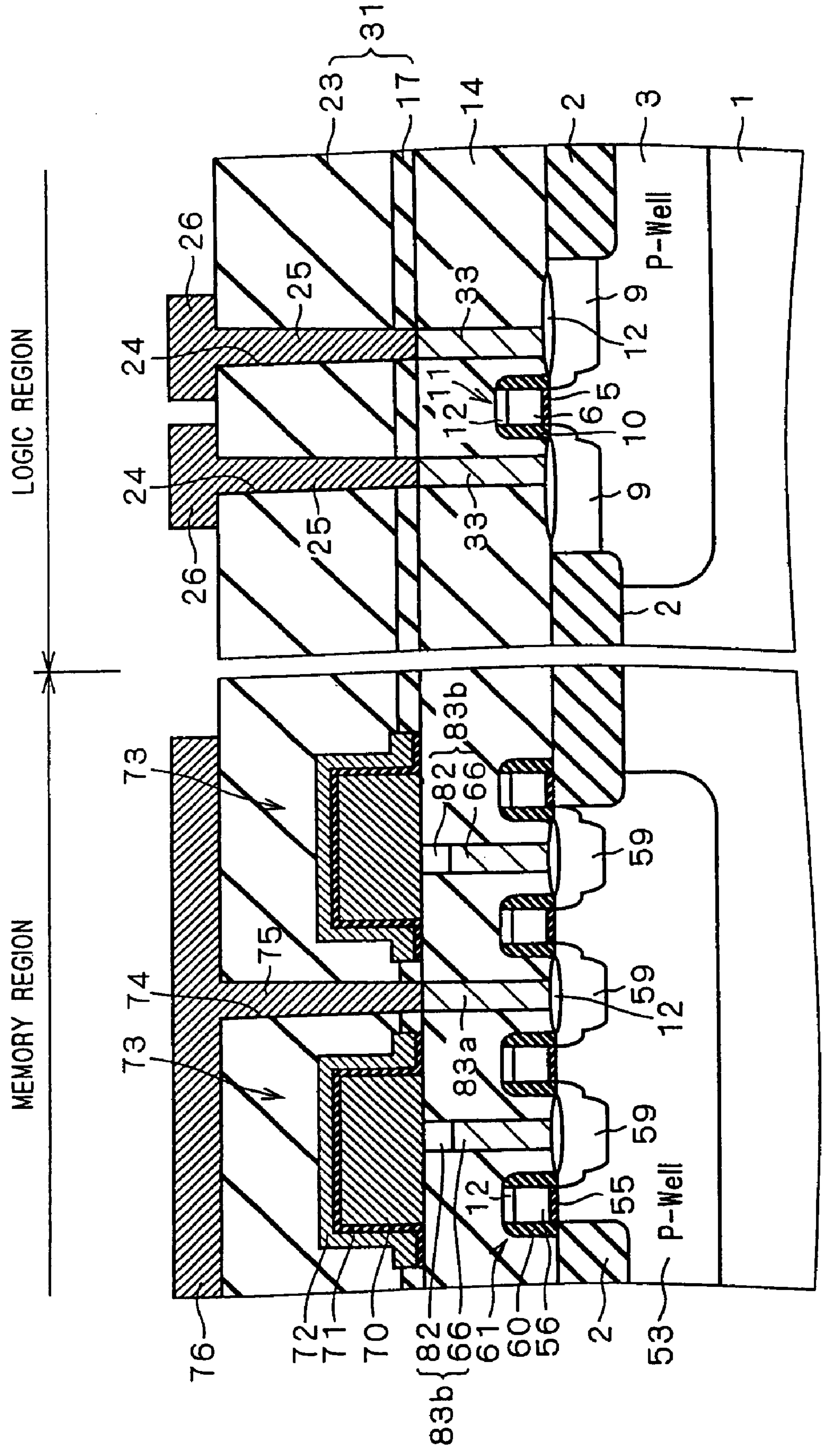

When pillar-type MIM capacitors or thick-film stacked-type MIM capacitors are adopted, the aspect ratios of the contact plugs 25, 75 can be smaller. Therefore, as shown in FIGS. 20 and 21, the contact plugs 25 and interconnections 26, or the contact plug 75 and bit line 76 may be integrally formed using dual damascene process.

When thick-film stacked-type MIM capacitors are adopted, the interlayer insulating film 18 in the insulating film 31 is removed during the manufacturing process. Therefore FIGS. 19 and 21 do not show it.

While the first preferred embodiment uses a mixed gas of $C_4F_6$, $O_2$, and Ar to etch the insulating film 14 and interlayer insulating films 18 and 23, a mixed gas of $C_5F_8$ or $C_4F_6$, $O_2$, and Ar may be used.

Second Preferred Embodiment

The first preferred embodiment provides the conductive barrier layers 82 in the top ends of the contact plugs 83*b* that are connected to capacitors 73. However, during the formation of the dielectric films 71 of capacitors 73, not only the contact plugs 83*b* but also the neighboring contact plug 83*a* in the memory region may be oxidized.

Accordingly, a second preferred embodiment describes a manufacturing method in which conductive barrier layer 82 is formed also in the top end of the contact plug 83*a* that is electrically connected to the DRAM memory cell bit line 76.

Figure 22:
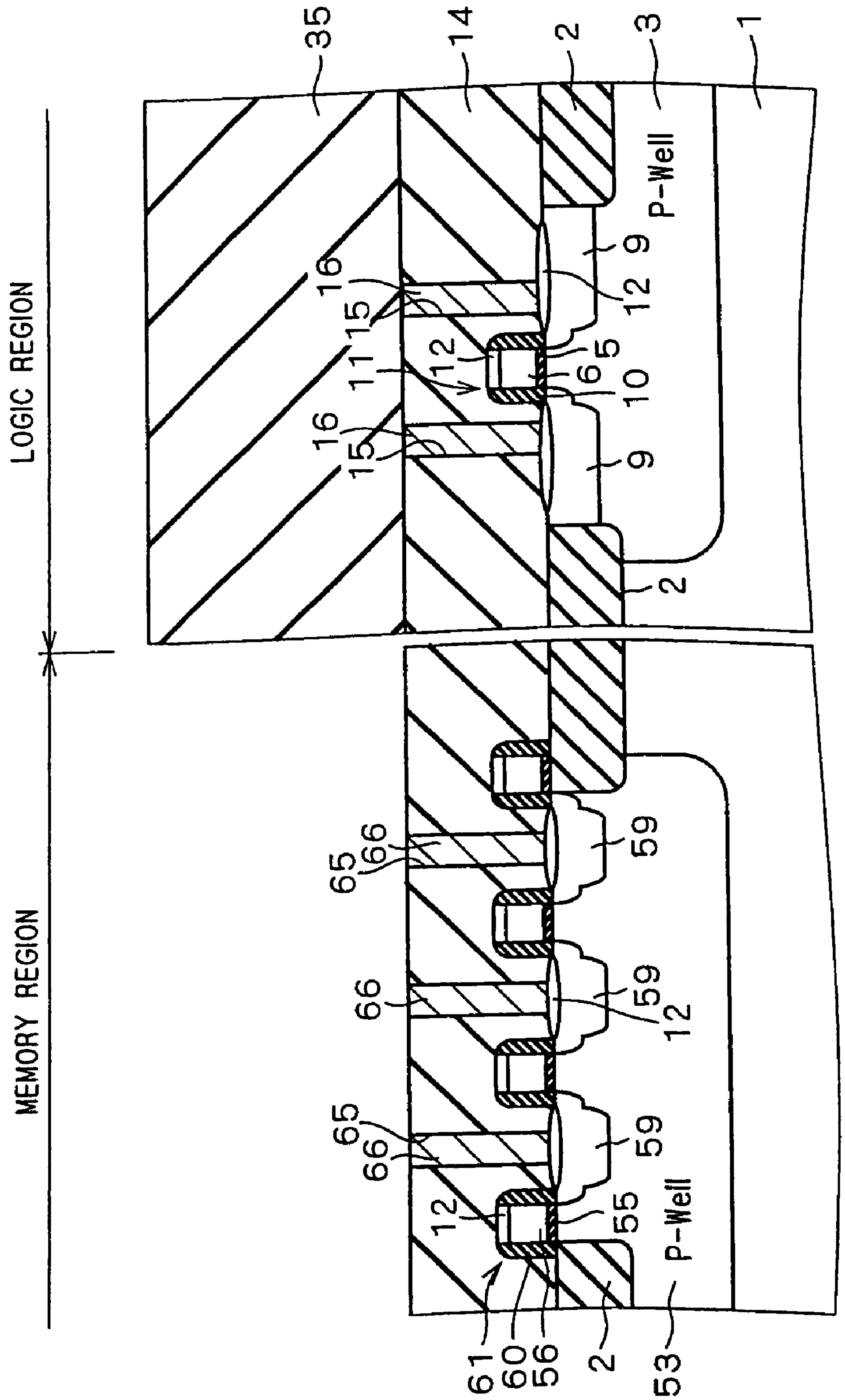
Figure 23:
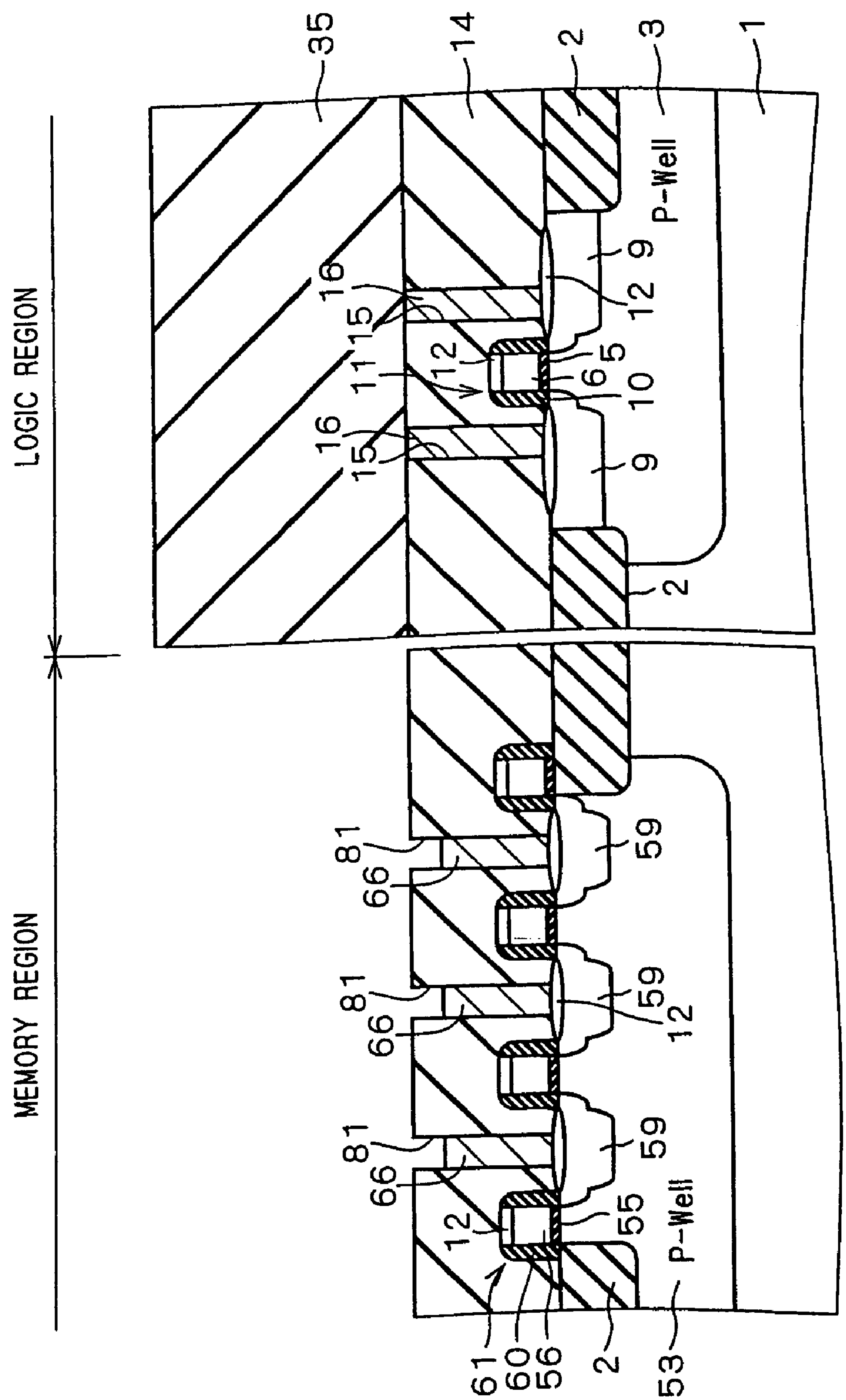

FIGS. 22 to 30 are cross-sectional views showing a sequence of process steps for manufacturing a semiconductor device according to the second preferred embodiment of the invention. First, the structure shown in FIG. 4 is obtained according to the manufacturing process of the first preferred embodiment. Then, as shown in FIG. 22, resist 35 adapted for i-line exposure is formed all over the surface, and an opening pattern that opens the memory region is formed in the resist 35 by photolithography using i-line as the light source. Then, as shown in FIG. 23, the exposed part is etched using the resist 35 as a mask to selectively remove the top ends of the conductive films 66 that are to be electrically connected to capacitors 73 and the top end of the conductive film 66 that is to be electrically connected to the bit line 76. Recesses 81 are thus formed in the insulating film 14 in the memory region. This etching adopts an anisotropic dry-etching process using $SF_6$ as the etching gas.

In the second preferred embodiment, unlike in the first preferred embodiment, an opening pattern that opens the entire memory region is formed in the resist 35, since it is not necessary to resist-mask the conductive film 66 electrically connected to the bit line 76. Therefore the second preferred embodiment can adopt i-line-exposure-adapted resist 35 that is less expensive than the excimer-exposure-adapted resist 30 used in the first preferred embodiment. It is therefore possible to use less expensive exposure apparatus to form the opening pattern in the resist 35 than in the first preferred embodiment.

Figure 24:
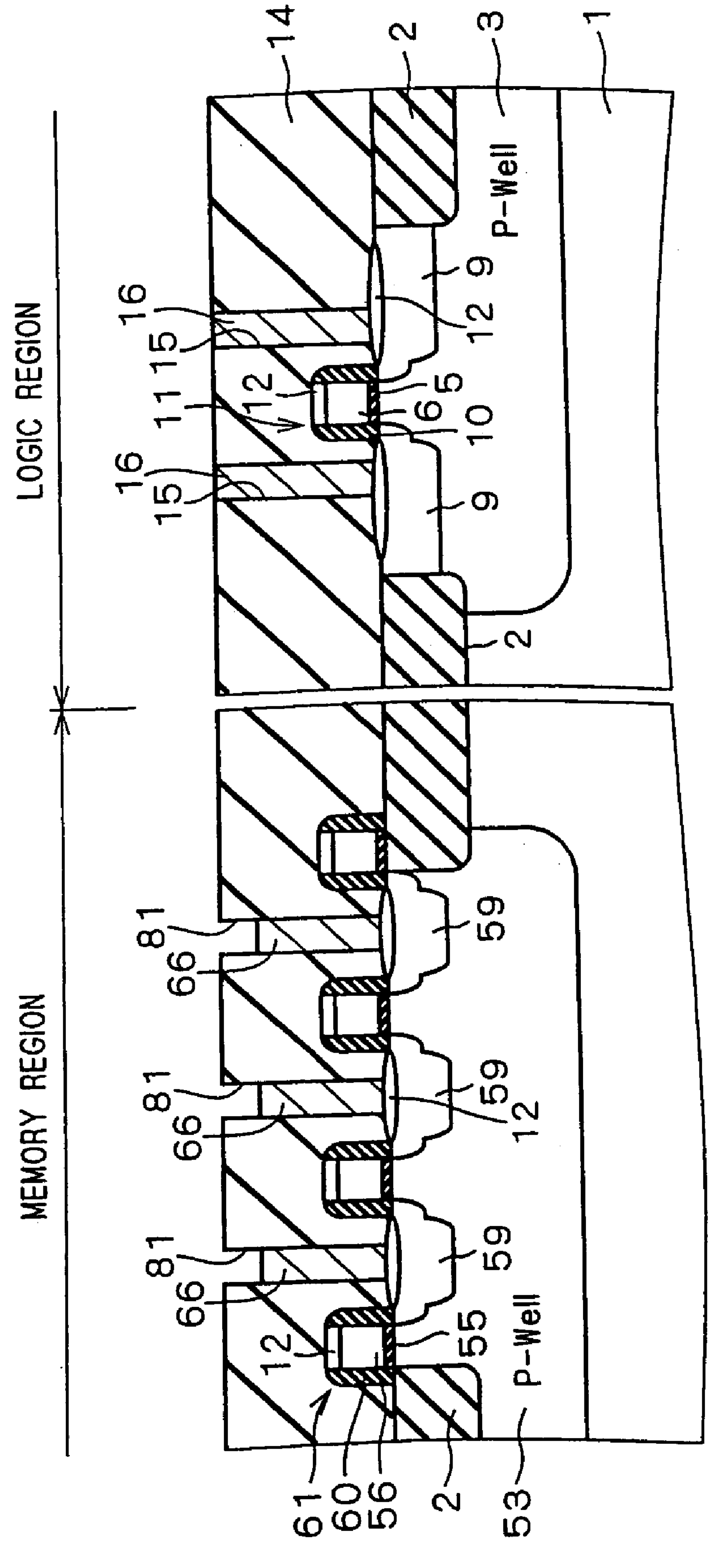

Next, as shown in FIG. 24, the resist 35 used as a mask is removed. Then, a barrier layer material of, e.g. titanium nitride, tantalum nitride, or titanium silicide nitride, is formed all over the surface to fill the recesses 81, and the barrier layer material above the recesses 81 is removed, e.g. by CMP. Thus, as shown in FIG. 25, conductive barrier layers 82 filling the recesses 81 are formed in the insulating film 14.

These process steps form a contact plug 83*a* and contact plugs 83*b* in the insulating film 14 in the memory region; the contact plug 83*a* is electrically connected to one of adjacent source/drain regions 59 and has the conductive barrier layer 82 in the top portion and the conductive film 66 in the remaining portion, and the contact plugs 83*b* are electrically connected to others of adjacent source/drain regions 59 and each have the conductive barrier layer 82 in the top portion and the conductive film 66 in the remaining portion. In the logic region, contact plugs 33 of conductive film 16 are formed in the insulating film 14.

Figure 26:
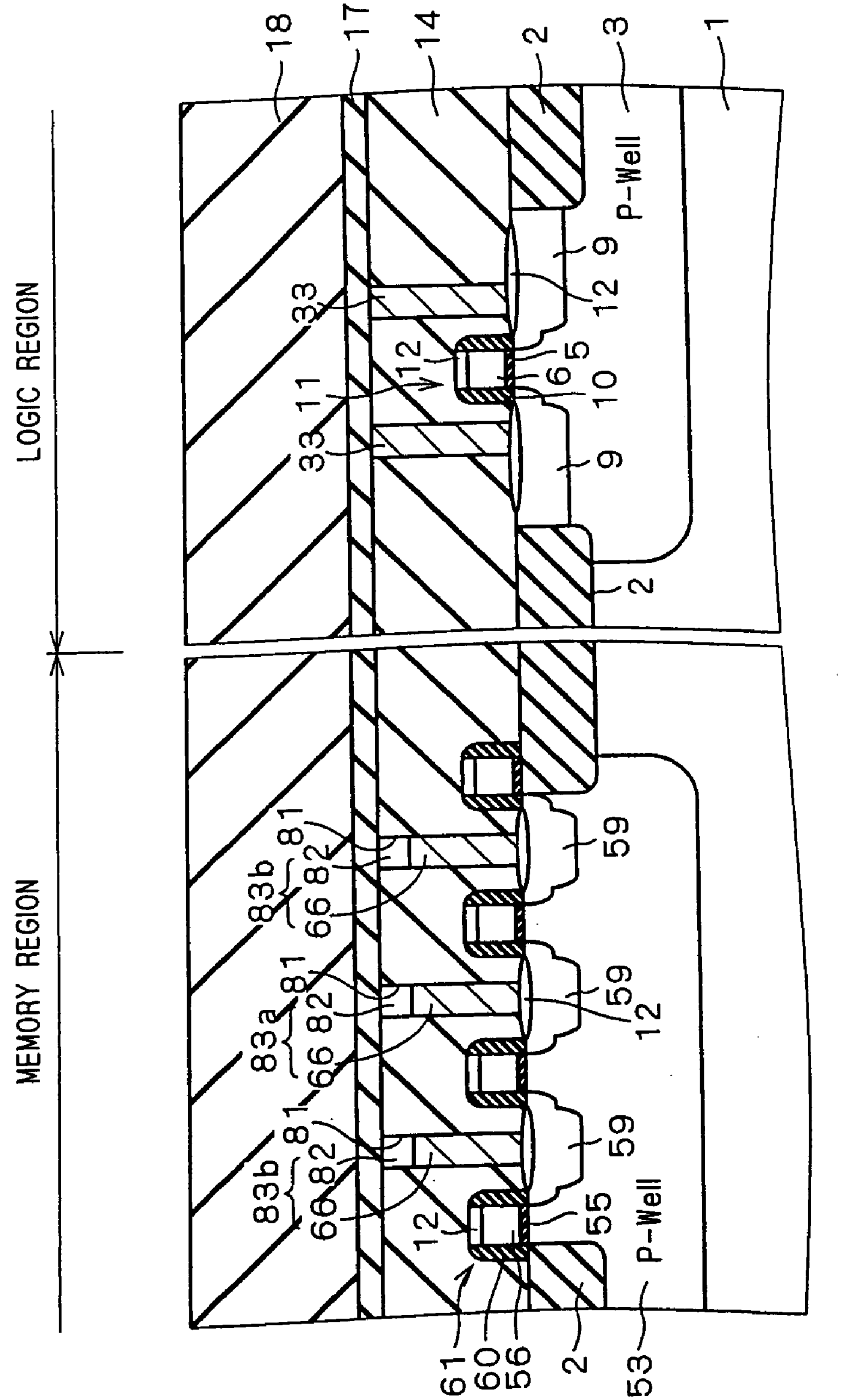
Figure 27:
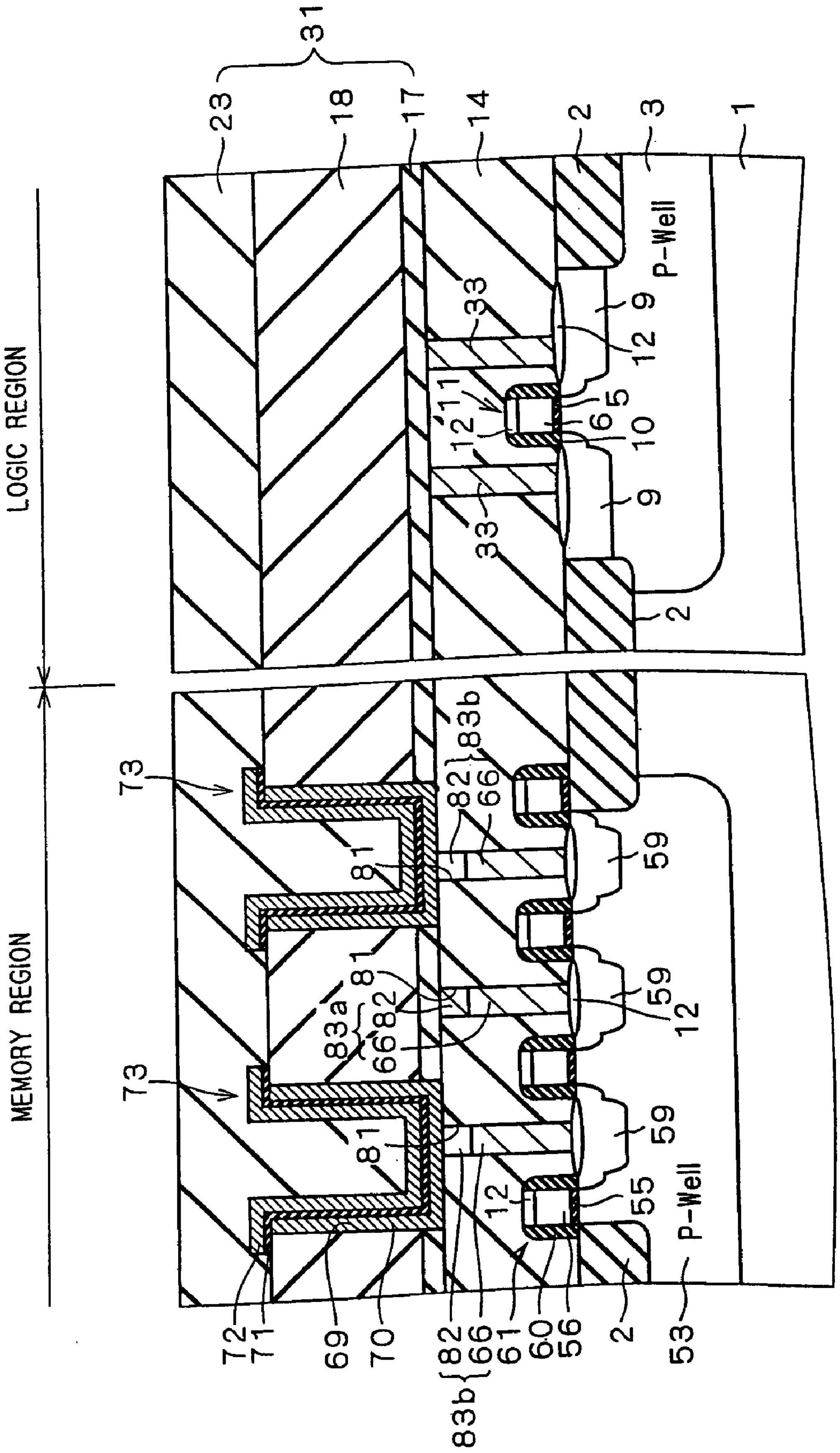

Next, as shown in FIG. 26, stopper film 17 and interlayer insulating film 18 are deposited in this order on the insulating film 14 and contact plugs 33, 83*a* and 83*b*. Then, as shown in FIG. 27, as in the first preferred embodiment, openings 69, capacitors 73, and interlayer insulating film 23 are sequentially formed. The capacitors 73 shown in FIG. 27 are concave-type MIM capacitors.

Figure 28:
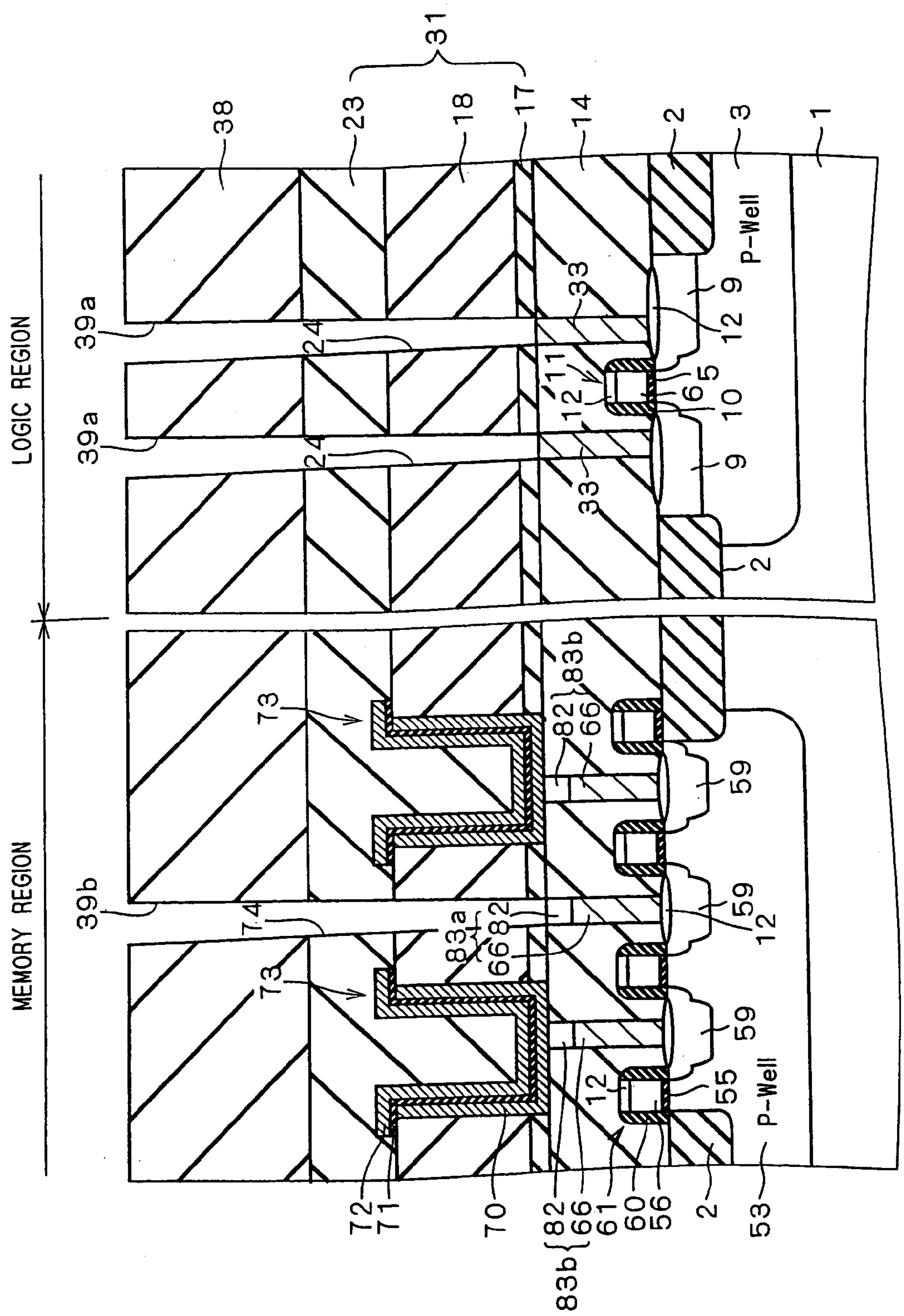

Next, as shown in FIG. 28, resist 38 having opening patterns 39*a* and 39*b* is formed on the insulating film 31. The interlayer insulating films 18 and 23 and stopper film 17 are etched and removed away using the resist 38 as a mask. This process forms contact holes 24 respectively reaching the contact plugs 33 and a contact hole 74 reaching the conductive barrier layer 82 of the contact plug 83*a* in the insulating film 31.

Figure 29:
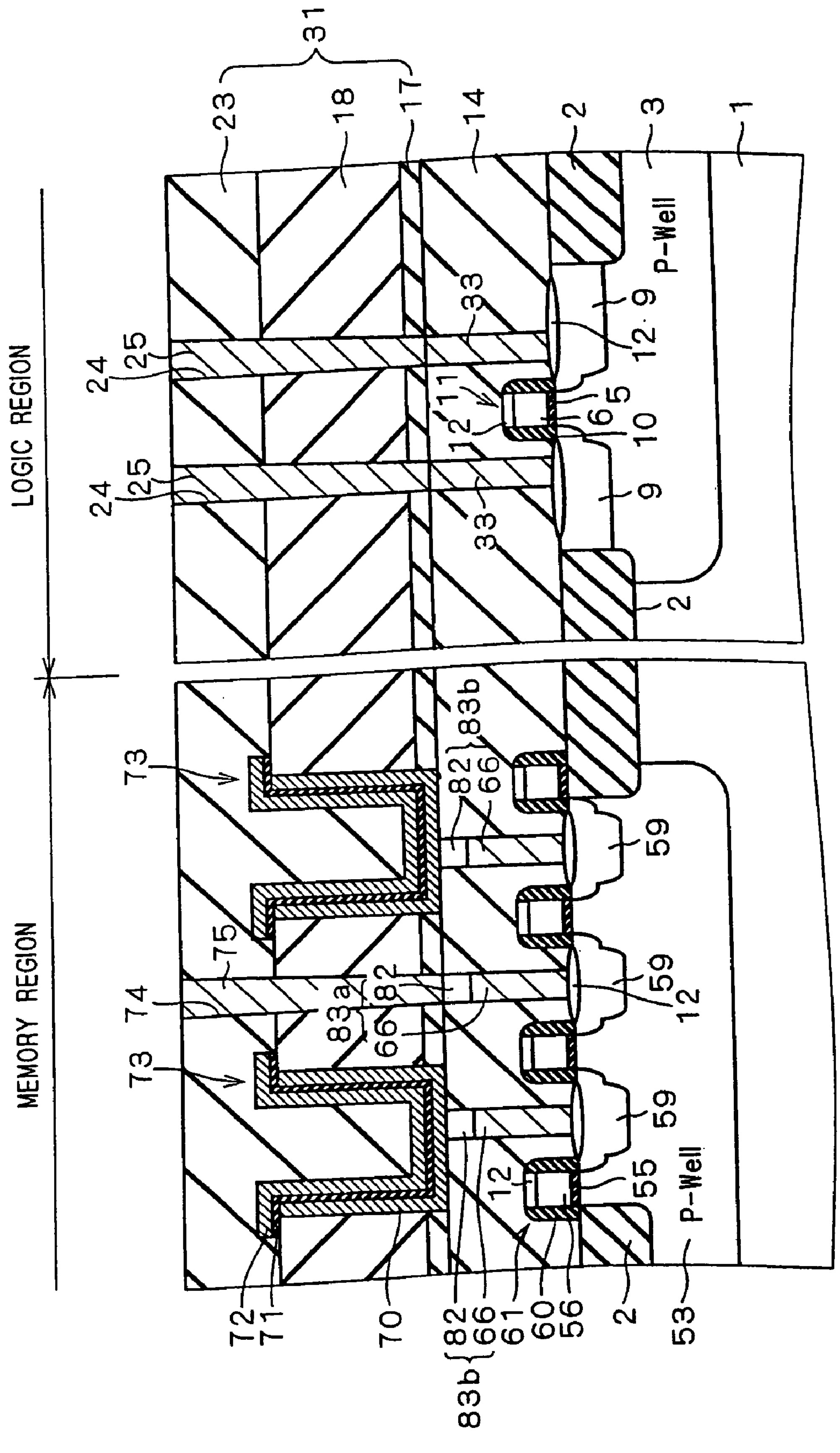

Next, after removal of resist 38, as shown in FIG. 29, contact plugs 25 filling the contact holes 24 and contact plug 75 filling the contact hole 74 are formed. Thus the contact plugs 33 and contact plugs 25 are in contact respectively with each other and the conductive barrier layer 82 of the contact plug 83*a* and the contact plug 75 are in contact with each other.

Figure 30:
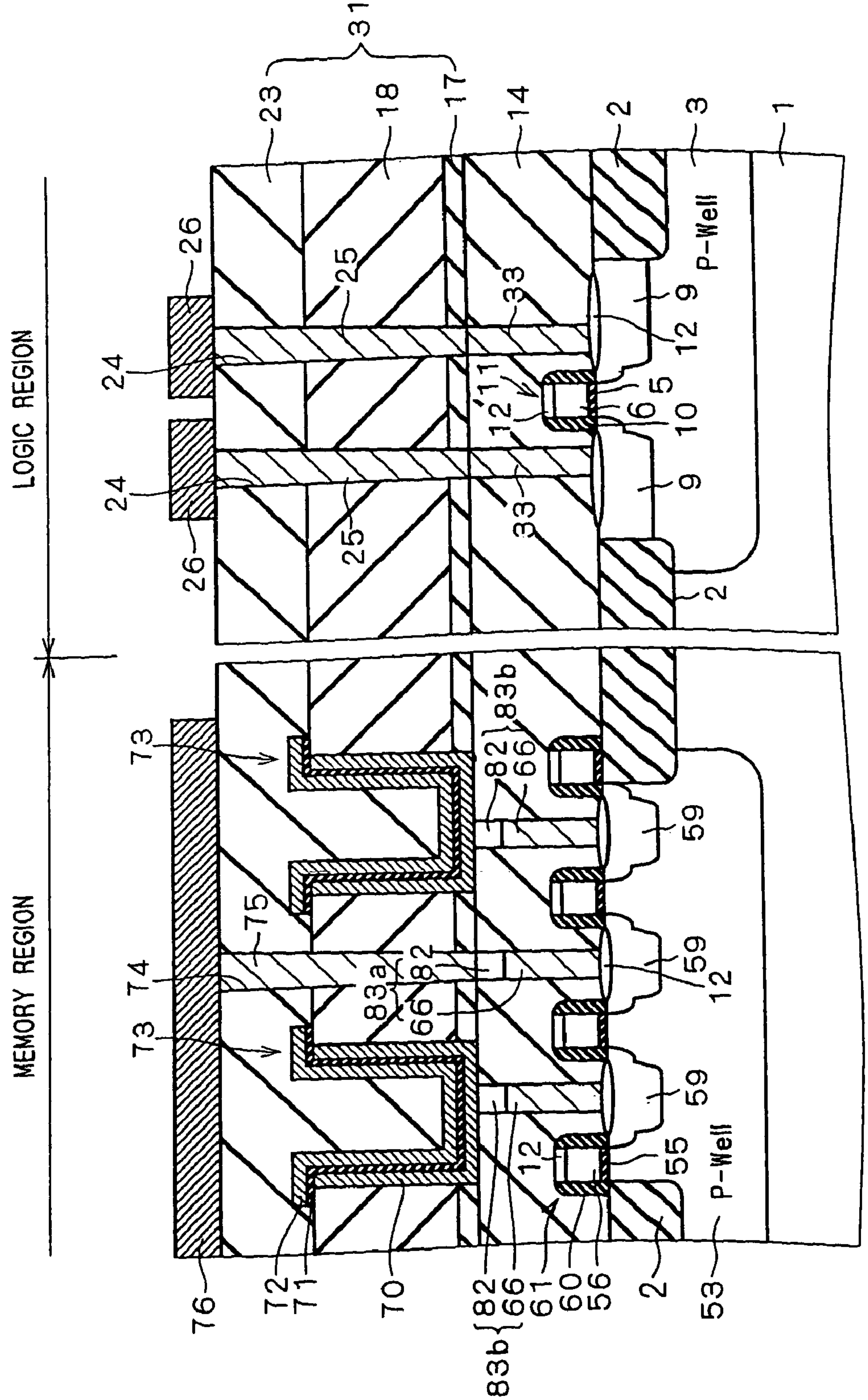

Next, as shown in FIG. 30, interconnections 26 and bit line 76 are formed on the insulating film 31.

Thus, a memory device is formed in the memory region and a logic device is formed in the logic region.

As described above, according to the semiconductor device manufacturing method of the second preferred embodiment, the oxidation-preventing conductive barrier layers 82 are formed not only in the top ends of the contact plugs 83*b* connected to the capacitors 73 but also in the top end of the contact plug 83*a* electrically connected to the bit line 76 and contact plug 75. Therefore the conductive film 66 of the contact plug 83*a* is not oxidized during formation of the dielectric films 71 of capacitors 73. This reduces the contact resistance between the bit line 76 or contact plug 75 and the source/drain regions 59.

Figure 31:
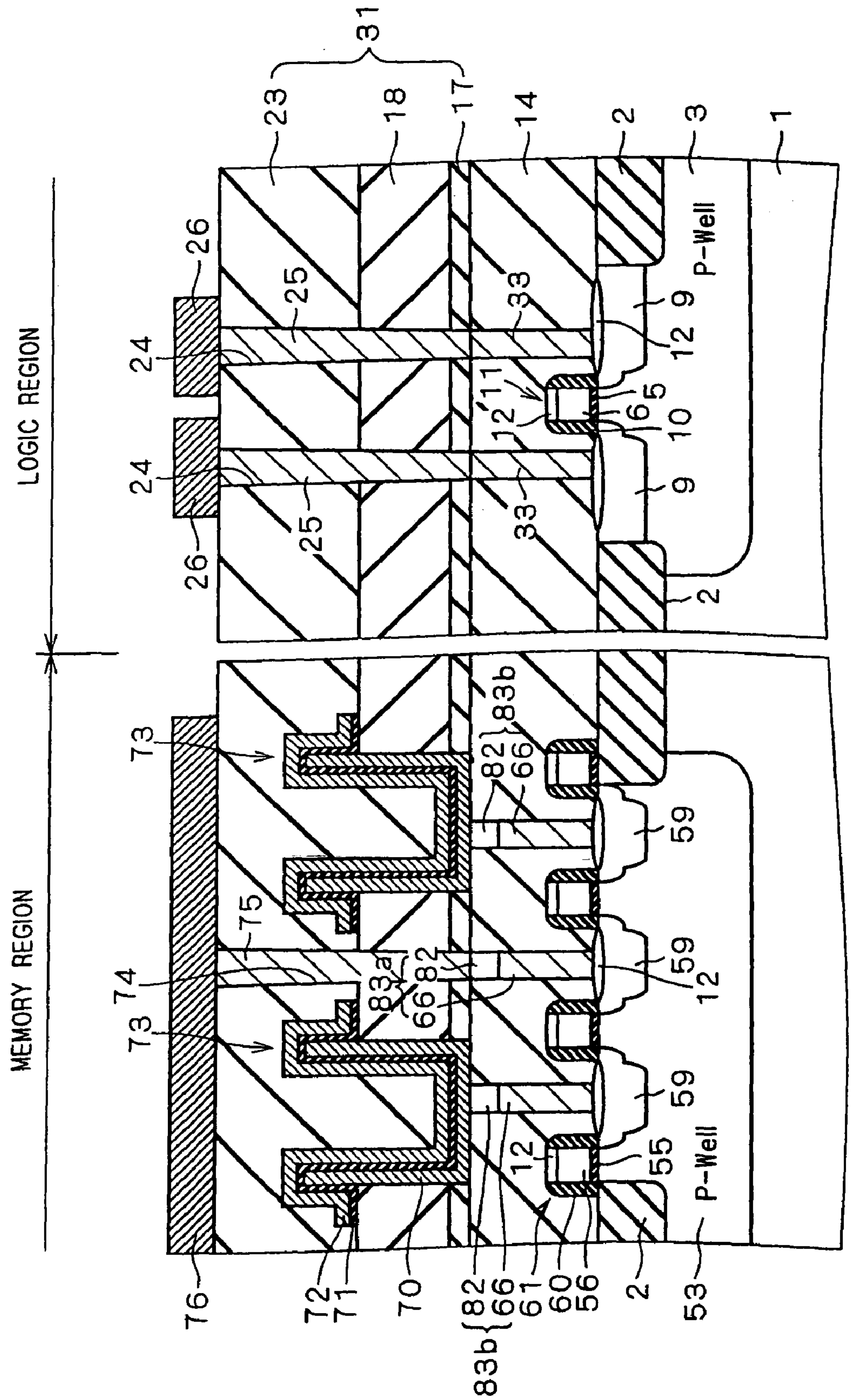
Figure 33:
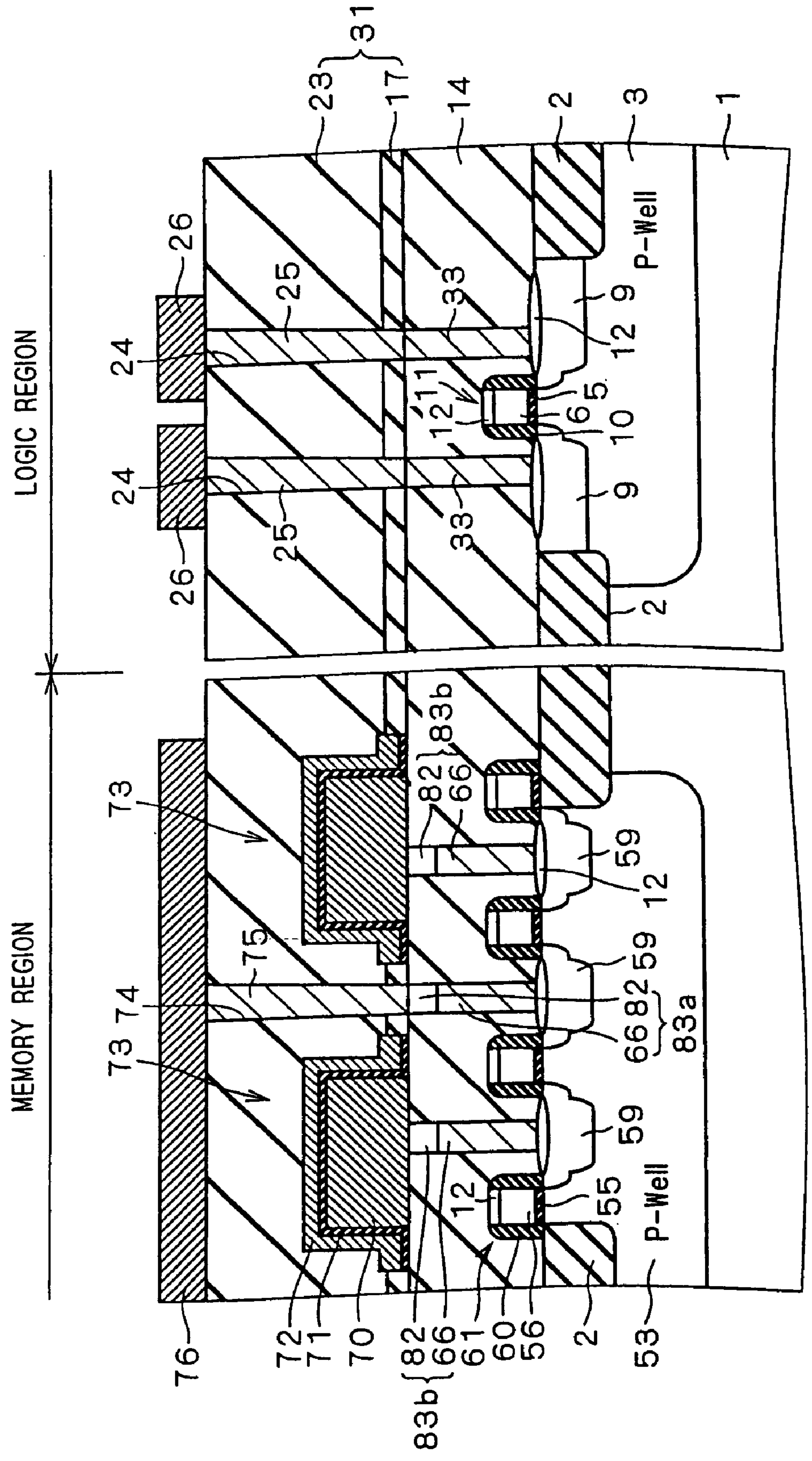

The second preferred embodiment has shown a method for manufacturing a semiconductor device that has concave-type MIM capacitors as DRAM memory cell capacitors 73. However, as has been mentioned in the first preferred embodiment, the present invention can be applied also to methods for manufacturing semiconductor devices in which capacitors 73 are MIM capacitors with other structures. For example, the present invention can be applied also to methods for manufacturing semiconductor devices having supported cylinder-type MIM capacitors as shown in FIG. 31, pillar-type MIM capacitors as shown in FIG. 32, and thick-film stacked-type MIM capacitors as shown in FIG. 33.

Figure 34:
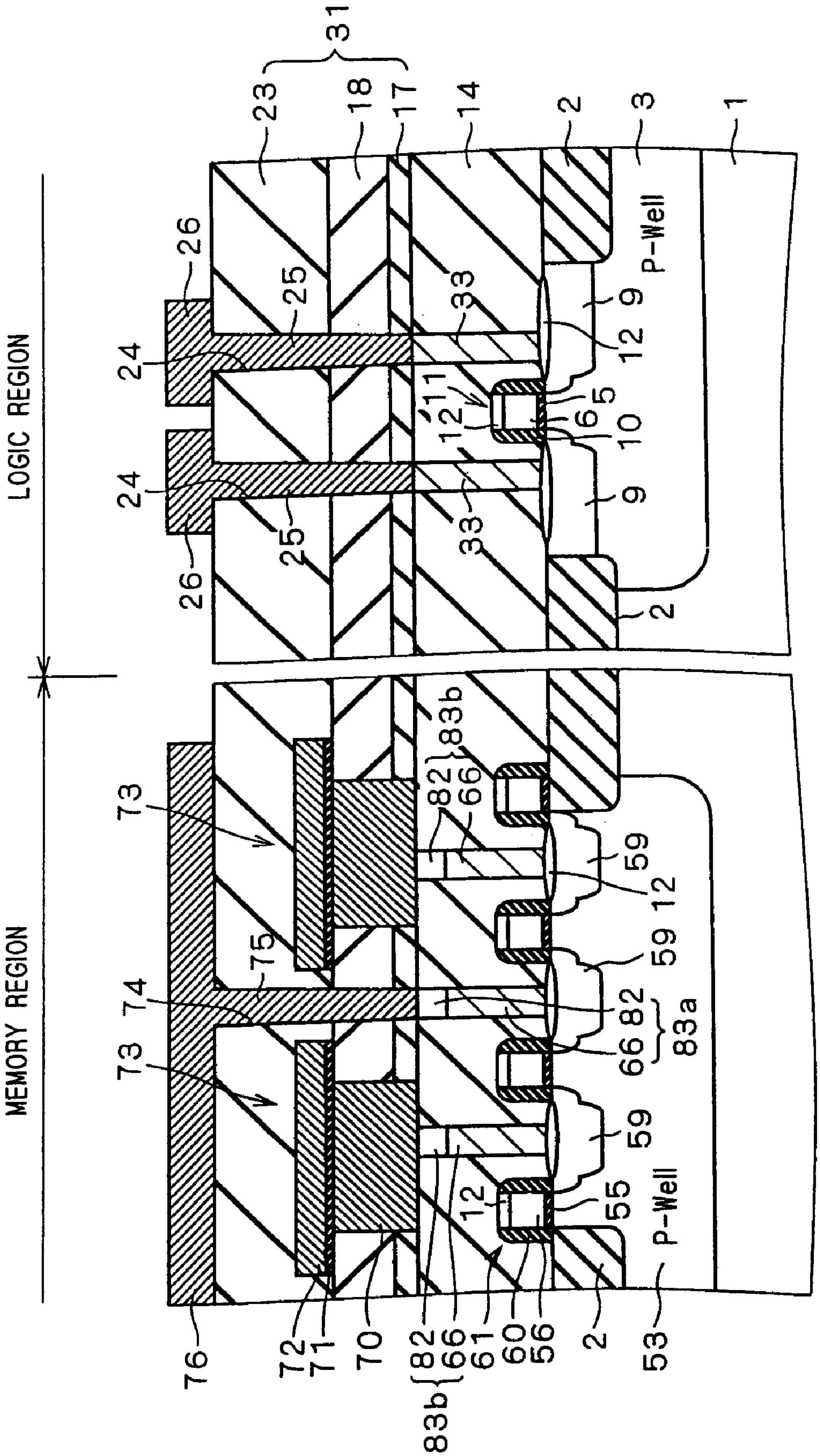

When pillar-type MIM capacitors or thick-film stacked-type MIM capacitors are adopted, the aspect ratios of contact plugs 25, 75 can be smaller. Therefore, as shown in FIGS. 34 and 35, the contact plugs 25 and interconnections 26, or the contact plug 75 and bit line 76 may be integrally formed using dual damascene process.

When thick-film stacked-type MIM capacitors are adopted, the interlayer insulating film 18 in the insulating film 31 is removed during the manufacturing process. Therefore FIGS. 33 and 35 do not show it.

Third Preferred Embodiment

The second preferred embodiment provides the conductive barrier layers 82 in the top ends of the contact plugs 83*a* and 83*b* in the memory region. However, during formation of the dielectric films 71 of capacitors 73, the contact plugs 33 in the logic region may also be oxidized, as well as those in the memory region.

Therefore a third preferred embodiment describes a manufacturing method in which conductive barrier layers are formed also in the top ends of the contact plugs 33 in the logic region.

FIGS. 36 to 42 are cross-sectional views showing a sequence of process steps of the semiconductor device manufacturing method of the third preferred embodiment. First, the structure shown in FIG. 4 is obtained according to the manufacturing process of the first preferred embodiment. Then, as shown in FIG. 36, without using resist, the entire surface is etched to selectively remove the top ends of the conductive films 66 in the memory region and the top ends of the conductive films 16 in the logic region. Thus, recesses 81 are formed in the insulating film 14 in the memory region and recesses 41 are formed in the insulating film 14 in the logic region. This etching adopts an anisotropic dry-etching process using $SF_6$ as the etching gas.

Next, a barrier layer material of, e.g. titanium nitride, tantalum nitride, or titanium silicide nitride, is formed all over the surface to fill the recesses 41 and 81, and the barrier layer material above the recesses 41 and 81 is removed, e.g. by CMP. Thus, as shown in FIG. 37, conductive barrier layers 82 filling the recesses 81 are formed in the insulating film 14 in the memory region. Also, conductive barrier layers 42 of titanium nitride, tantalum nitride, or titanium silicide nitride filling the recesses 41 in the logic region are formed in the insulating film 14.

These process steps form a contact plug 83*a* and contact plugs 83*b* in the insulating film 14 in the memory region; the contact plug 83*a* has conductive barrier layer 82 in the top end and each contact plugs 83*b*, too, has conductive barrier layer 82 in the top end. In the logic region, contact plugs 33 having conductive barrier layers 42 in their top ends and conductive films 16 in the remaining portions are formed in the insulating film 14. Like the conductive barrier layers 82, the conductive barrier layers 42 have lower conductivity than the conductive films 16 and 66.

Figure 38:
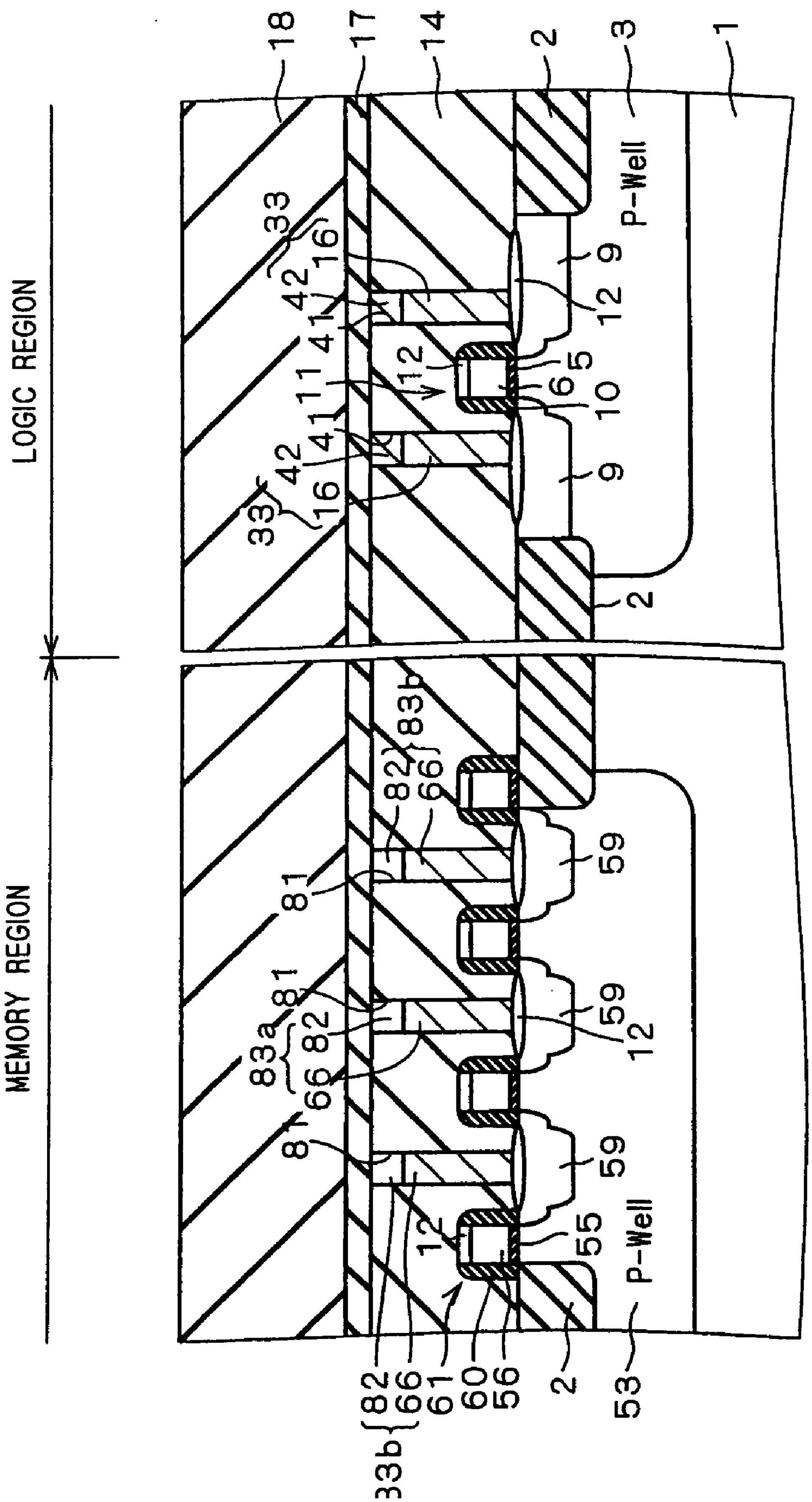
Figure 39:
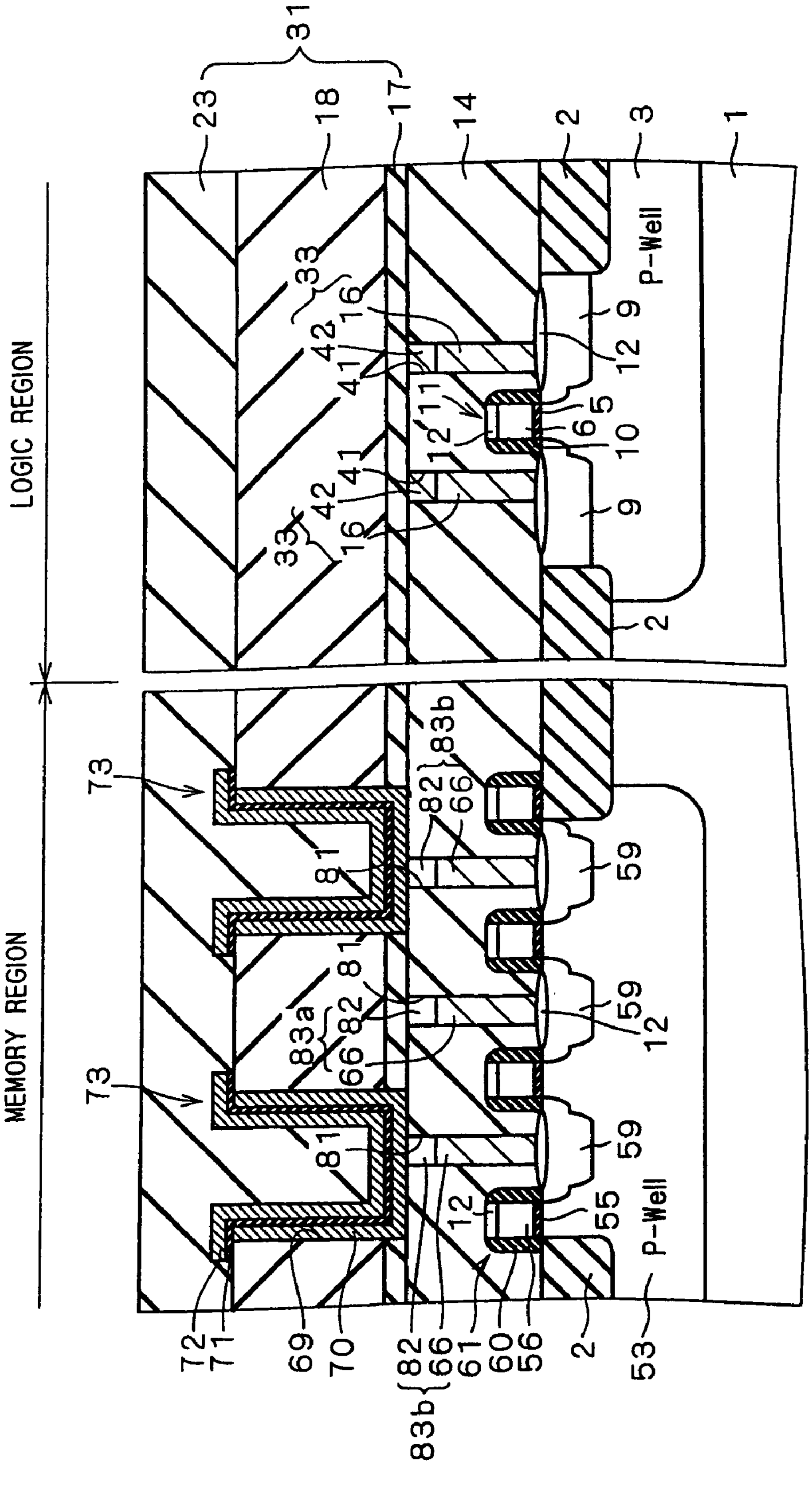

Next, as shown in FIG. 38, stopper film 17 and interlayer insulating film 18 are deposited in this order on the insulating film 14 and contact plugs 33, 83*a* and 83*b*. Then, as shown in FIG. 39, as in the first preferred embodiment, openings 69, capacitors 73, and interlayer insulating films 23 are sequentially formed. The capacitors 73 shown in FIG. 39 are concave-type MIM capacitors.

Figure 40:
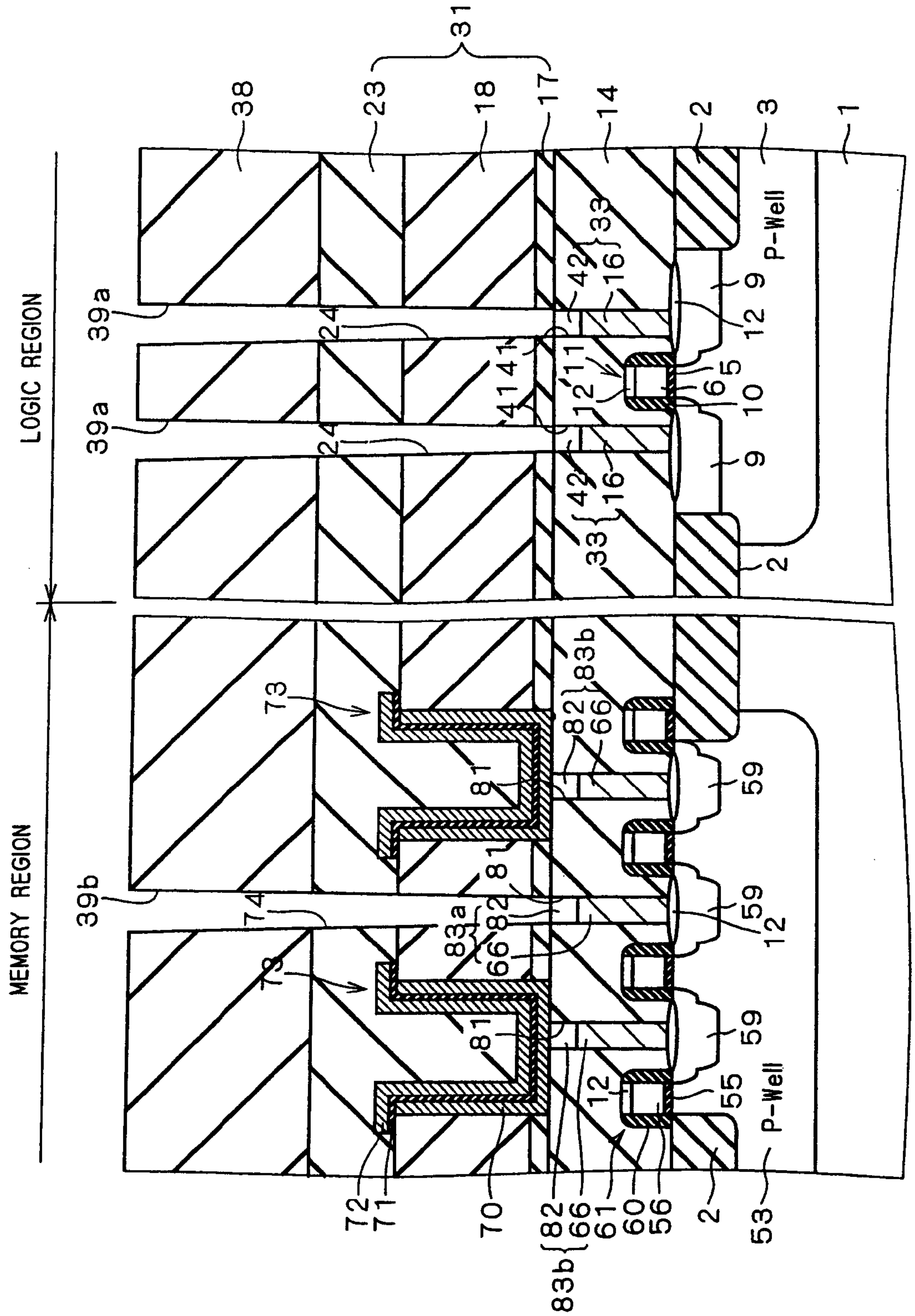

Next, as shown in FIG. 40, resist 38 having opening patterns 39*a* and 39*b* is formed on the insulating film 31. The interlayer insulating films 18 and 23 and stopper film 17 are etched and removed away using the resist 38 as a mask. This process forms contact holes 24 respectively reaching the conductive barrier layers 42 of the contact plugs 33 and a contact hole 74 reaching the conductive barrier layer 82 of the contact plug 83*a* in the insulating film 31.

Next, after removal of the resist 38, as shown in FIG. 41, contact plugs 25 filling the contact holes 24 and contact plug 75 filling the contact hole 74 are formed. Thus the conductive barrier layers 42 of the contact plugs 33 and the contact plugs 25 are in contact respectively with each other and the conductive barrier layer 82 of the contact plug 83*a* and the contact plug 75 are in contact with each other.

Next, as shown in FIG. 42, interconnections 26 and bit line 76 are formed on the insulating film 31.

Thus a memory device is formed in the memory region and a logic device is formed in the logic region.

As described above, according to the semiconductor device manufacturing method of the third preferred embodiment, the oxidation-preventing conductive barrier layers 42 are formed in the top ends of the contact plugs 33 provided in the lower layer in the logic region, as well as those in the top ends of the contact plugs 83*a* and 83*b* in the memory region. Therefore the conductive films 16 of the contact plugs 33 are not oxidized during formation of the dielectric films 71 of capacitors 73. This further lowers the contact resistance between the contact plugs 25 provided in the upper layer and the source/drain regions 9 in the logic region.

Figure 43:
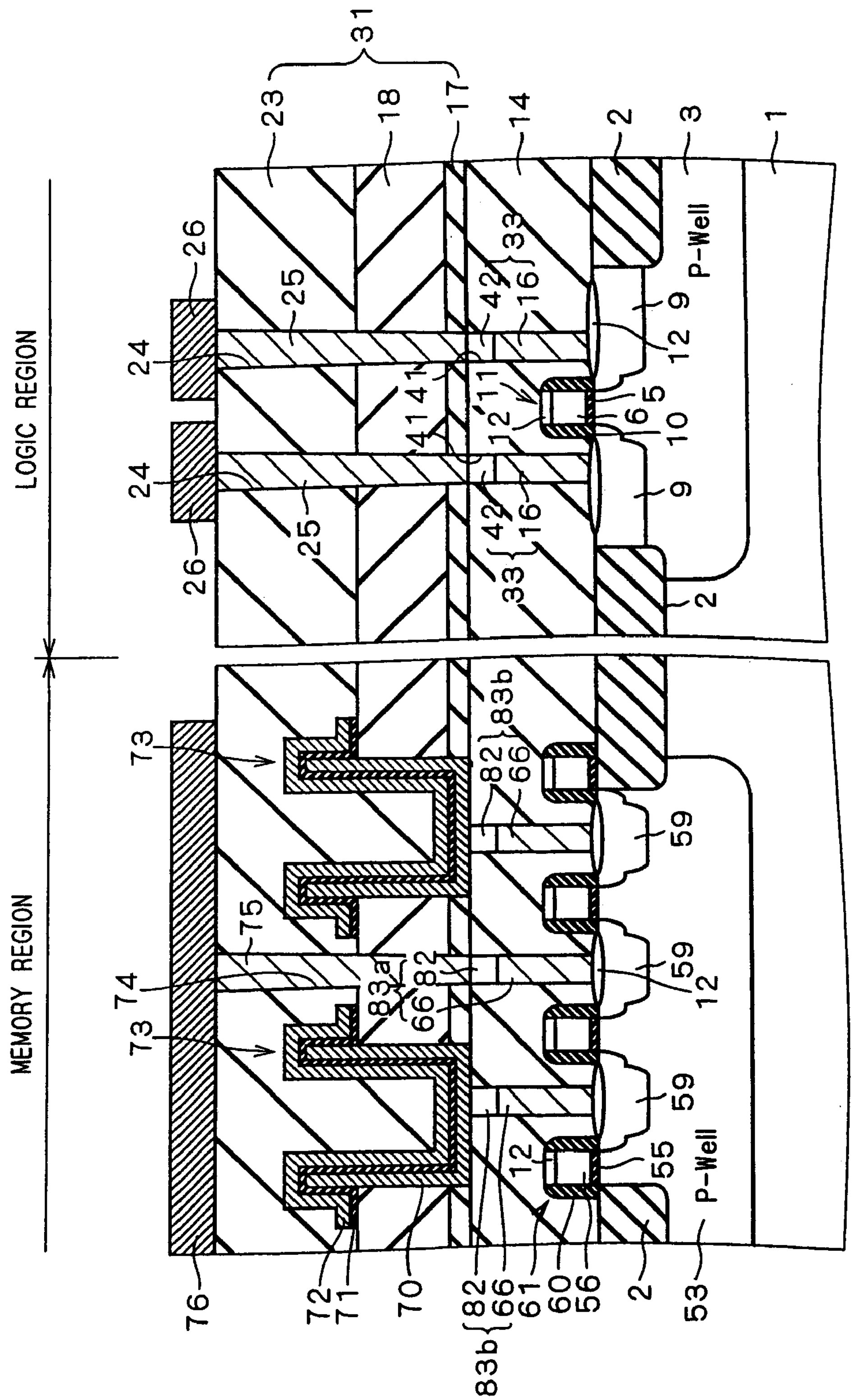
FIGS. 43 to 47 are cross-sectional views showing the structures of semiconductor devices that can be manufactured according to the third preferred embodiment of the invention.
Figure 44:
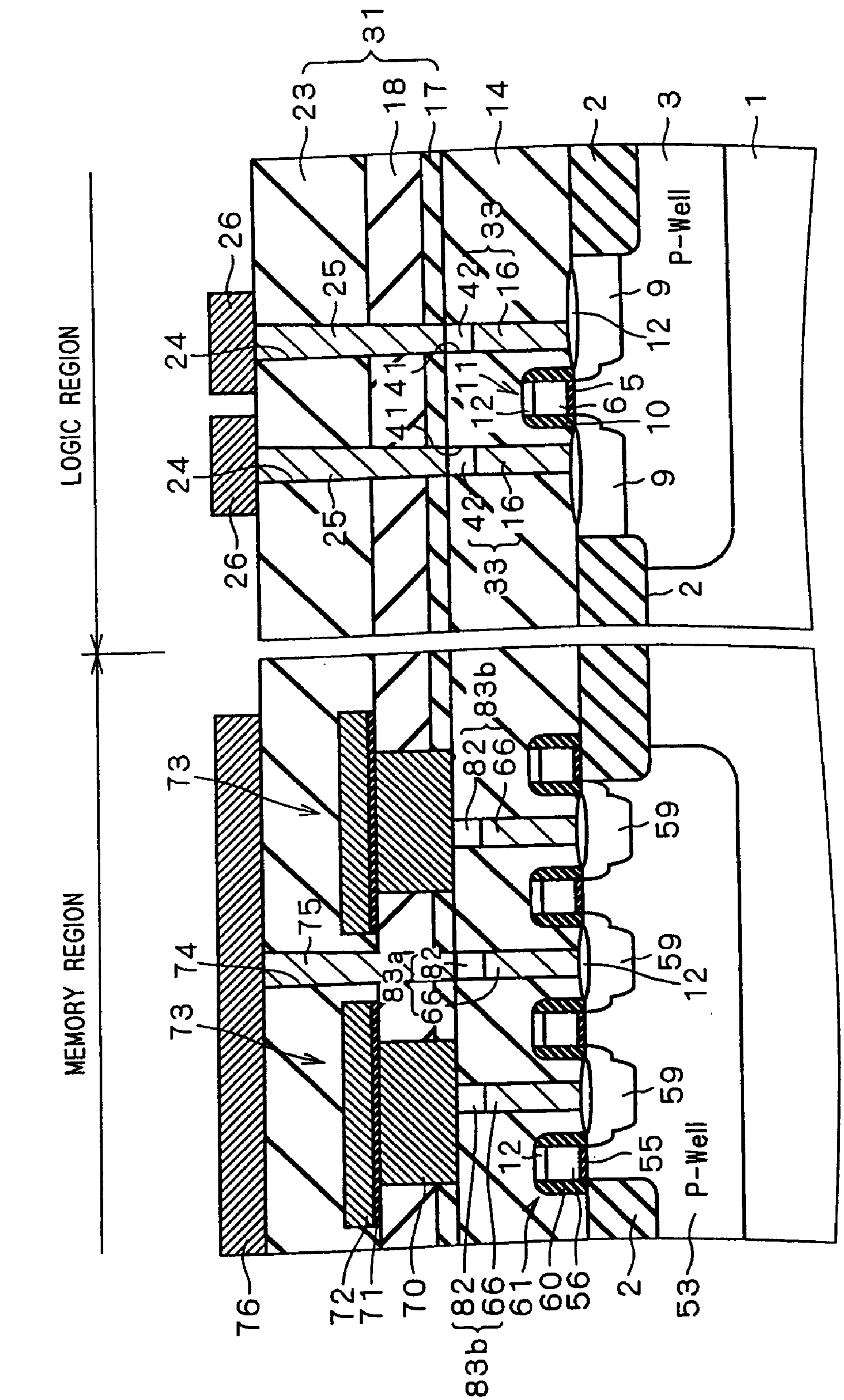
Figure 45:
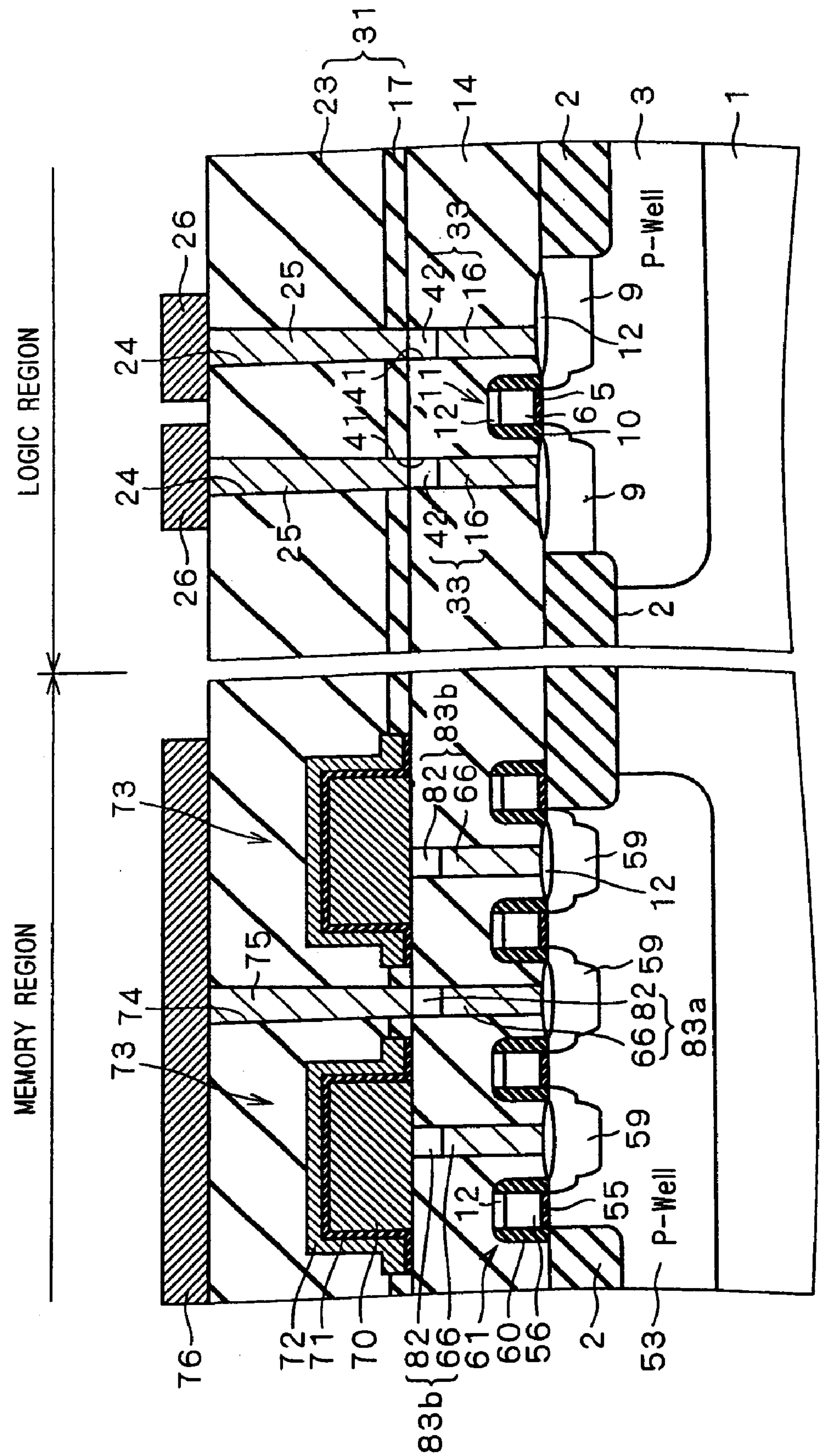

The third preferred embodiment has shown a method for manufacturing a semiconductor device that has concave-type MIM capacitors as DRAM memory cell capacitors 73. However, as has been mentioned in the first and second preferred embodiments, the present invention can be applied also to methods for manufacturing semiconductor devices in which capacitors 73 are MIM capacitors of other structures. For example, the present invention can be applied also to methods for manufacturing semiconductor devices having supported cylinder-type MIM capacitors as shown in FIG. 43, pillar-type MIM capacitors as shown in FIG. 44, and thick-film stacked-type MIM capacitors as shown in FIG. 45.

Figure 46:
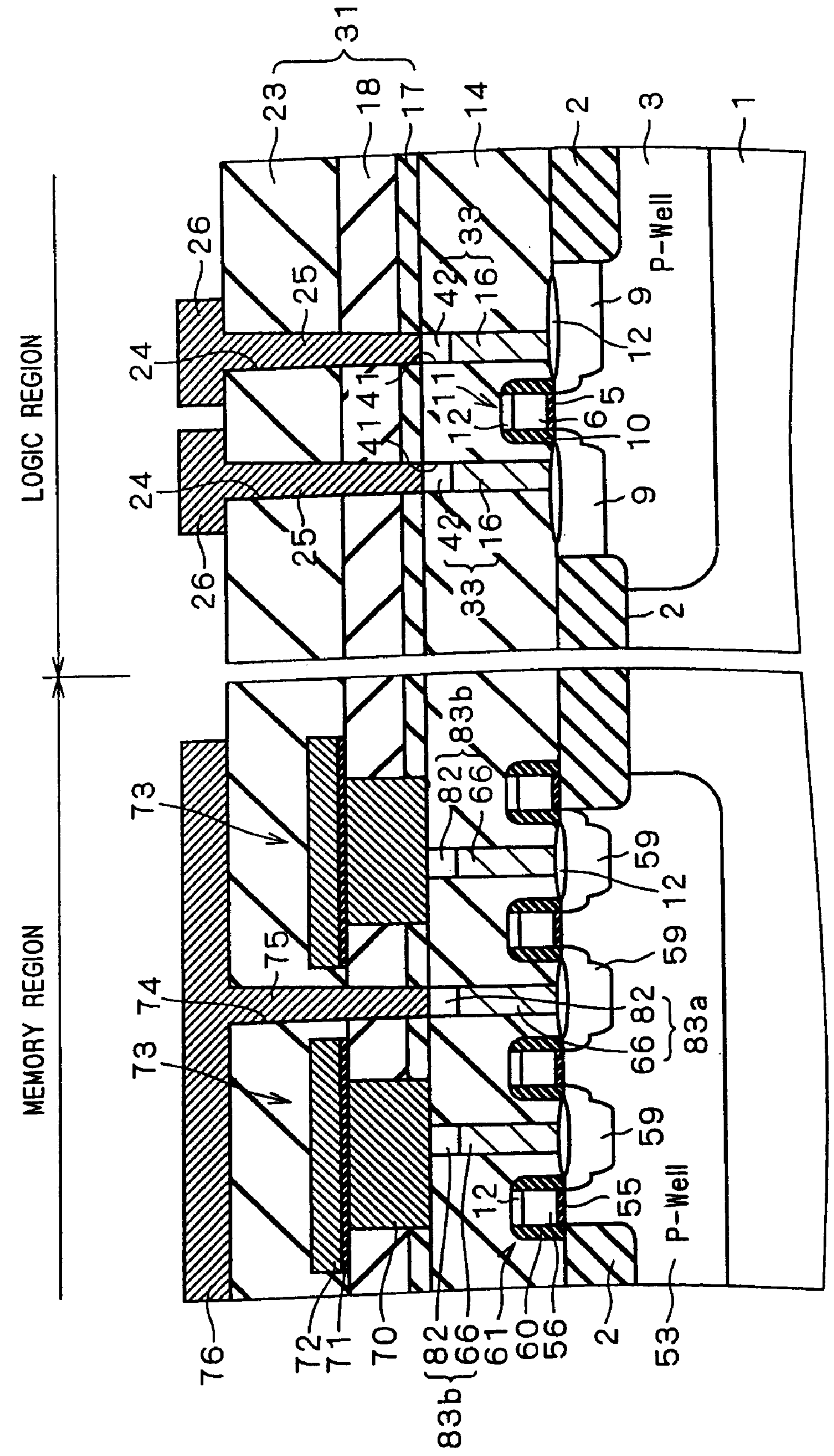
Figure 47:
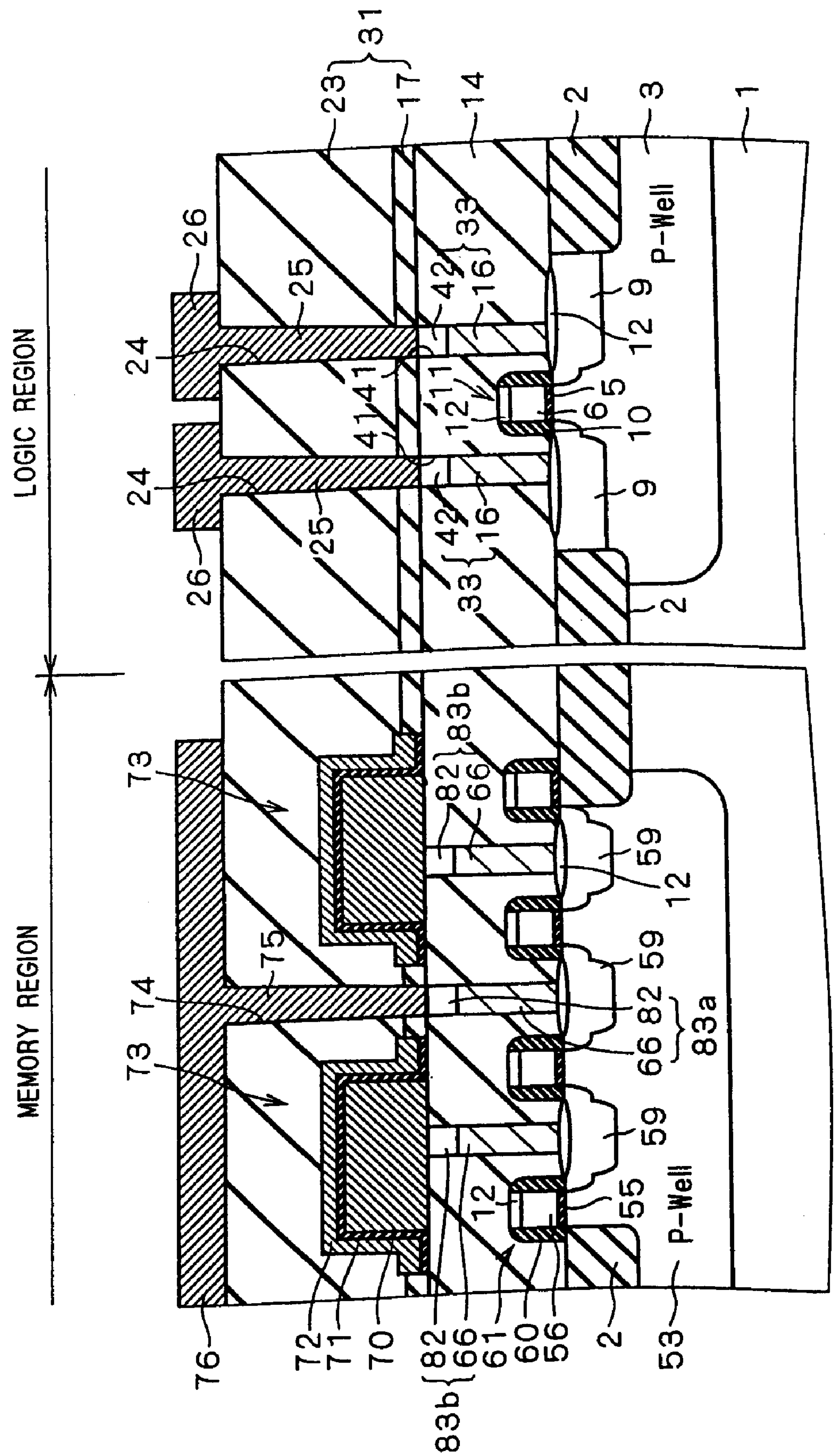

When pillar-type MIM capacitors or thick-film stacked-type MIM capacitors are adopted, the aspect ratios of the contact plugs 25, 75 can be smaller. Therefore, as shown in FIGS. 46 and 47, the contact plugs 25 and interconnections 26, or the contact plug 75 and bit line 76 may be integrally formed using dual damascene process.

When thick-film stacked-type MIM capacitors are adopted, the interlayer insulating film 18 in the insulating film 31 is removed during the manufacturing process. Therefore FIGS. 45 and 47 do not show it.

Fourth Preferred Embodiment

In the semiconductor device manufactured by the method of the third preferred embodiment, as shown in FIG. 42, the conductive barrier layers 42 and 82, serving as oxidation preventing films, remain in the top ends of the contact plugs 33 and 83*a*. However, the conductive barrier layers 42 and 82 may be removed after the formation of capacitors 73 because they are not necessary any more. A fourth preferred embodiment describes a method in which the conductive barrier layers 42 and 82 are removed after the formation of capacitors 73.

Figure 48:
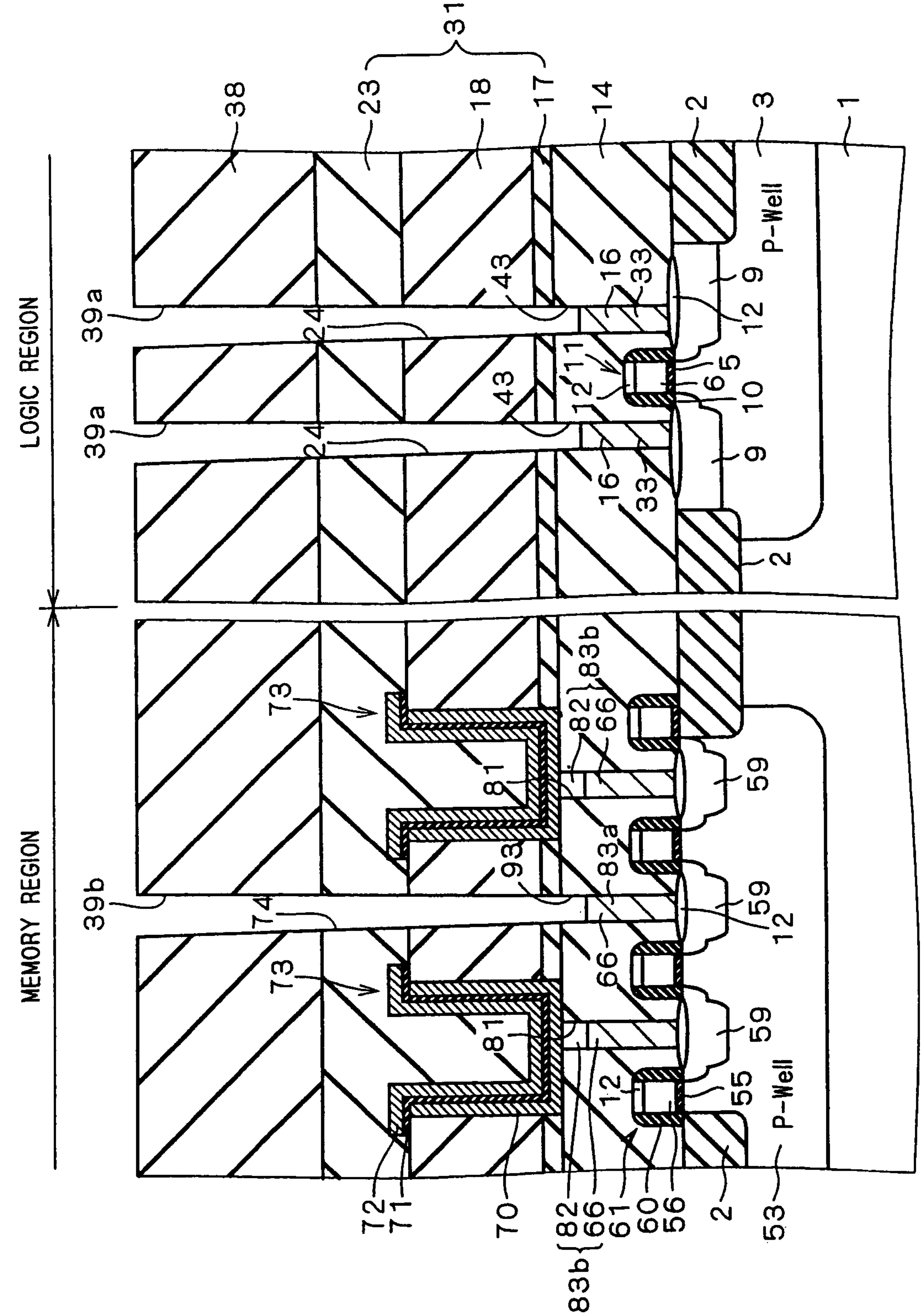
Figure 50:
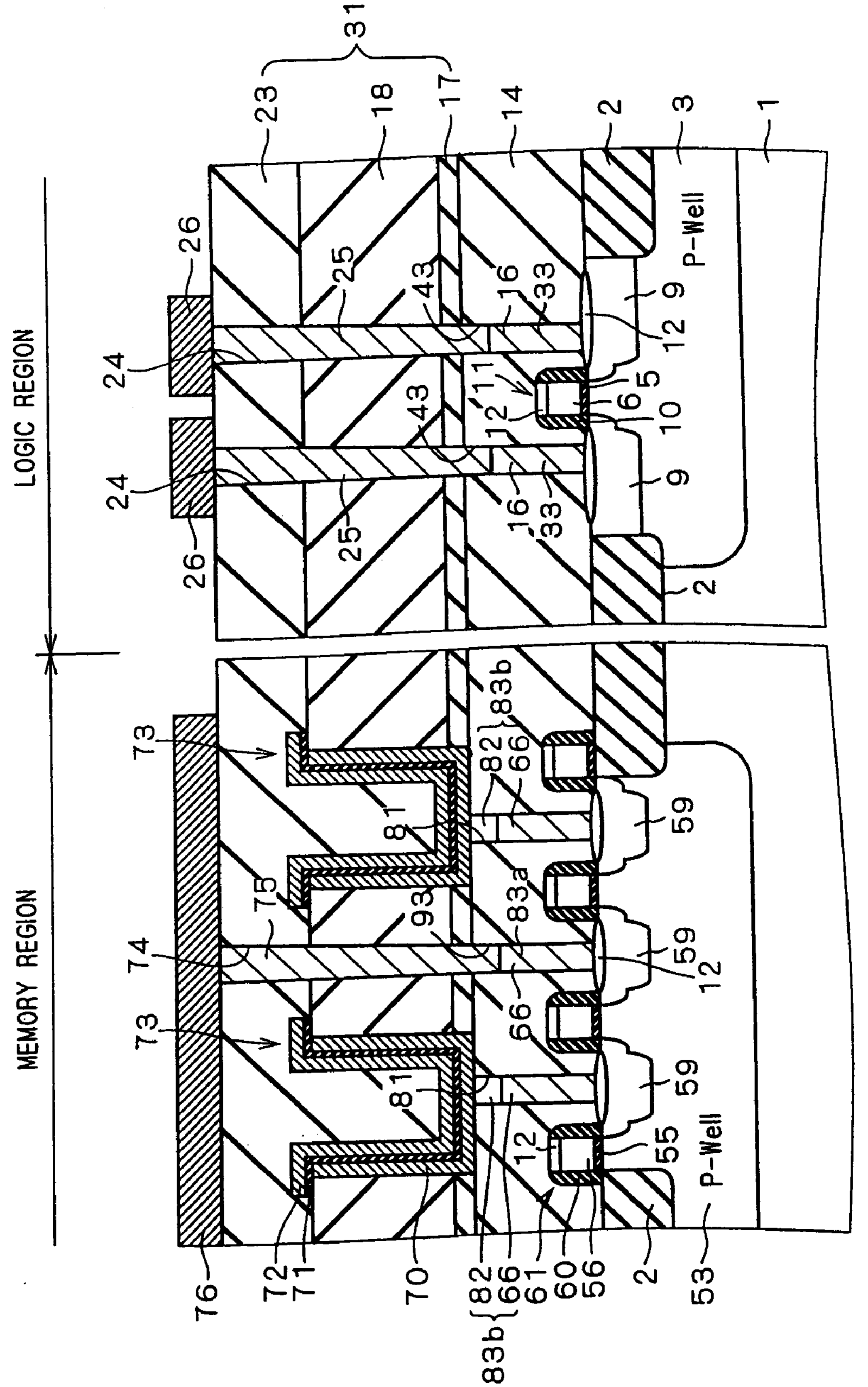

FIGS. 48 to 50 are cross-sectional views showing a sequence of process steps for manufacturing a semiconductor device according to the fourth preferred embodiment of the invention. First, the structure shown in FIG. 39 is obtained according to the process of the third preferred embodiment. Then, as shown in FIG. 48, resist 38 having opening patterns 39*a* and 39*b* is formed on the insulating film 31. Then, using the resist 38 as a mask, the interlayer insulating films 18 and 23 are etched and removed away using the stopper film 17 as an etching stopper. This etching adopts an anisotropic dry-etching process using a mixed gas of $C_4F_6$, $O_2$ and Ar. Then, using a different etching gas, and using the resist 38 as a mask again, the exposed parts of the stopper film 17 are etched away. This etching adopts an anisotropic dry-etching process using $CHF_3$ as the etching gas.

Thus, contact hole 74 reaching the contact plug 83*a* and contact holes 24 reaching the contact plugs 33 are formed through the insulating film 31.

Next, using another etching gas, and using the resist 38 as a mask, the exposed conductive barrier layers 42 and 82 are etched and removed away. This etching adopts an anisotropic dry-etching process using a mixed gas of $Cl_2$ and $CHF_3$.

Thus, in the memory region, a recess 93 communicating with the contact hole 74 is formed in the insulating film 14, with the conductive film 66 of the contact plug 83*a* being exposed. Also, in the logic region, recesses 43 communicating with the contact holes 24 are formed in the insulating film 14, with the conductive films 16 of the contact plugs 33 being exposed.

Next, after removal of resist 38, a refractory metal film of, e.g. tungsten, is formed all over the surface to fill the recesses 43, 93 and contact holes 24, 74. Then, the refractory metal film on the top surface of the insulating film 31 is removed, e.g. by CMP. Thus, as shown in FIG. 49, in the logic region, contact plugs 25, filling the contact holes 24 and recesses 43, are formed in the insulating films 14 and 31, and the conductive films 16 of the contact plugs 33 are in contact respectively with the contact plugs 25. Also, in the memory region, a contact plug 75 filling the contact hole 74 and recess 93 is formed in the insulating films 14 and 31, and the conductive film 66 of the contact plug 83*a* is in contact with the contact plug 75. Subsequently, as shown in FIG. 50, interconnections 26 and bit line 76 are formed on the insulating film 31, thus completing a merged memory-logic semiconductor device.

As described above, in the semiconductor device manufacturing method of the fourth preferred embodiment, the conductive barrier layer 82 formed in the top end of the contact plug 83*a* in the memory region is removed after the formation of capacitors 73. Therefore the contact plug 75 in the upper layer is in contact with the conductive film 66 of the contact plug 83*a* in the lower layer. The conductive film 66 has a higher conductivity than the conductive barrier layer 82. The contact resistance between the upper-layer contact plug 75 and the lower-layer contact plug 83*a* is therefore lower than when the upper-layer contact plug 75 is in contact with the conductive barrier layer 82 of the lower-layer contact plug 83*a*, as described in the method of the third preferred embodiment. This further lowers the contact resistance between the contact plug 75 or bit line 76 and the source/drain regions 59.

Furthermore, since the conductive barrier layers 42 formed in the top ends of contact plugs 33 in the logic region are removed after formation of capacitors 73, the contact plugs 25 in the upper layer are in contact respectively with the conductive films 16 of the contact plugs 33 in the lower layer. The conductive films 16 have a higher conductivity than the conductive barrier layers 42. The contact resistance between the upper-layer contact plugs 25 and the lower-layer contact plugs 33 is therefore lower than when the upper-layer contact plugs 25 are in contact with the conductive barrier layers 42 of the lower-layer contact plugs 33 as described in the method of the third preferred embodiment. This further lowers the contact resistance between the contact plugs 25 and source/drain regions 9.

Moreover, in the fourth preferred embodiment, the conductive barrier layers 42 and 82 are removed using the resist 38 that is used to form the contact holes 24 and 74 in the insulating film 31, using a different etching gas. The conductive barrier layers 42 and 82 can thus be removed by a smaller number of process steps.

Fifth Preferred Embodiment

Figure 51:
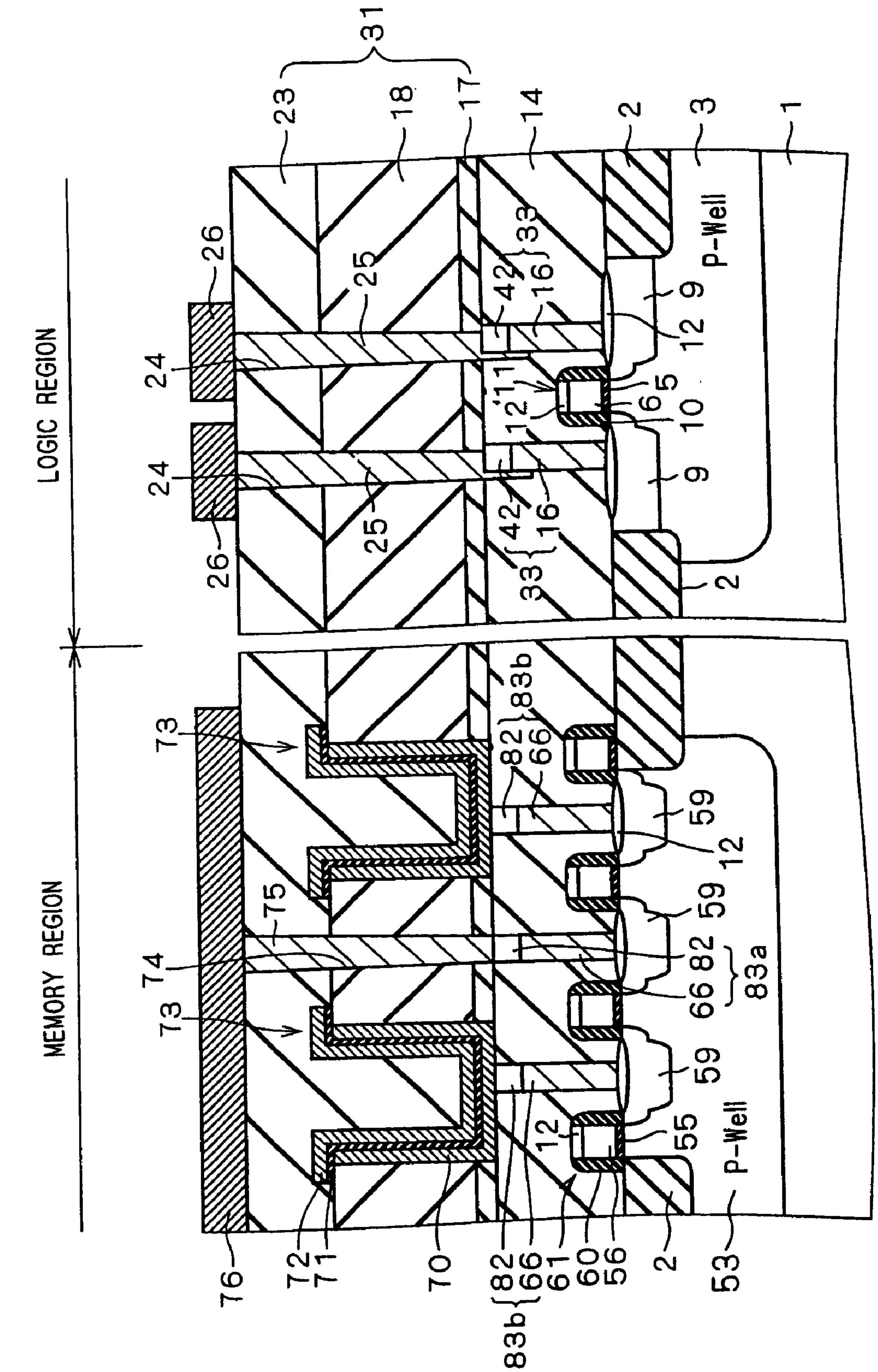
FIG. 51 is a cross-sectional view showing the structure of a semiconductor device according to a fifth preferred embodiment of the invention.

FIG. 51 is a cross-sectional view showing the structure of a semiconductor device according to a fifth preferred embodiment of the invention. The semiconductor device of the fifth preferred embodiment has contact plugs 25 that are differently shaped from those in the structure shown in FIG. 42. Therefore some contents already described in the first to fourth preferred embodiments are not described again here to show the semiconductor device of the fifth preferred embodiment.

As shown in FIG. 51, the semiconductor device of the fifth preferred embodiment has: semiconductor substrate 1; insulating film 14 provided on the semiconductor substrate 1; contact plugs 33, 83*a*, 83*b* formed in the insulating film 14; capacitors 73 residing on the insulating film 14 and being in contact with the contact plugs 83*b*; insulating film 31 lying on the insulating film 14 and covering capacitors 73; contact plugs 25, 75 formed in the insulating film 31; and interconnections 26 and bit line 76 lying on the insulating film 31.

Element isolation insulating films 2 are formed in the upper surface of the semiconductor substrate 1. Also, well region 3 is formed in the upper surface of the semiconductor substrate 1 in the logic region and well region 53 is formed in the upper surface of the semiconductor substrate 1 in the memory region.

A plurality of source/drain regions 9 are provided at a given distance in the upper surface of the well region 3, and a plurality of source/drain regions 59 are provided at given distances in the upper surface of the well region 53.

Gate structure 11 is provided on the upper surface of the well region 3 between adjacent source/drain regions 9, and gate structures 61 are provided on the upper surface of the well region 53 between adjacent source/drain regions 59.

Silicide films 12 are provided on the top surface of the gate electrode 6 of the gate structure 11 and on the top surfaces of the gate electrodes 56 of the gate structures 61. Silicide films 12 are formed also on the source/drain regions 9 and 59.

The top surfaces of the contact plugs 33, 83*a*, 83*b* are exposed from the insulating film 14. Each contact plug 83*b* is electrically connected through silicide film 12 to one of adjacent source/drain regions 59, and the contact plug 83*a* is electrically connected through silicide film 12 to the other of adjacent source/drain regions 59. Contact plugs 33 are electrically connected through silicide films 12 to the source/drain regions 9.

In the memory region, the contact plug 75 is in contact with the top surface of the conductive barrier layer 82 of the contact plug 83*a*, and the top surface of the contact plug 75 is exposed from the insulating film 31. Bit line 76 is in contact with the contact plug 75.

In the logic region, the top surfaces of the contact plugs 25 are exposed from the insulating film 31 and are in contact with the interconnections 26. Each contact plug 25 extends into the insulating film 14 and is in contact with the conductive barrier layer 42 of the contact plug 33 and also in contact with part of the side surface of the top portion of the conductive film 16.

In this way, according to the semiconductor device of the fifth preferred embodiment, even when the contact plugs 33 in the logic region have oxidation-preventing conductive barrier layers 42, the upper-layer contact plugs 25 are in contact not only with the conductive barrier layers 42 of the lower-layer contact plugs 33 but also with the conductive films 16 having higher conductivity. Therefore, the contact resistance between the upper-layer contact plugs 25 in the logic region and the source/drain regions 9 in the semiconductor substrate 1 is lower than when the upper-layer contact plugs 25 are electrically connected with the conductive films 16 through the conductive barrier layers 42 as shown in the semiconductor device of FIG. 42.

Furthermore, the conductive barrier layers 82 in the top ends of the contact plugs 83*b* that are in contact with capacitors 73 prevent oxidation of the conductive films 66 of the contact plugs 83*b* during formation of the dielectric films 71 of capacitors 73. Thus, even when oxidation process is performed for formation of the dielectric films 71 of capacitors 73, it is possible to achieve both of a reduction in contact resistance in the memory device and a reduction in contact resistance in the logic device.

Figure 52:
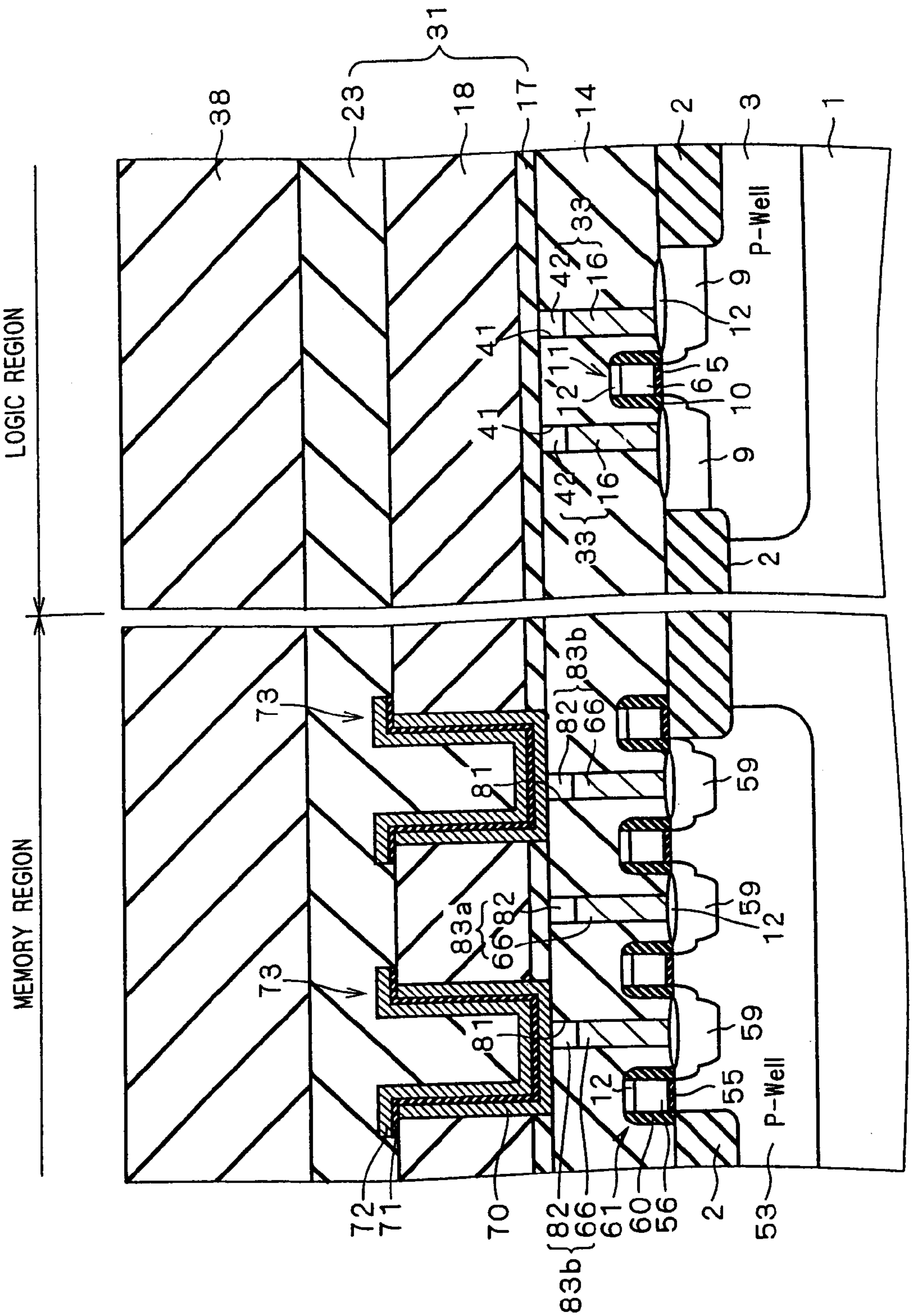

Next, a method for manufacturing the semiconductor device shown in FIG. 51 is described referring to FIGS. 52 to 55. First, the structure shown in FIG. 39 is obtained according to the manufacturing process of the third preferred embodiment. Next, as shown in FIG. 52, a resist 38 is formed on the insulating film 31.

Figure 53:
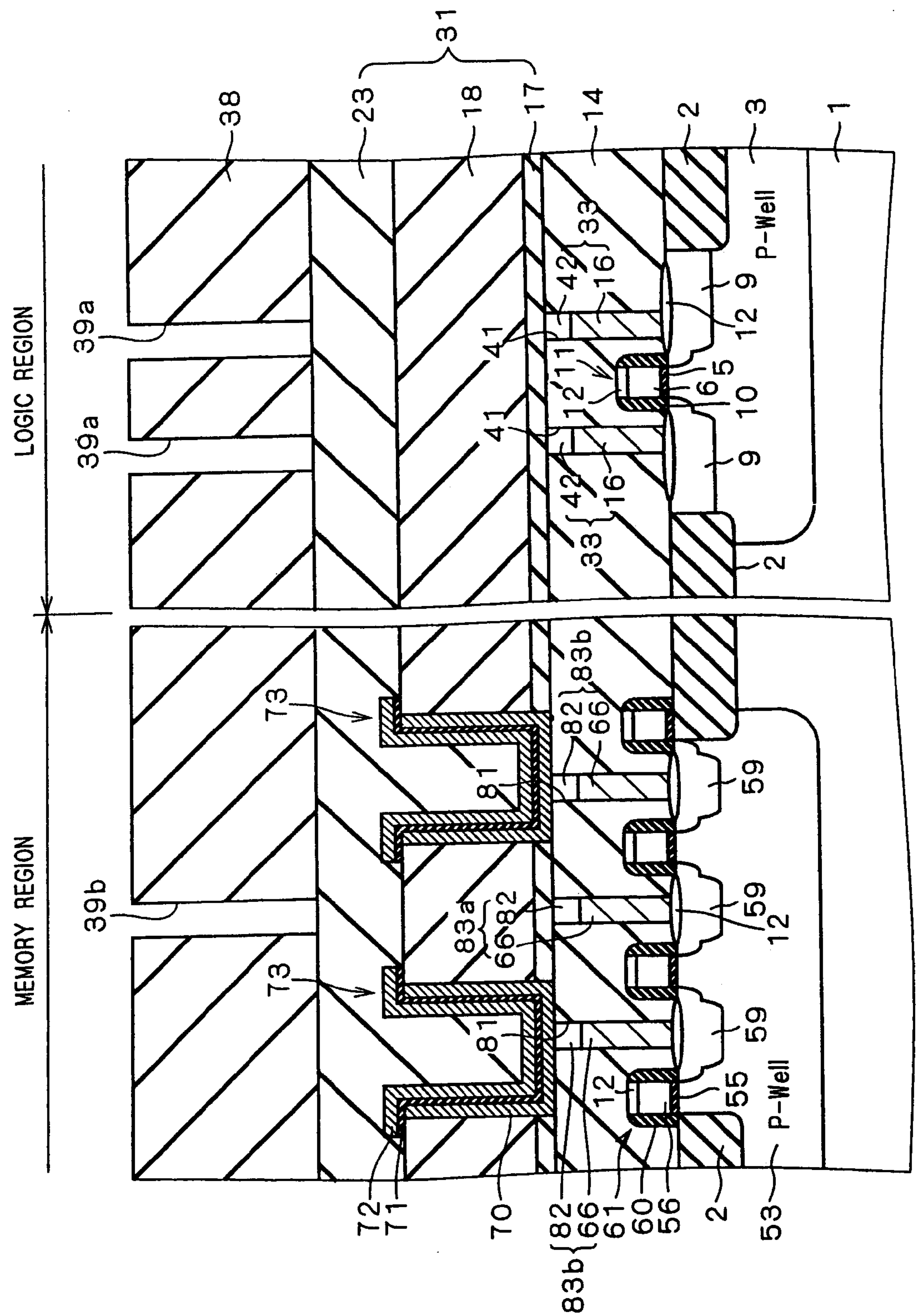

Then, as shown in FIG. 53, opening patterns 39*a* and 39*b* are formed through the resist 38 in correspondence respectively with the positions of the contact plugs 33 and 83*a*. In this process, the opening patterns 39*a* above the contact plugs 33 are intentionally somewhat misaligned with, or shifted from, the contact plugs 33. Therefore, as shown in FIG. 53, the opening patterns 39*a* extend not only right above the contact plugs 33 but also right above the insulating film 14.

The opening pattern 39*b* above the contact plug 83*a* is positioned just right above the contact plug 83*a*, without being intentionally misaligned with the contact plug 83*a*. In the fifth preferred embodiment, the diameter of the opening patterns 39*a* is set almost the same as the diameter of the contact plugs 33 and the diameter of the opening pattern 39*b* is set almost the same as the diameter of the contact plug 83*a*.

Next, as shown in FIG. 54, using as a mask the resist 38 having opening patterns 39*a* and 39*b*, the interlayer insulating films 18 and 23 are partially etched and removed away using the stopper film 17 as an etching stopper. This etching adopts an anisotropic dry-etching process using a mixed gas of $C_4F_6$, $O_2$ and Ar.

Then, using the resist 38 as a mask again, the exposed parts of the stopper film 17 are etched away by anisotropic dry-etching using $CHF_3$ as the etching gas, so as to form contact holes 24 passing through the insulating film 31 to respectively reach the contact plugs 33 and a contact hole 74 reaching the contact plug 83*a*. During this process, the stopper film 17 is over-etched for a given amount so that the contact holes 24 extend into the insulating film 14, whereby side surfaces of the conductive films 16 of the contact plugs 33 are exposed.

As shown above, since the opening patterns 39*a* are misaligned with the contact plugs 33, the opening patterns 39*a* are located not only right above the contact plugs 33 but also right above the insulating film 14. Accordingly, in the logic region, the insulating film 14, too, is etched by the over-etch of the stopper film 17. It is thus possible, by over-etching the stopper film 17 for a given amount, to expose not only the conductive barrier layers 42 of the contact plugs 33 but also parts of the side surfaces of top portions of the conductive films 16.

The opening pattern 39*b* is positioned only right above the contact plug 83*a*, so that the insulating film 14 is not etched in the memory region. Also, the conductive barrier layer 82 of the contact plug 83*a* is hardly etched by the etching gas used to remove the stopper film 17, so that the conductive barrier layer 82 remains in the top end of the contact plug 83*a* after the formation of the contact hole 74.

Figure 55:
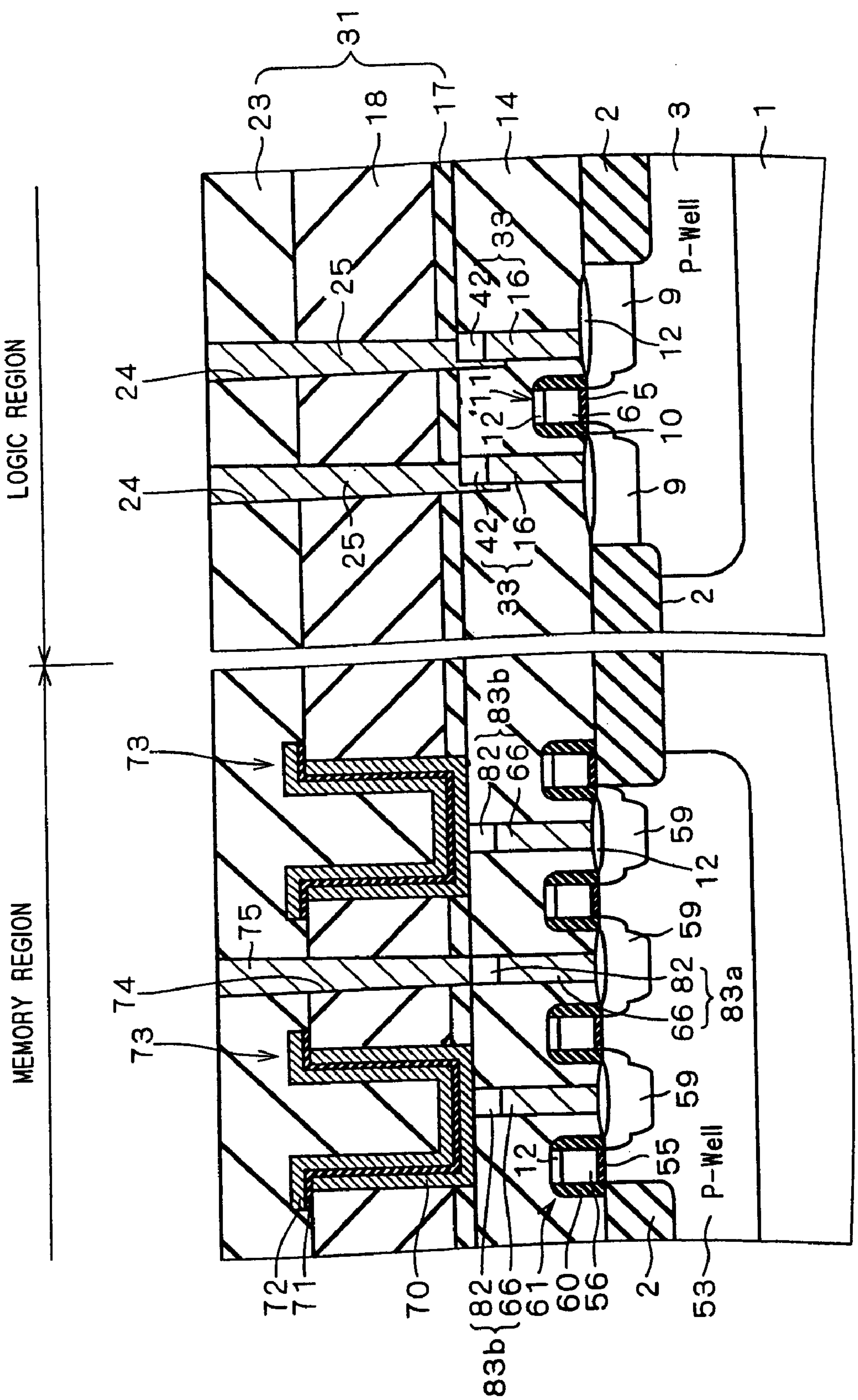

Next, as shown in FIG. 55, contact plugs 25 are formed to fill the contact holes 24 and a contact plug 75 is formed to fill the contact hole 74. Thus, the contact plugs 25 are formed not only through the insulating film 31 but also into the insulating film 14; they thus come in contact respectively with the conductive barrier layers 42 of the contact plugs 33 and also respectively with parts of the side surfaces of the top portions of the conductive films 16. Subsequently interconnections 26 and bit line 76 are formed on the insulating film 31 to obtain the semiconductor device shown in FIG. 51.

As shown above, according to the semiconductor device manufacturing method of the fifth preferred embodiment, even when oxidation-preventing conductive barrier layers 42 are formed in the top ends of the contact plugs 33 in the logic region, the upper-layer contact plugs 25 are in contact not only with the conductive barrier layers 42 of the lower-layer contact plugs 33 but also with the conductive films 16 having higher conductivity. Therefore the contact resistance between the upper-layer contact plugs 25 in the logic region and the source/drain regions 9 provided in the semiconductor substrate 1 is lower than when the upper-layer contact plugs 25 are electrically connected to the conductive films 16 through the conductive barrier layers 42 as shown in the semiconductor device manufacturing method of the third preferred embodiment.

Furthermore, the conductive barrier layers 82 in the top ends of the contact plugs 83*b* prevent oxidation of the conductive films 66 of the contact plugs 83*b* during formation of the dielectric films 71 of capacitors 73. Therefore it is possible to achieve both of a reduction in contact resistance in the memory device and a reduction in contact resistance in the logic device.

In the fifth preferred embodiment, the upper-layer contact plug 75 in the memory region is in contact only with the conductive barrier layer 82 of the contact plug 83*a* but is not in contact with the conductive film 66. However, as shown in the semiconductor device of FIG. 56, the contact plug 75 may be extended into the insulating film 14 so that it comes in contact also with a side surface of the conductive film 66 of the lower-layer contact plug 83*a*.

Thus, even when the contact plug 83*a* in the memory region has oxidation-preventing conductive barrier layer 82, forming the upper-layer contact plug 75 in contact with the conductive film 66 of the lower-layer contact plug 83*a* lowers the contact resistance between the upper-layer contact plug 75 or bit line 76 and the source/drain regions 59 in the semiconductor substrate 1.

Figure 57:
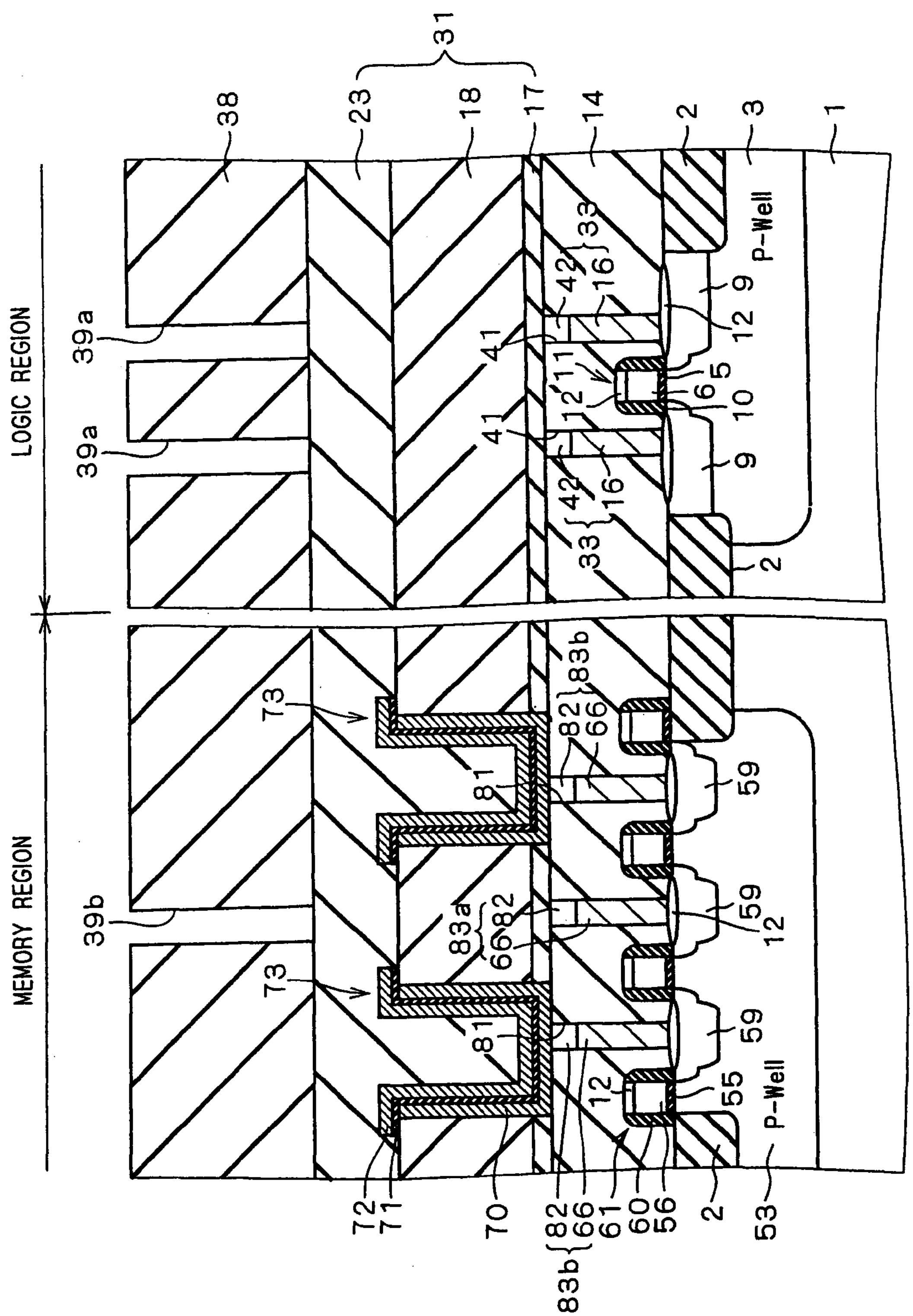
FIGS. 57 and 58 are cross-sectional views showing a sequence of process steps for manufacturing the modification of the semiconductor device of the fifth preferred embodiment of the invention.
Figure 58:
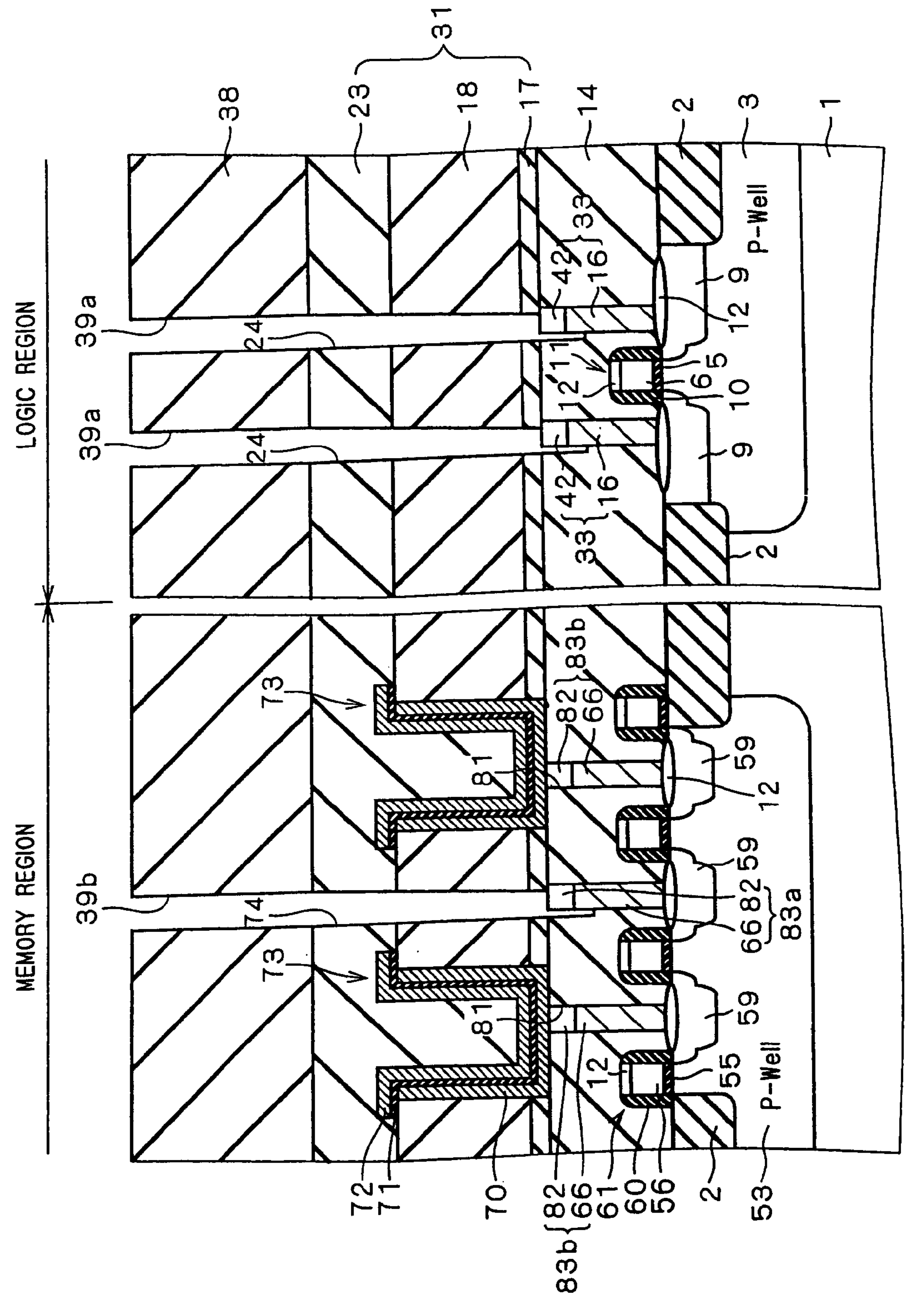

A method for manufacturing the semiconductor device shown in FIG. 56 is now described referring to FIGS. 57 and 58.

First, the structure shown in FIG. 39 is obtained according to the process of the third preferred embodiment. Then, as shown in FIG. 57, a resist 38 is formed on the insulating film 31. Then opening patterns 39*a* and 39*b* are formed through the resist 38 in correspondence respectively with the positions of the contact plugs 33 and 83*a*. In this process, like the opening patterns 39*a* above the contact plugs 33, the opening pattern 39*b* above the contact plug 83*a*, too, is intentionally slightly misaligned with, or shifted from, the contact plug 83*a*. Thus, the opening pattern 39*b* is positioned not only right above the contact plug 83*a* but also right above the insulating film 14.

Next, as shown in FIG. 58, using as a mask the resist 38 having opening patterns 39*a* and 39*b*, the interlayer insulating films 18 and 23 are partially etched and removed away using the stopper film 17 as an etching stopper.

Then, using the resist 38 as a mask again, the exposed parts of the stopper film 17 are etched away by anisotropic dry-etching using $CHF_3$ as the etching gas, so as to form contact holes 24 and 74 through the insulating film 31. During this process, the stopper film 17 is over-etched for a given amount so that the contact holes 24 and 74 extend into the insulating film 14, whereby side surfaces of the conductive films 16 of the contact plugs 33 are exposed and a side surface of the conductive film 66 of the contact plug 83*a* is exposed, too.

As shown above, since the alignment of the opening pattern 39*b* with the contact plug 83*a* is shifted, the opening pattern 39*b* is located not only right above the contact plug 83*a* but also right above the insulating film 14. Accordingly, by the over-etch to the stopper film 17, the insulating film 14 is etched not only in the logic region but also in the memory region. It is thus possible to expose not only the conductive barrier layer 82 of the contact plug 83*a* but also to expose part of the side surface of the top portion of the conductive film 66, by over-etching the stopper film 17 for a given amount.

Next, contact plugs 25 are formed to fill the contact holes 24 and a contact plug 75 is formed to fill the contact hole 74. Thus, like the contact plugs 25, the contact plug 75 is formed not only through the insulating film 31 but also into the insulating film 14; it thus comes in contact with the conductive barrier layer 82 of the contact plug 83*a* and also with part of the side surface of the top portion of the conductive film 66. Subsequently, interconnections 26 and bit line 76 are formed on the insulating film 31 to obtain the semiconductor device shown in FIG. 56.

As shown above, even when oxidation-preventing conductive barrier layer 82 is formed in the top end of the contact plug 83*a* in the memory region, the upper-layer contact plug 75 is in contact not only with the conductive barrier layer 82 of the lower-layer contact plug 83*a* but also with the conductive film 66 having higher conductivity. Therefore the contact resistance between the upper-layer contact plug 75 in the memory region and the source/drain regions 59 in the semiconductor substrate 1 is lowered.

Figure 59:
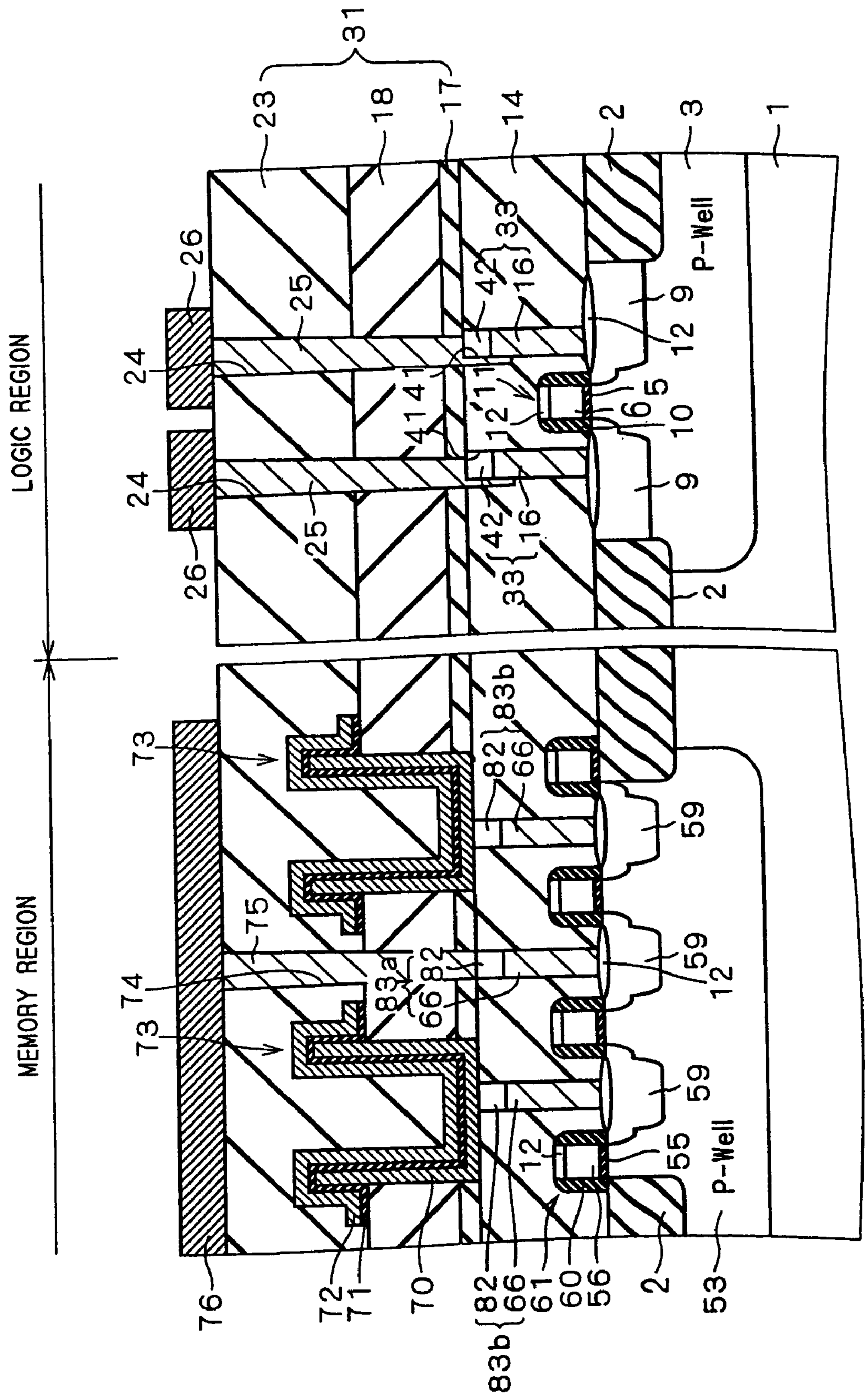
Figure 60:
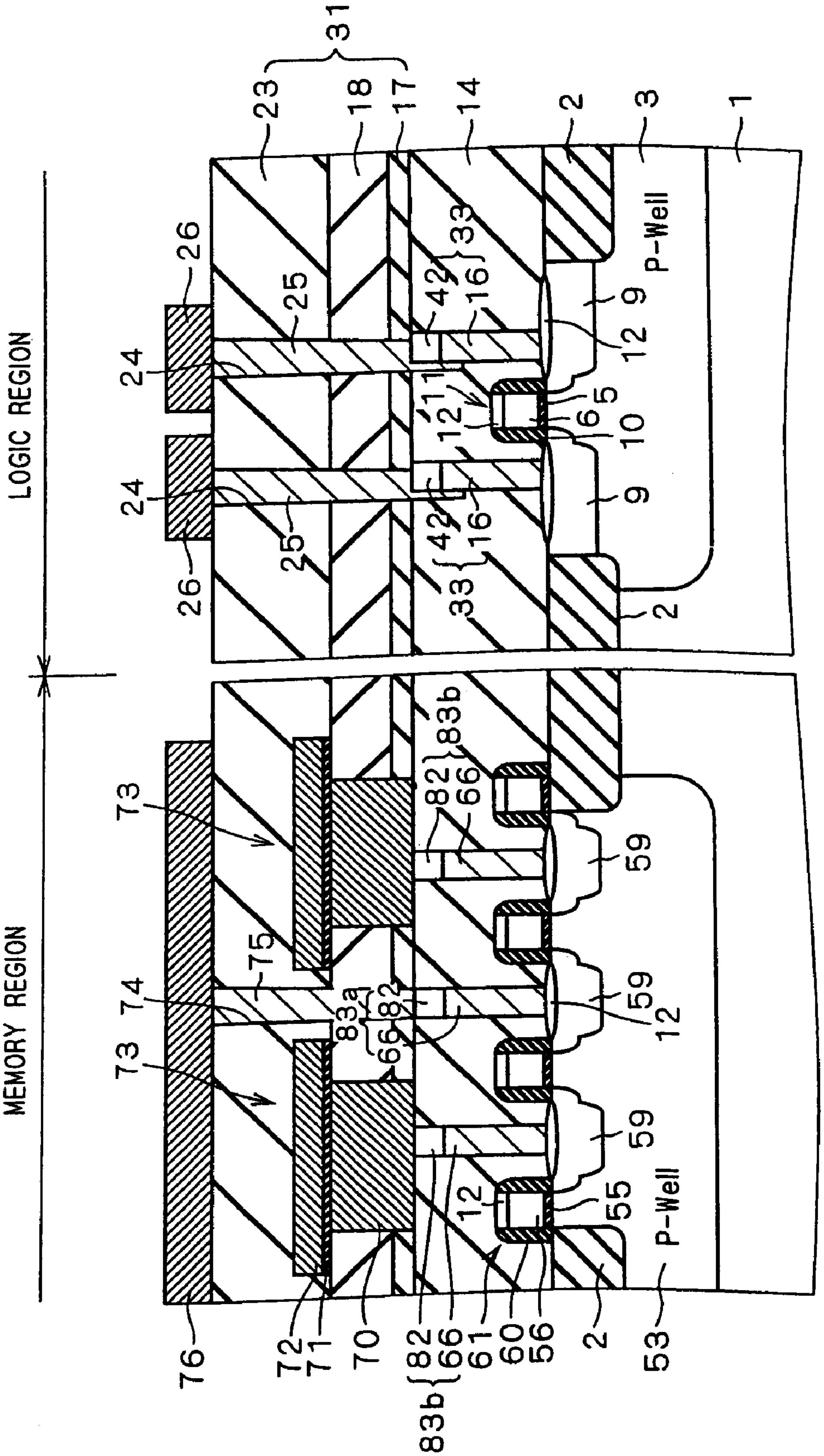
Figure 61:
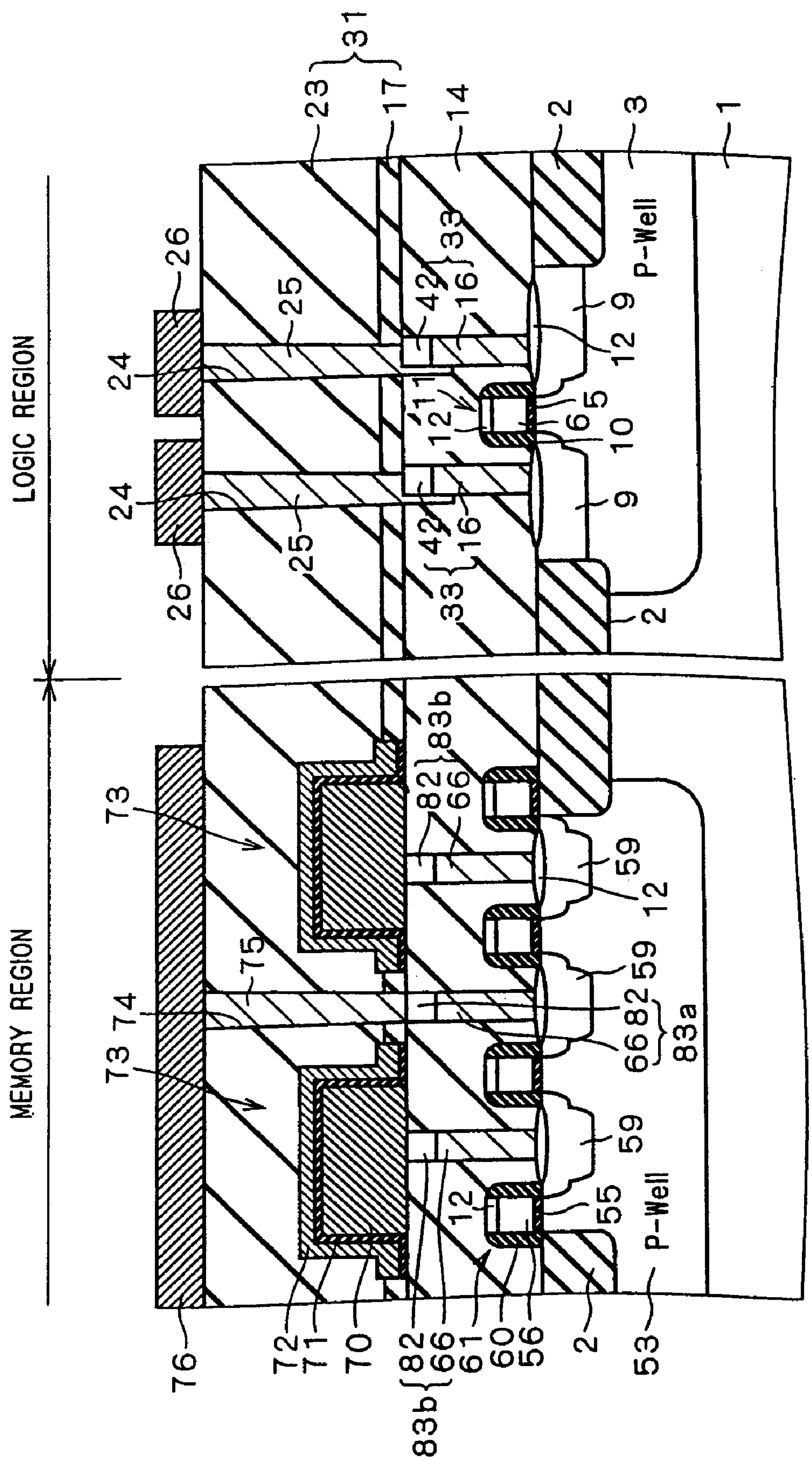

While the fifth preferred embodiment has shown semiconductor devices having concave-type MIM capacitors as DRAM memory cell capacitors 73 and manufacturing methods thereof, the present invention can be applied also to semiconductor devices and manufacturing methods in which MIM capacitors with other structures are used as capacitors 73. For example, the present invention can be applied also to semiconductor devices and manufacturing methods using supported cylinder-type MIM capacitors as shown in FIG. 59, pillar-type MIM capacitors as shown in FIG. 60, and thick-film stacked-type MIM capacitors as shown in FIG. 61.

Figure 62:
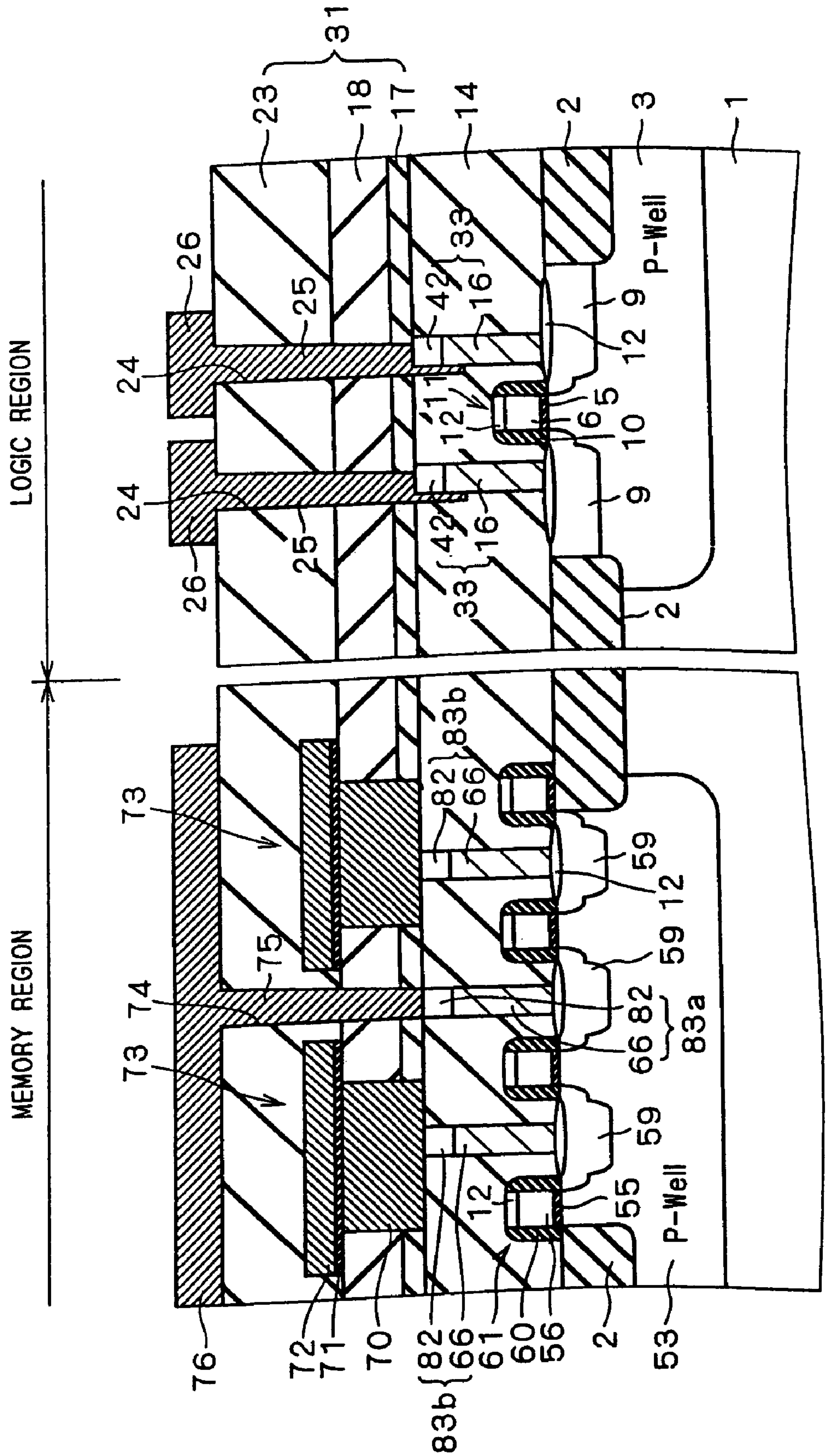

When pillar-type MIM capacitors or thick-film stacked-type MIM capacitors are adopted, the aspect ratios of the contact plugs 25, 75 can be smaller. Therefore, as shown in FIGS. 62 and 63, the contact plugs 25 and interconnections 26, or the contact plug 75 and bit line 76 may be integrally formed using dual damascene process.

When thick-film stacked-type MIM capacitors are adopted, the interlayer insulating film 18 in the insulating film 31 is removed during the manufacturing process. Therefore FIGS. 61 and 63 do not show it.

Sixth Preferred Embodiment

Figure 64:
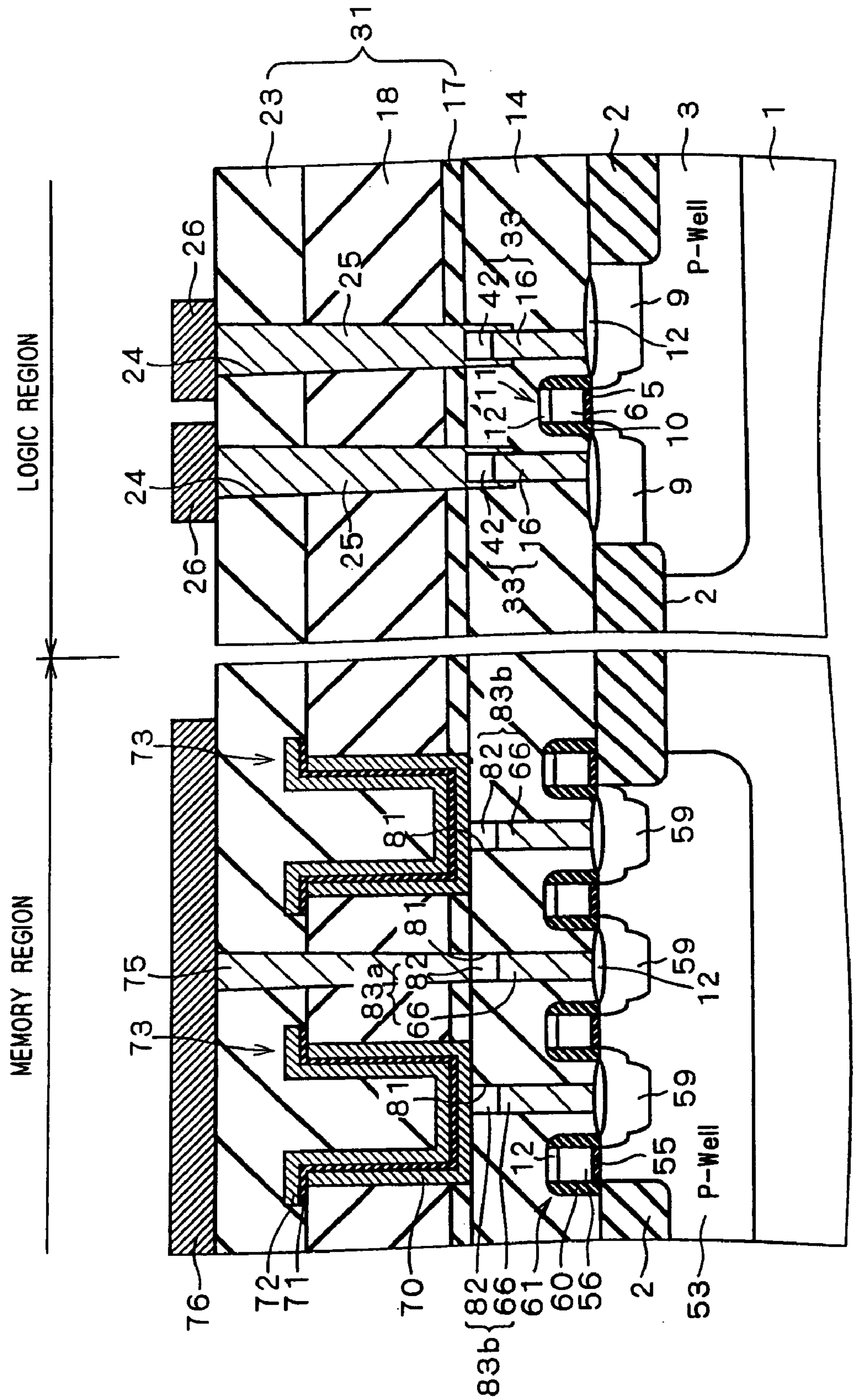
FIG. 64 is a cross-sectional view showing the structure of a semiconductor device according to a sixth preferred embodiment of the invention.

FIG. 64 is a cross-sectional view showing the structure of a semiconductor device according to a sixth preferred embodiment of the invention. The semiconductor device of the sixth preferred embodiment has contact plugs 25 that are shaped differently from those in the semiconductor device of the fifth preferred embodiment.

As shown in FIG. 64, in the semiconductor device of the sixth preferred embodiment, the top surfaces of the contact plugs 25 are exposed from the insulating film 31 and are in contact with interconnections 26. The diameter of the contact plugs 25 is larger than the diameter of the contact plugs 33 and they extend into the insulating film 14. The contact plugs 25 are in contact respectively with the conductive barrier layers 42 of the contact plugs 33 and also in contact respectively with the entire peripheries of the side surfaces of top portions of the conductive films 16. In other respects the structure of the semiconductor device is the same as that of the fifth preferred embodiment and is not described again here.

In this way, according to the semiconductor device of the sixth preferred embodiment, even when the contact plugs 33 in the logic region have oxidation-preventing conductive barrier layers 42, the upper-layer contact plugs 25 are in contact not only with the conductive barrier layers 42 of the lower-layer contact plugs 33 but also with the entire peripheries of the side surfaces of the top portions of the conductive films 16 having higher conductivity. Therefore, the contact resistance between the upper-layer contact plugs 25 in the logic region and the source/drain regions 9 in the semiconductor substrate 1 is lower than in the semiconductor device of the fifth preferred embodiment in which contact plugs 25 are in contact only with parts of the side surfaces of the top portions of the conductive films 16.

Figure 66:
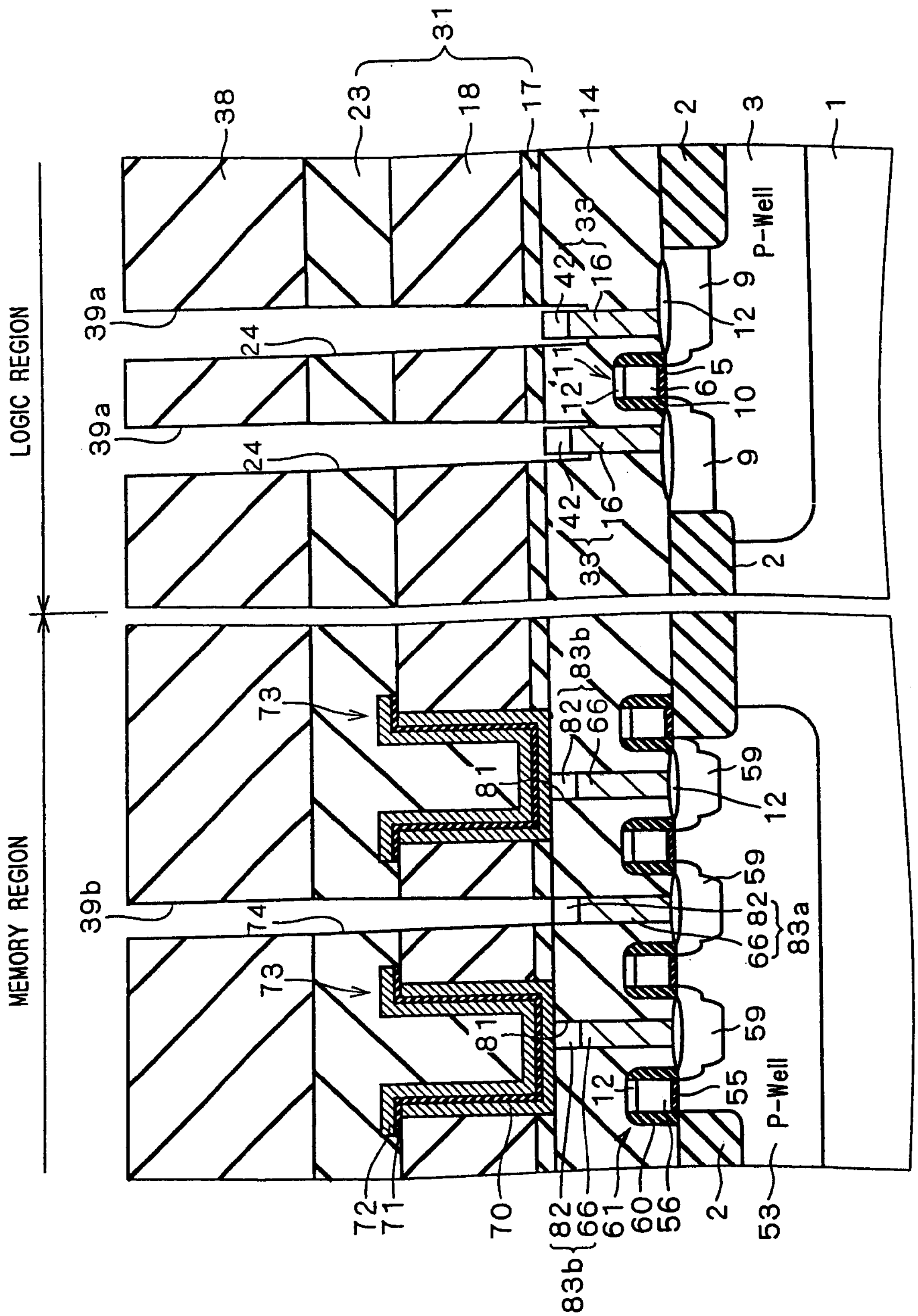
Figure 67:
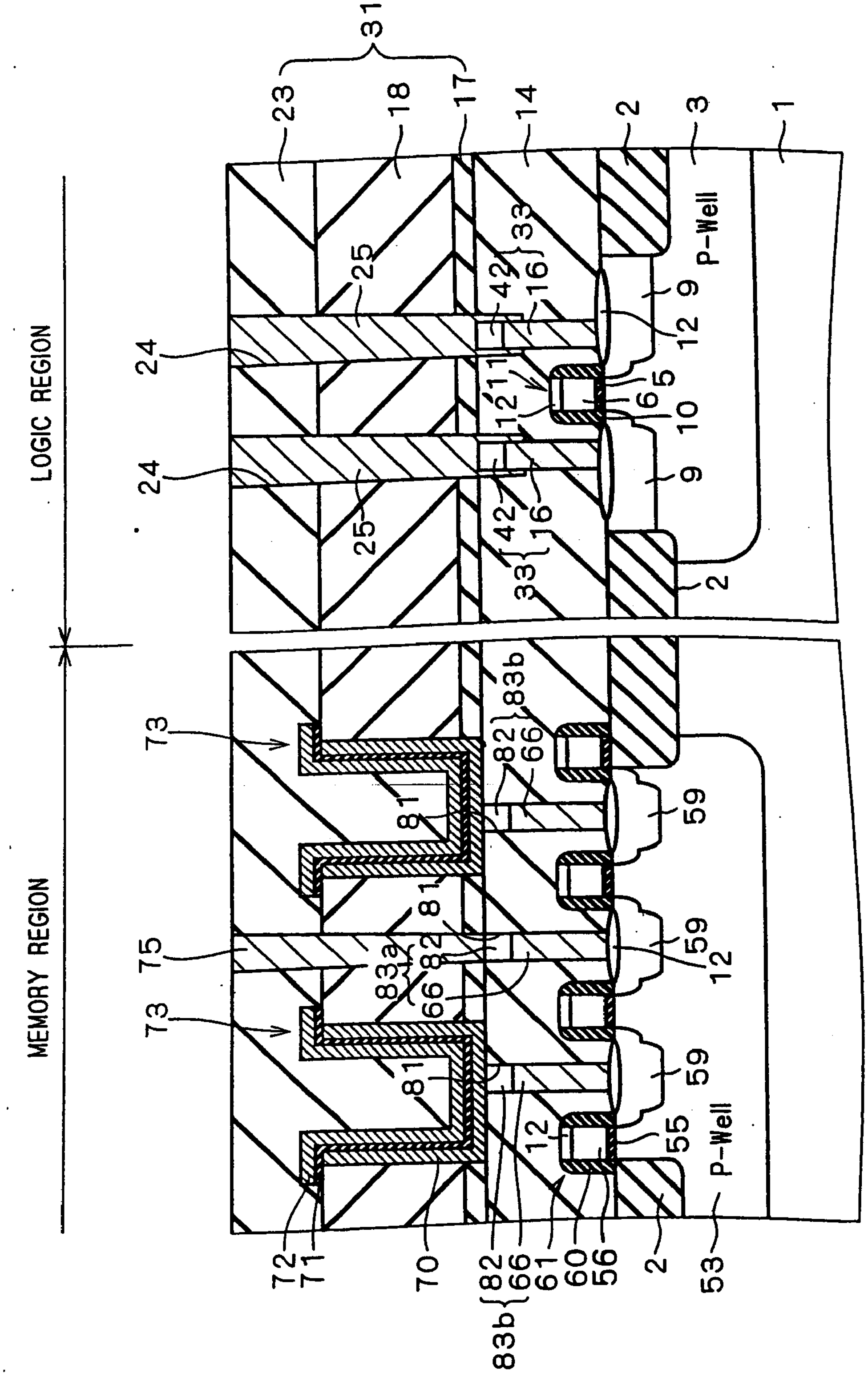

Next, a method for manufacturing the semiconductor device shown in FIG. 64 is described referring to FIGS. 65 to 67. The same contents already described about the semiconductor device manufacturing method of the fifth preferred embodiment are not described again here.

First, the structure shown in FIG. 39 is obtained according to the manufacturing method of the third preferred embodiment. Next, as shown in FIG. 65, a resist 38 is formed on the insulating film 31.

Then, opening patterns 39*a* and 39*b* are formed through the resist 38 in correspondence respectively with the positions of the contact plugs 33 and 83*a*. In this process, the diameter of the opening patterns 39*a* above the contact plugs 33 is set larger than the diameter of the contact plugs 33, without intentional misalignment with the contact plugs 33. Therefore, as shown in FIG. 65, the opening patterns 39*a* are positioned not only right above the contact plugs 33 but also right above parts of the insulating film 14 around the contact plugs 33.

Next, as shown in FIG. 66, using as a mask the resist 38 having opening patterns 39*a* and 39*b*, the interlayer insulating films 18 and 23 are partially etched and removed away using the stopper film 17 as an etching stopper.

Then, using the resist 38 as a mask again, the exposed parts of the stopper film 17 are etched away by anisotropic dry-etching using $CHF_3$ as the etching gas, so as to form contact holes 24 passing through the insulating film 31 to reach the contact plugs 33 and to form a contact hole 74 reaching the contact plug 83*a*. During this process, the stopper film 17 is over-etched for a given amount so that the contact holes 24 extend into the insulating film 14 to expose the entire peripheries of the side surfaces of top portions of the conductive films 16 of the contact plugs 33.

As shown above, since the diameter of the opening patterns 39*a* is larger than the diameter of the contact plugs 33, the opening patterns 39*a* are located not only right above the contact plugs 33 but also right above parts of the insulating film 14 around the contact plugs 33. Accordingly, by over-etching the stopper film 17 for a given amount, the insulating film 14 is also etched, and it is possible to expose not only the conductive barrier layers 42 of the contact plugs 33 but also to expose the entire peripheries of the top portions of the side surfaces of the conductive films 16.

Next, as shown in FIG. 67, contact plugs 25 are formed to fill the contact holes 24 and a contact plug 75 is formed to fill the contact hole 74. Thus, the contact plugs 25 are formed not only through the insulating film 31 but also into the insulating film 14; they thus come in contact respectively with the conductive barrier layers 42 of the contact plugs 33 and also respectively with the entire peripheries of the side surfaces of top portions of the conductive films 16. Subsequently, interconnections 26 and bit line 76 are formed on the insulating film 31 to obtain the semiconductor device shown in FIG. 64.

As shown above, according to the semiconductor device manufacturing method of the sixth preferred embodiment, even when oxidation-preventing conductive barrier layers 42 are formed in the top ends of the contact plugs 33 in the logic region, the upper-layer contact plugs 25 are in contact not only respectively with the conductive barrier layers 42 of the lower-layer contact plugs 33 but also respectively with the entire peripheries of the side surfaces of top portions of the conductive films 16 having higher conductivity. Therefore the contact resistance between the upper-layer contact plugs 25 in the logic region and the source/drain regions 9 in the semiconductor substrate 1 is lower than in the semiconductor device manufacturing method of the fifth preferred embodiment.

In the sixth preferred embodiment, as in the fifth preferred embodiment, the upper-layer contact plug 75 in the memory region is in contact only with the conductive barrier layer 82 of contact plug 83*a*, but not in contact with the conductive film 66. However, as shown in the semiconductor device of FIG. 68, the contact plug 75 may be extended into the insulating film 14 so that it comes in contact with the entire periphery of the side surface of a top portion of the conductive film 66 of the lower-layer contact plug 83*a*.

Then, even when the contact plug 83*a* in the memory region has oxidation-preventing conductive barrier layer 82, forming the upper-layer contact plug 75 in the memory region in contact with the entire periphery of a side surface of the conductive film 66 in the lower-layer contact plug 83*a* further lowers the contact resistance between the upper-layer contact plug 75 or bit line 76 and the source/drain regions 59 in the semiconductor substrate 1.

Figure 68:
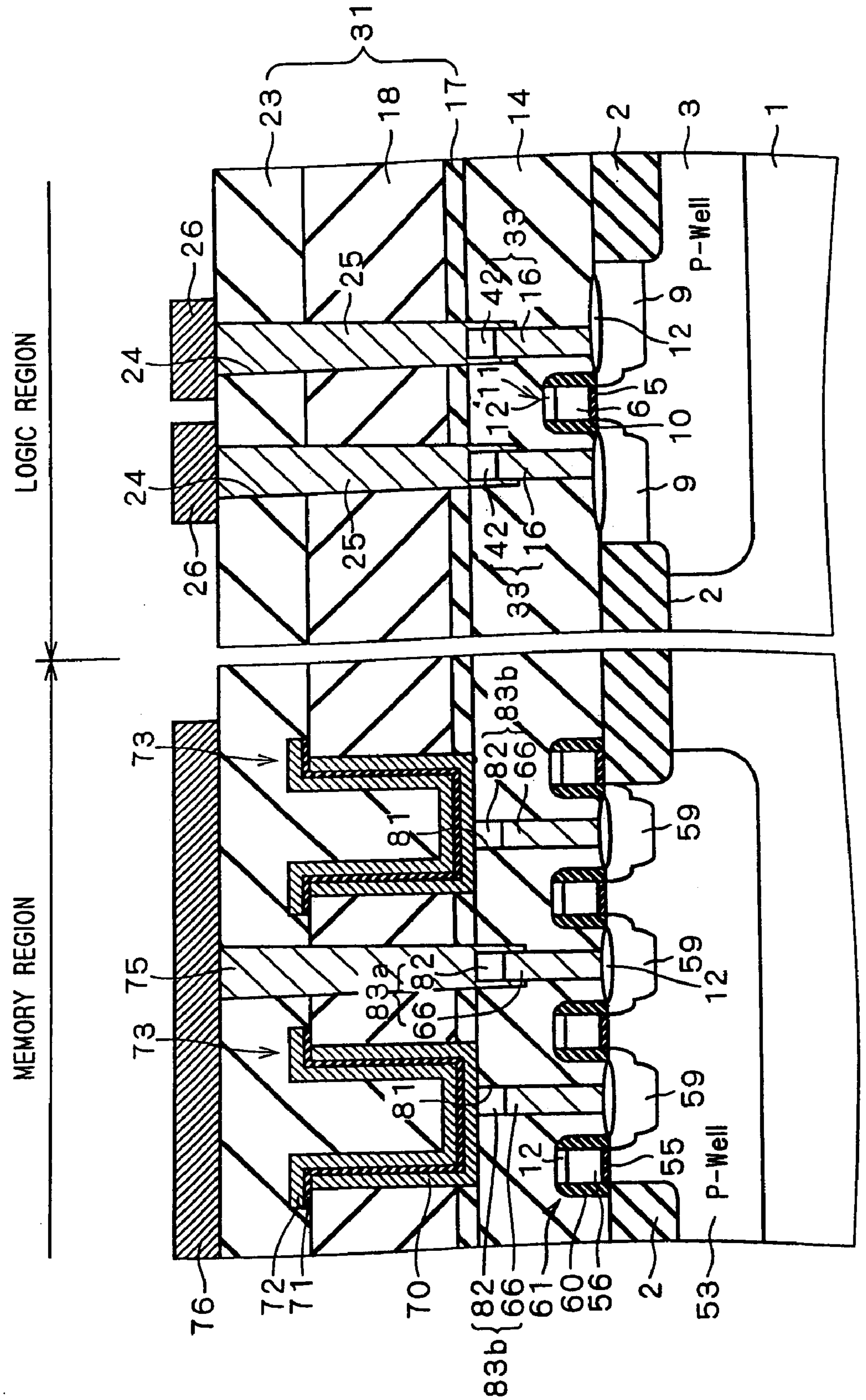
FIG. 68 is a cross-sectional view showing the structure of a modification of the semiconductor device of the sixth preferred embodiment of the invention.
Figure 69:
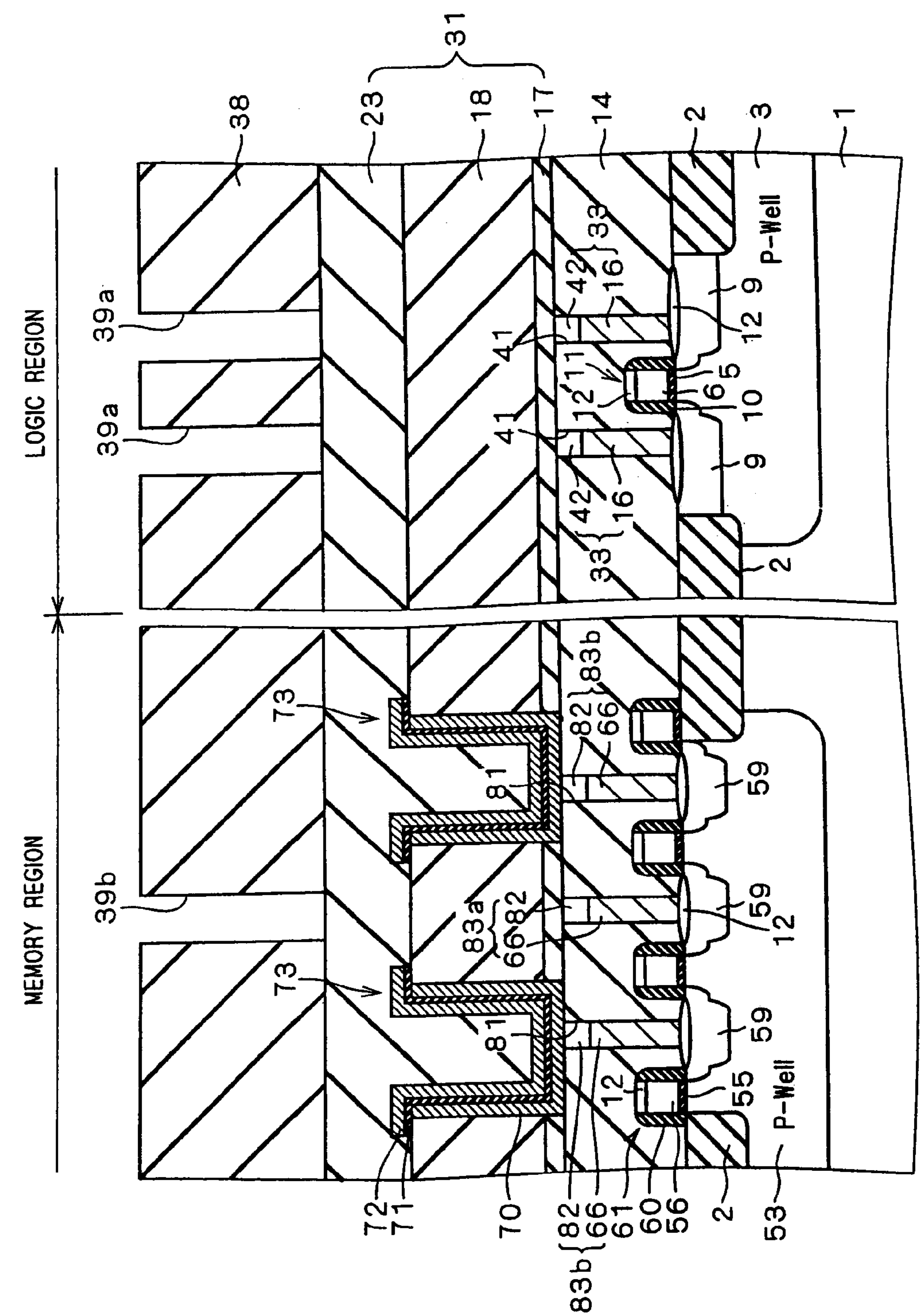
FIGS. 69 and 70 are cross-sectional views showing a sequence of process steps for manufacturing the modification of the semiconductor device of the sixth preferred embodiment of the invention.
Figure 70:
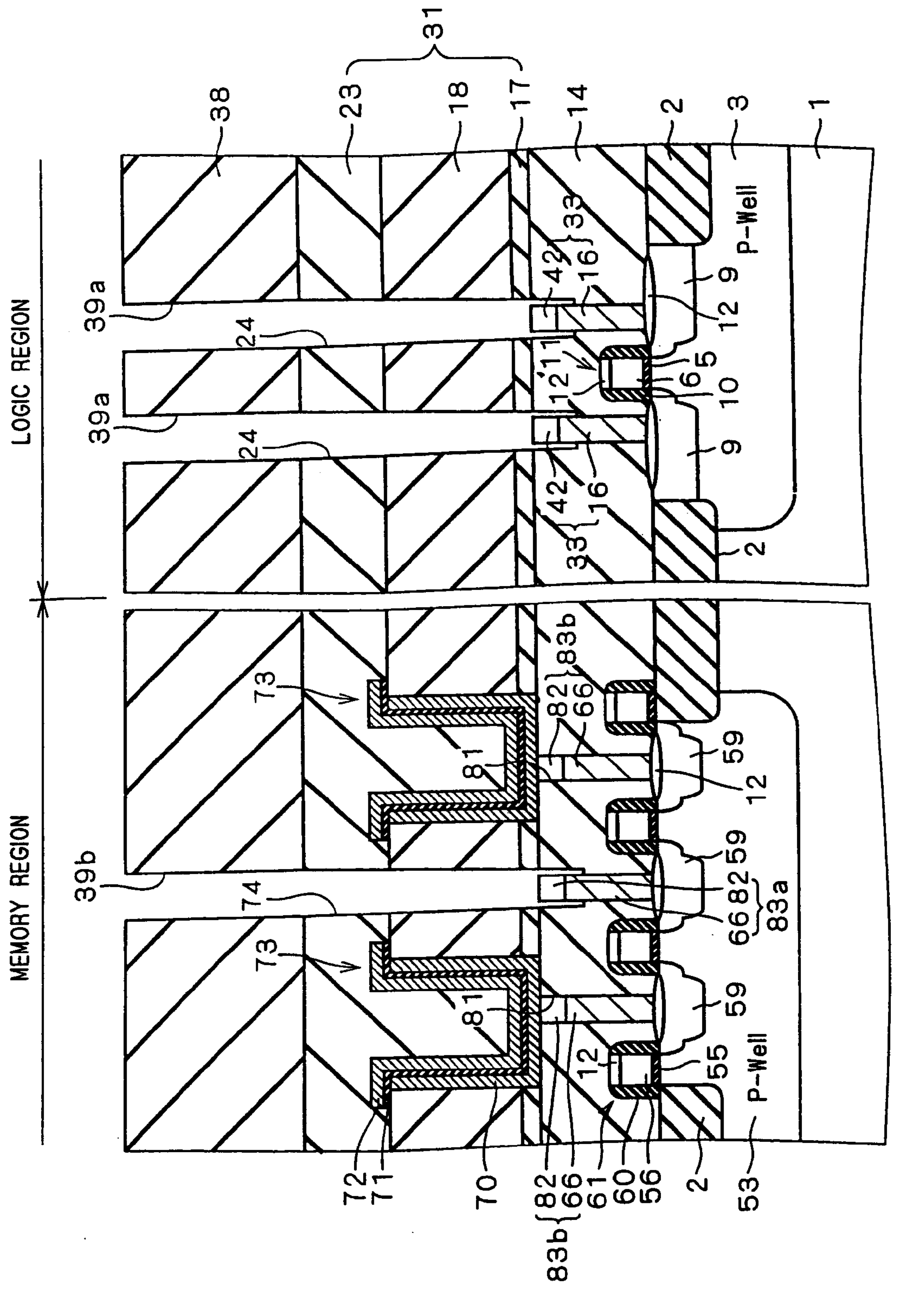

A method for manufacturing the semiconductor device shown in FIG. 68 is now described referring to FIGS. 69 and 70.

First, the structure shown in FIG. 39 is obtained according to the process of the third preferred embodiment. Then, as shown in FIG. 69, a resist 38 is formed on the insulating film 31. Then opening patterns 39*a* and 39*b* are formed through the resist 38 in correspondence with the positions of the contact plugs 33 and 83*a*. In this process, like the opening patterns 39*a* above the contact plugs 33, the diameter of the opening pattern 39*b* above the contact plug 83*a*, too, is set larger than the diameter of the contact plug 83*a*, without intentional misalignment with the contact plug 83*a*. Therefore, the opening pattern 39*b* is positioned not only right above the contact plug 83*a* but also right above part of the insulating film 14 around the contact plug 83*a*.

Next, as shown in FIG. 70, using as a mask the resist 38 having opening patterns 39*a* and 39*b*, the interlayer insulating films 18 and 23 are partially etched and removed away using the stopper film 17 as an etching stopper.

Then, using the resist 38 as a mask again, the exposed parts of the stopper film 17 are etched away by anisotropic dry-etching using $CHF_3$ as the etching gas, so as to form contact holes 24 and 74 through the insulating film 31. During this process, the stopper film 17 is over-etched for a given amount so that the contact holes 24 and 74 extend into the insulating film 14 to expose the entire peripheries of the side surfaces of top portions of the conductive films 16 of the contact plugs 33 and also to expose the entire periphery of the side surface of the top portion of the conductive film 66 of the contact plug 83*a*.

As shown above, since the diameter of the opening pattern 39*b* is larger than the diameter of the contact plug 83*a*, the opening pattern 39*b* is located not only right above the contact plug 83*a* but also right above part of the insulating film 14 around it. Therefore, over-etching the stopper film 17 for a given amount exposes not only the conductive barrier layer 82 of the contact plug 83*a* but also the entire periphery of the side surface of the top portion of the conductive film 66.

Next, contact plugs 25 are formed to fill the contact holes 24 and a contact plug 75 is formed to fill the contact hole 74. Thus, like the contact plugs 25, the contact plug 75 is formed not only through the insulating film 31 but also into the insulating film 14; it thus comes in contact with the conductive barrier layer 82 of the contact plug 83*a* and also with the entire periphery of the side surface of the top portion of the conductive film 66. Subsequently interconnections 26 and bit line 76 are formed on the insulating film 31 to obtain the semiconductor device shown in FIG. 68.

As shown above, even when oxidation-preventing conductive barrier layer 82 is formed in the top end of the contact plug 83*a* in the memory region, the upper-layer contact plug 75 is in contact not only with the conductive barrier layer 82 of the lower-layer contact plug 83*a* but also with the entire periphery of the side surface of the top portion of the conductive film 66 having higher conductivity. Therefore the contact resistance between the upper-layer contact plug 75 in the memory region and the source/drain regions 59 in the semiconductor substrate 1 is further lowered.

Figure 71:
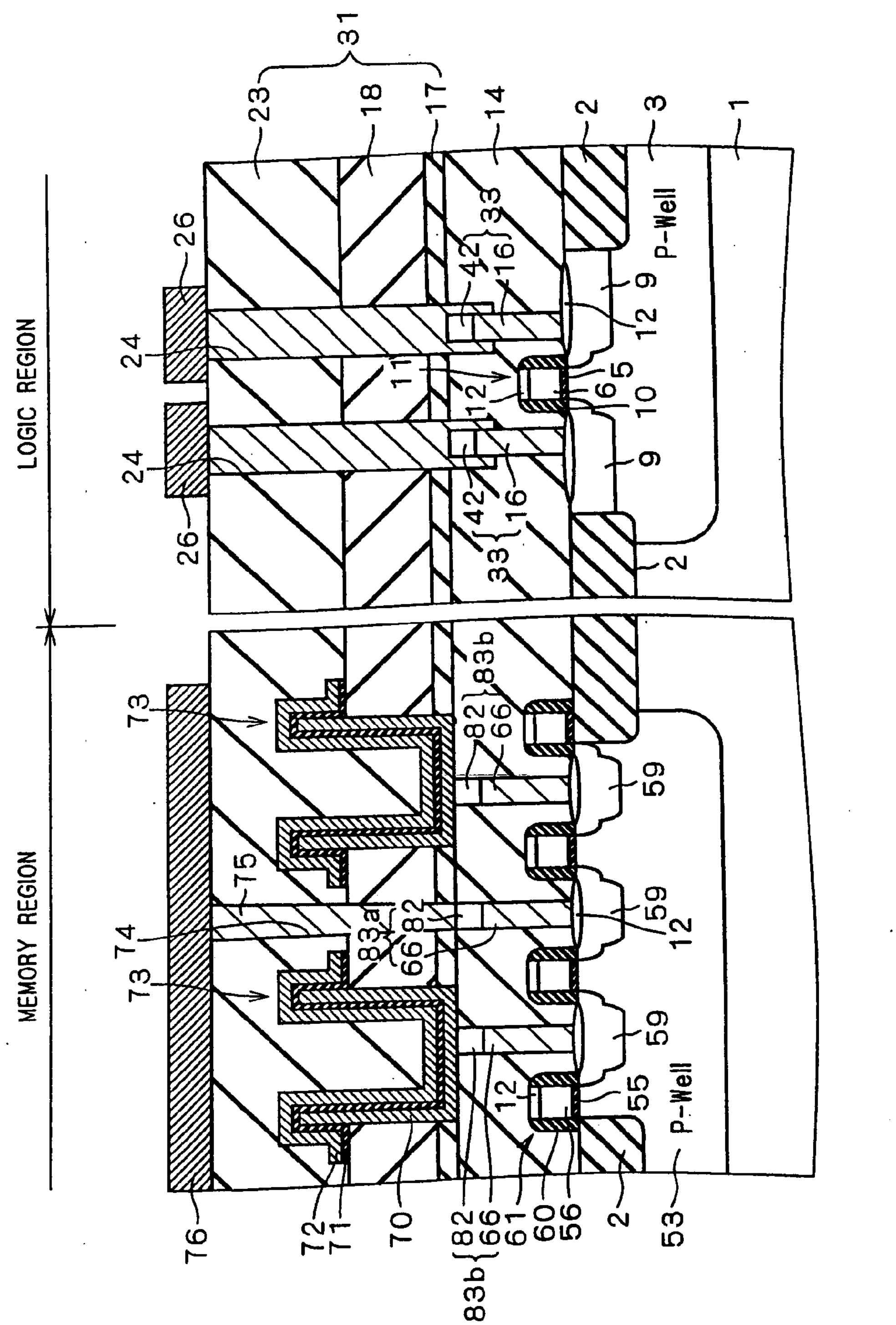

While the sixth preferred embodiment has shown semiconductor devices having concave-type MIM capacitors as DRAM memory cell capacitors 73 and methods for manufacturing it, the present invention can be applied also to semiconductor devices and manufacturing methods in which MIM capacitors with other structures are used as capacitors 73. For example, the present invention can be applied also to semiconductor devices and manufacturing methods that use supported cylinder-type MIM capacitors as shown in FIG. 71, pillar-type MIM capacitors as shown in FIG. 72, and thick-film stacked-type MIM capacitors as shown in FIG. 73.

Figure 75:
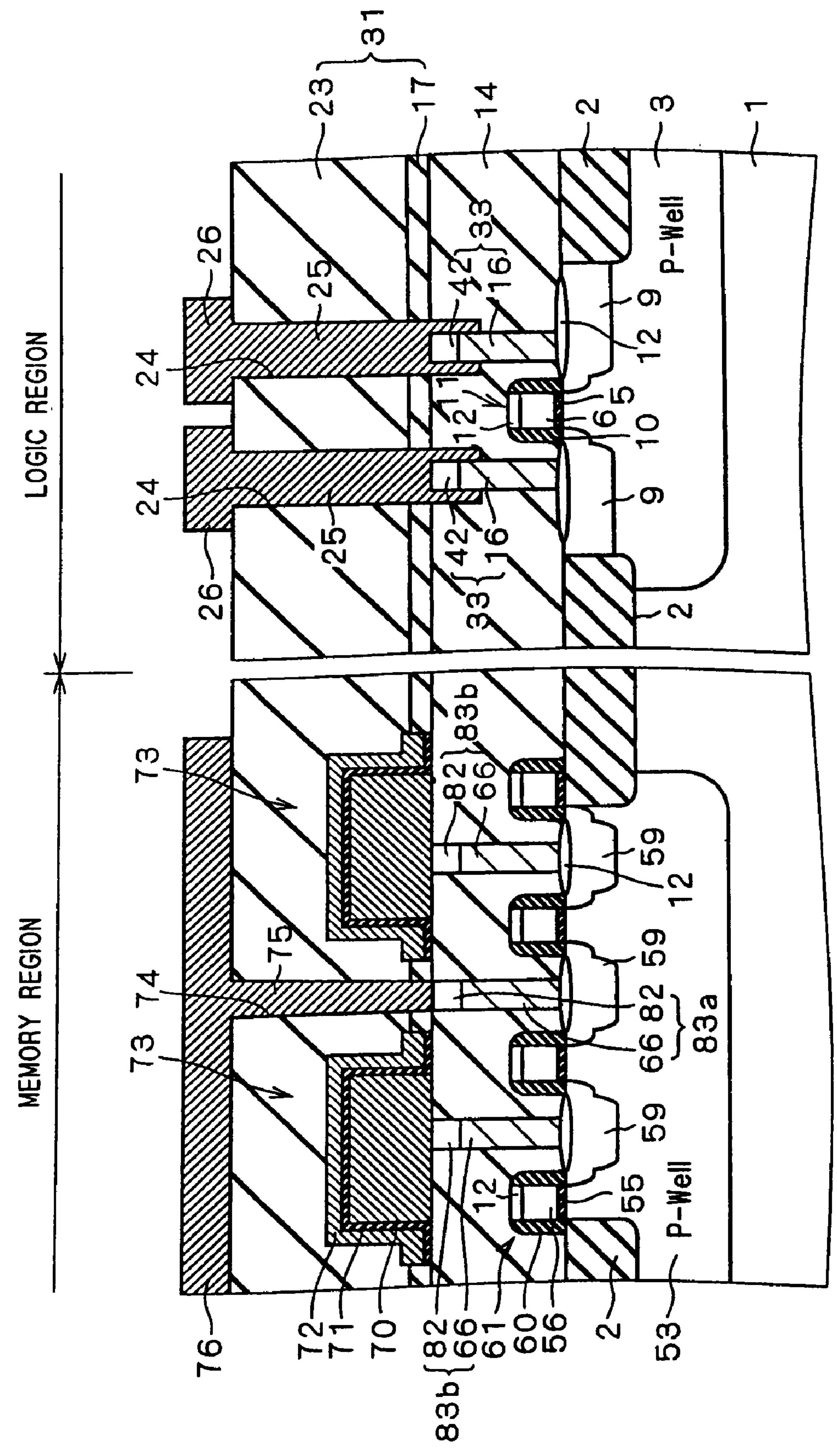

When pillar-type MIM capacitors or thick-film stacked-type MIM capacitors are adopted, the aspect ratios of the contact plugs 25, 75 can be smaller. Therefore, as shown in FIGS. 74 and 75, the contact plugs 25 and interconnections 26, or the contact plug 75 and bit line 76 may be integrally formed using dual damascene process.

When thick-film stacked-type MIM capacitors are adopted, the interlayer insulating film 18 in the insulating film 31 is removed during the manufacturing process. Therefore FIGS. 73 and 75 do not show it.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a semiconductor substrate having a memory region where a memory device is formed and a logic region where a logic device is formed;

a first insulating film provided on said semiconductor substrate;

first and second contact plugs provided in said first insulating film with their respective top surfaces exposed from said first insulating film, and electrically connected to said semiconductor substrate in said memory region;

a third contact plug provided in said first insulating film with its top surface exposed from said first insulating film, and electrically connected to said semiconductor substrate in said logic region;

an MIM capacitor having a lower electrode, an upper electrode, and a dielectric film interposed therebetween, said lower electrode being in contact with the top surface of said first contact plug;

a second insulating film provided on said first insulating film and covering said MIM capacitor;

a fourth contact plug provided in said second insulating film and being in contact with said second contact plug; and a fifth contact plug provided in said second insulating film and being in contact with said third contact plug;

said first contact plug having first conductive film below a top portion;

means for preventing the first conductive film from being oxidized during formation of the dielectric film so as to reduce contact resistance;

said second contact plug having a second conductive barrier layer in its top portion and having, in a remaining portion, a second conductive film having a higher conductivity than said second conductive barrier layer;

means for reducing contact resistance between said fourth contact plug and said semiconductor substrate;

said third contact plug having a third conductive barrier layer in its top portion and having, in a remaining portion, a third conductive film having a higher conductivity than said third conductive barrier layer;

said fifth contact plug extending into said first insulating film and being in contact with said third conductive barrier layer and a side surface of said third conductive film, wherein a reduction in contact resistance in a logic device is achieved.

2. The semiconductor device according to claim 1, wherein said fourth and fifth contact plugs are in contact with the entire periphery of said side surface of said second conductive film.

3. The semiconductor device according to claim 1, further comprising:

first and second source/drain regions formed at a given distance from each other in an upper surface of said semiconductor substrate in said memory region; and a gate structure provided on the upper surface of said semiconductor substrate between said first and second source/drain regions, wherein said first insulating film is provided on said semiconductor substrate and covers said gate structure, said first and second contact plugs are electrically connected respectively with said first and second source/drain regions, said fourth contact plug has its top surface exposed from said second insulating film and said semiconductor device further comprises a bit line provided on said second insulating film and being in contact with said fourth contact plug.

* * * * *

UNITED STATES PATENT AND TRADEMARK OFFICE

CERTIFICATE OF CORRECTION

PATENT NO. : 7,763,926 B2
APPLICATION NO. : 12/246533
DATED : July 27, 2010
INVENTOR(S) : Takeuchi It is certified that error appears in the above-identified patent and that said Letters Patent is hereby corrected as shown below:

On the Title Page, the Terminal Disclaimer information has been omitted. Item (45) and the Notice information should read as follows:

**-- (45) Date of Patent: * Jul. 27, 2010 --**

On the Title Page:

The first or sole Notice should read --

Subject to any disclaimer, the term of this patent is extended or adjusted under 35 U.S.C. 154(b) by 777 days.

This patent is subject to a terminal disclaimer.

Signed and Sealed this

Ninth Day of November, 2010

David J. Kappos

David J. Kappos
*Director of the United States Patent and Trademark Office*